(12) United States Patent
Abe et al.

(10) Patent No.: US 8,356,063 B2
(45) Date of Patent: Jan. 15, 2013

(54) RECONFIGURABLE DIGITAL FILTER

(75) Inventors: Katsuaki Abe, Kanagawa (JP); Kentaro Miyano, Osaka (JP); Akihiko Matsuoka, Kanagawa (JP); Tomoya Urushihara, Chiba (JP)

(73) Assignee: Panasonic Corporation, Osaka (JP)

( * ) Notice: Subject to any disclaimer, the term of this patent is extended or adjusted under 35 U.S.C. 154(b) by 1250 days.

(21) Appl. No.: 12/097,531

(22) PCT Filed: Dec. 13, 2006

(86) PCT No.: PCT/JP2006/324858
§ 371 (c)(1),
(2), (4) Date: Jun. 14, 2008

(87) PCT Pub. No.: WO2007/069652
PCT Pub. Date: Jun. 21, 2007

(65) Prior Publication Data
US 2009/0187615 A1    Jul. 23, 2009

(30) Foreign Application Priority Data

Dec. 16, 2005 (JP) .................................. 2005-363847

(51) Int. Cl.
*G06F 17/10* (2006.01)
*G06F 17/17* (2006.01)
(52) U.S. Cl. ........................................ 708/316; 708/313
(58) Field of Classification Search ........... 708/300–323
See application file for complete search history.

(56) References Cited

U.S. PATENT DOCUMENTS

| | | | |
|---|---|---|---|
| 5,740,092 A | 4/1998 | Miyake | |
| 7,334,010 B2 * | 2/2008 | Matoba | 708/316 |
| 7,353,243 B2 * | 4/2008 | Scheuermann et al. | 708/316 |

FOREIGN PATENT DOCUMENTS

| | | |
|---|---|---|
| JP | 63-252009 | 10/1988 |
| JP | 1-261014 | 10/1989 |
| JP | 2-013111 | 1/1990 |
| JP | 2-121513 | 5/1990 |
| JP | 3-145322 | 6/1991 |
| JP | 7-170153 | 7/1995 |
| JP | 10-174169 | 6/1998 |
| JP | 2002-190769 | 7/2002 |
| JP | 2003-229783 | 8/2003 |
| JP | 2004-153661 | 5/2004 |

OTHER PUBLICATIONS

International Search Report dated Mar. 27, 2007.

* cited by examiner

*Primary Examiner* — Tan V. Mai
(74) *Attorney, Agent, or Firm* — Dickinson Wright PLLC

(57) ABSTRACT

A digital filter is provided for radio communication processing capable of dynamically modifying the characteristic and simultaneously processing a plurality of systems. In the digital filter, calculation core groups capable of modifying function are arranged and connected to one another by an input interface unit and an output interface unit. When the communication mode is modified, the number of calculation resources to be used and setting contents are decided according to the setting candidate of the filter characteristic required and the calculation resource empty state. According to the decision, functions of the respective parts are modified to perform a predetermined operation control, so as to flexibly modify the limited multiplication/addition calculation resource calculation tap quantity, the operation clock, and the connection relationship, thereby enabling simultaneous and parallel execution of a plurality of different finite impulse response (FIR) filter processes and simultaneous and parallel execution of a plurality of filter processes.

11 Claims, 39 Drawing Sheets

600

| CONFIGURATION SECTION | SET VALUE | CONFIGURATION SECTION | SET VALUE | CONFIGURATION SECTION | SET VALUE |
|---|---|---|---|---|---|
| INPUT I/F SECTION | | ARITHMETIC OPERATOR CORE GROUP 1010 | | OUTPUT I/F SECTION | |
| SELECTOR | | SELECTOR 1006 | 0,1,2,3 | SELECTOR | |
| 10210 | 0,1,2 | OVERCLOCK RATIO | 1/8,1/4,1/2,1,2,4,8 | 10320 | 0,1 |
| 10211 | 0,1,2 | ARITHMETIC OPERATOR CORE GROUP 1011 | | 10321 | 0,1 |
| 10212 | 0,1,2 | SELECTOR 1006 | 0,1,2,3 | 10322 | 0,1 |
| 10213 | 0,1,2 | OVERCLOCK RATIO | 1/8,1/4,1/2,1,2,4,8 | 10323 | 0,1 |
| 10214 | 0,1,2 | ARITHMETIC OPERATOR CORE GROUP 1012 | | 10324 | 0,1 |
| 10215 | 0,1,2 | SELECTOR 1006 | 0,1,2,3 | 10325 | 0,1 |
| 10216 | 0,1,2 | OVERCLOCK RATIO | 1/8,1/4,1/2,1,2,4,8 | 10326 | 0,1 |
| 10217 | 0,1,2 | ARITHMETIC OPERATOR CORE GROUP 1013 | | 10327 | 0,1 |
| 10220 | 0,1 | SELECTOR 1006 | 0,1,2,3 | 10330 | 0,1 |
| 10221 | 0,1,2 | OVERCLOCK RATIO | 1/8,1/4,1/2,1,2,4,8 | 10331 | 0,1 |
| 10222 | 0,1,2 | ARITHMETIC OPERATOR CORE GROUP 1014 | | 10332 | 0,1 |
| 10223 | 0,1,2 | SELECTOR 1006 | 0,1,2,3 | 10333 | 0,1 |
| 10224 | 0,1,2 | OVERCLOCK RATIO | 1/8,1/4,1/2,1,2,4,8 | 10340 | 0,1,2 |
| 10225 | 0,1,2 | ARITHMETIC OPERATOR CORE GROUP 1015 | | 10341 | 0,1,2 |
| 10226 | 0,1,2 | SELECTOR 1006 | 0,1,2,3 | 10350 | 0,1 |
| 10227 | 0,1 | OVERCLOCK RATIO | 1/8,1/4,1/2,1,2,4,8 | 10351 | 0,1 |
| DEMULTIPLEXER 1023 | | ARITHMETIC OPERATOR CORE GROUP 1016 | | | |
| NUMBER OF BRANCHES | 1,2,3,4 | SELECTOR 1006 | 0,1,2,3 | | |
| MODE | 0,1 | OVERCLOCK RATIO | 1/8,1/4,1/2,1,2,4,8 | | |
| DEMULTIPLEXER 1024 | | ARITHMETIC OPERATOR CORE GROUP 1017 | | | |
| NUMBER OF BRANCHES | 1,2,3,4 | SELECTOR 1006 | 0,1,2,3 | | |
| MODE | 0,1,2 | OVERCLOCK RATIO | 1/8,1/4,1/2,1,2,4,8 | | |

FIG.8

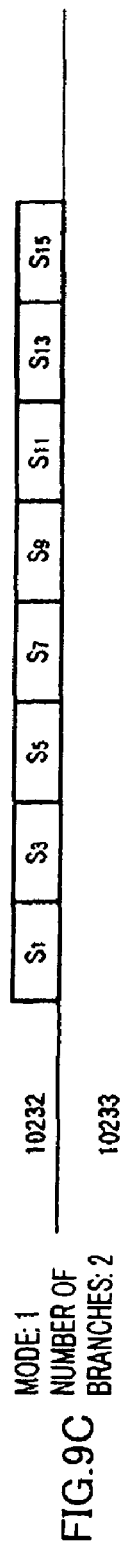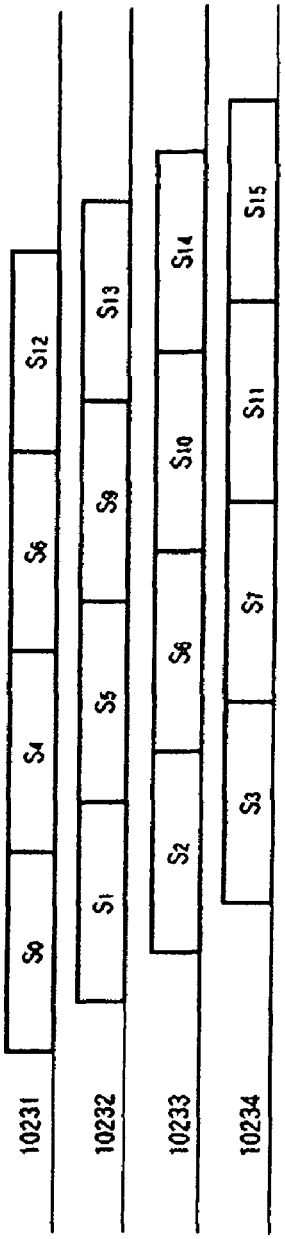
FIG.9A
FIG.9B MODE:0 NUMBER OF BRANCHES:4
FIG.9C MODE:1 NUMBER OF BRANCHES:2
FIG.9D MODE:1 NUMBER OF BRANCHES:4

800

| CONFIGURATION SECTION | SET VALUE | CONFIGURATION SECTION | SET VALUE | CONFIGURATION SECTION | SET VALUE |
|---|---|---|---|---|---|
| INPUT I/F SECTION | | ARITHMETIC OPERATOR CORE GROUP 1010 | | OUTPUT I/F SECTION | |
| SELECTOR | | SELECTOR 1006 | 2 | SELECTOR | |
| 10210 | 0 | OVERCLOCK RATIO | 4 | 10320 | 0 |
| 10211 | 0 | ARITHMETIC OPERATOR CORE GROUP 1011 | | 10321 | 0 |
| 10212 | 0 | SELECTOR 1006 | 2 | 10322 | 0 |
| 10213 | 0 | OVERCLOCK RATIO | 4 | 10323 | 0 |
| 10214 | 0 | ARITHMETIC OPERATOR CORE GROUP 1012 | | 10324 | 0 |
| 10215 | 0 | SELECTOR 1006 | 2 | 10325 | 0 |
| 10216 | 0 | OVERCLOCK RATIO | 4 | 10326 | 0 |
| 10217 | 0 | ARITHMETIC OPERATOR CORE GROUP 1013 | | 10327 | 1 |
| 10220 | 0 | SELECTOR 1006 | 2 | 10330 | 0 |
| 10221 | 1 | OVERCLOCK RATIO | 4 | 10331 | 0 |
| 10222 | 1 | ARITHMETIC OPERATOR CORE GROUP 1014 | | 10332 | 0 |
| 10223 | 1 | SELECTOR 1006 | 2 | 10333 | 1 |
| 10224 | 1 | OVERCLOCK RATIO | 4 | 10340 | 2 |
| 10225 | 1 | ARITHMETIC OPERATOR CORE GROUP 1015 | | 10341 | – |
| 10226 | 1 | SELECTOR 1006 | 2 | | |
| 10227 | 1 | OVERCLOCK RATIO | 4 | | |
| DEMULTIPLEXER 1023 | | ARITHMETIC OPERATOR CORE GROUP 1016 | | | |
| NUMBER OF BRANCHES | – | SELECTOR 1006 | 2 | | |
| MODE | – | OVERCLOCK RATIO | 4 | | |
| DEMULTIPLEXER 1024 | | ARITHMETIC OPERATOR CORE GROUP 1017 | | | |
| NUMBER OF BRANCHES | – | SELECTOR 1006 | 2 | | |
| MODE | – | OVERCLOCK RATIO | 4 | | |
| | | | | | |
| | | | | | |

FIG.10

FIG.11A
FIG.11B
FIG.11C
FIG.11D
MULTIPLICATION
ACCUMULATION
ARITHMETIC OPERATOR
CORE (0, 0)

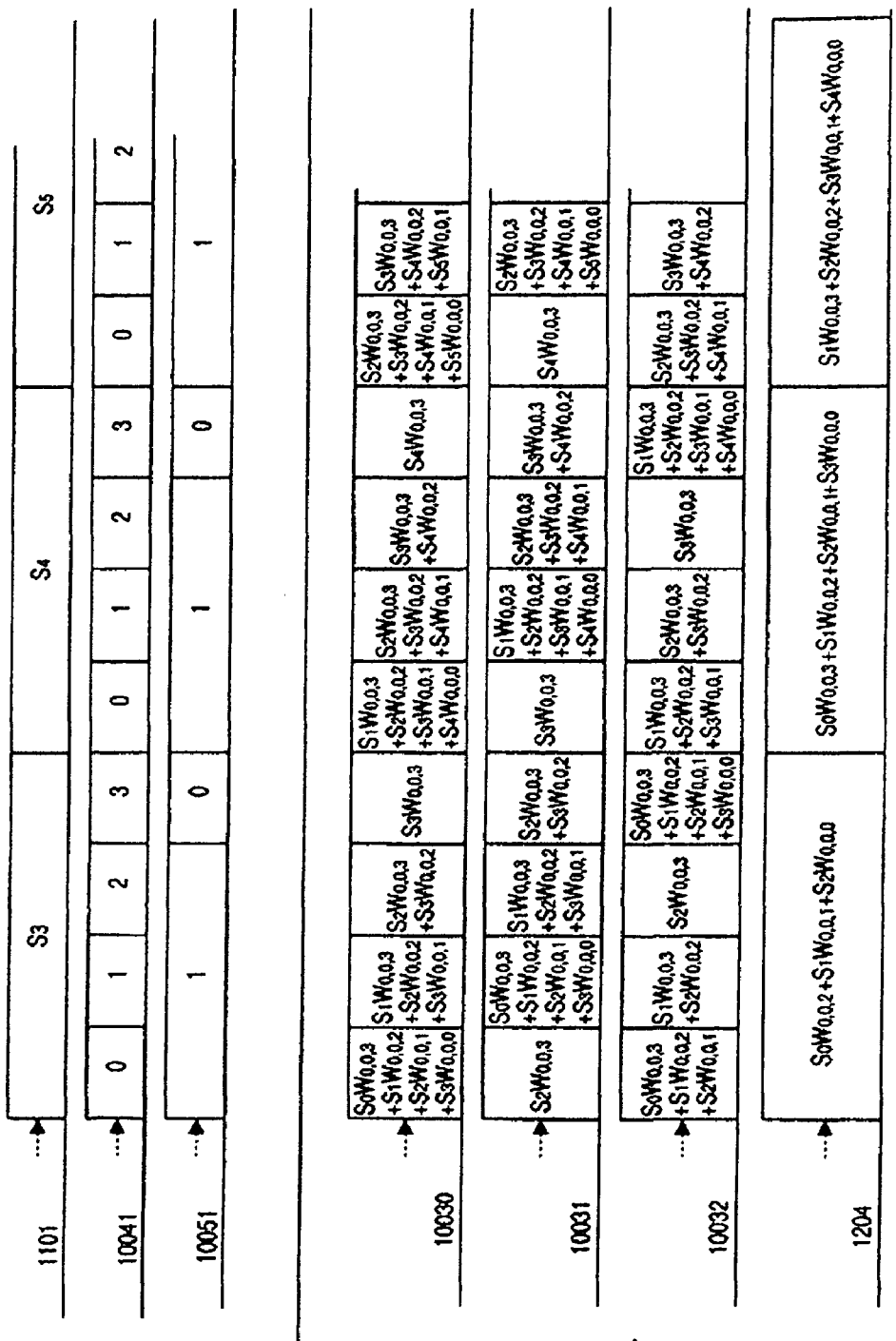

MULTIPLICATION ACCUMULATION ARITHMETIC OPERATOR CORE (0, 1)

900

| CONFIGURATION SECTION | SET VALUE | CONFIGURATION SECTION | SET VALUE | CONFIGURATION SECTION | SET VALUE |
|---|---|---|---|---|---|
| INPUT I/F SECTION | | ARITHMETIC OPERATOR CORE GROUP 1010 | | OUTPUT I/F SECTION | |
| SELECTOR | | SELECTOR 1006 | 3 | SELECTOR | |
| 10210 | 2 | OVERCLOCK RATIO | 2 | 10320 | 1 |
| 10211 | 2 | ARITHMETIC OPERATOR CORE GROUP 1011 | | 10321 | 1 |
| 10212 | 2 | SELECTOR 1006 | 3 | 10322 | – |
| 10213 | 2 | OVERCLOCK RATIO | 2 | 10323 | – |
| 10214 | – | ARITHMETIC OPERATOR CORE GROUP 1012 | | 10324 | – |
| 10215 | – | SELECTOR 1006 | 3 | 10325 | – |
| 10216 | – | OVERCLOCK RATIO | 2 | 10326 | – |
| 10217 | – | ARITHMETIC OPERATOR CORE GROUP 1013 | | 10327 | – |
| 10220 | 0 | SELECTOR 1006 | 3 | 10330 | 1 |
| 10221 | 0 | OVERCLOCK RATIO | 2 | 10331 | – |
| 10222 | 0 | ARITHMETIC OPERATOR CORE GROUP 1014 | | 10332 | – |
| 10223 | 0 | SELECTOR 1006 | – | 10333 | – |
| 10224 | – | OVERCLOCK RATIO | – | 10340 | 0 |
| 10225 | – | ARITHMETIC OPERATOR CORE GROUP 1015 | | 10341 | – |
| 10226 | – | SELECTOR 1006 | – | | |
| 10227 | – | OVERCLOCK RATIO | – | | |
| DEMULTIPLEXER 1023 | | ARITHMETIC OPERATOR CORE GROUP 1016 | | | |
| NUMBER OF BRANCHES | 4 | SELECTOR 1006 | – | | |
| MODE | 1 | OVERCLOCK RATIO | – | | |
| DEMULTIPLEXER 1024 | | ARITHMETIC OPERATOR CORE GROUP 1017 | | | |
| NUMBER OF BRANCHES | – | SELECTOR 1006 | – | | |
| MODE | – | OVERCLOCK RATIO | – | | |

FIG.15

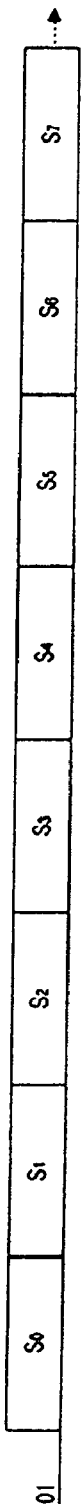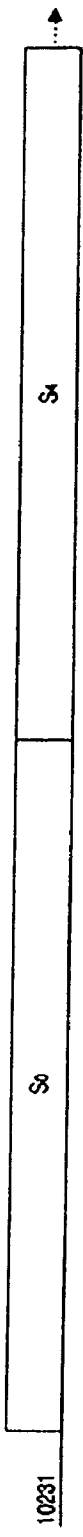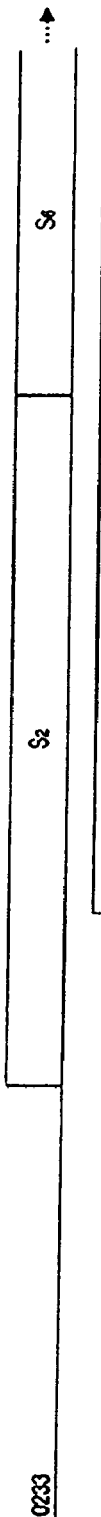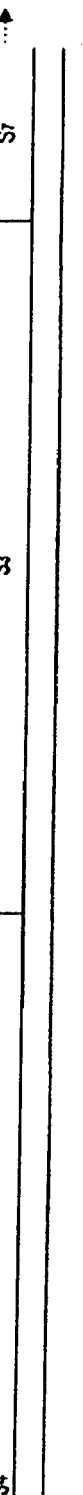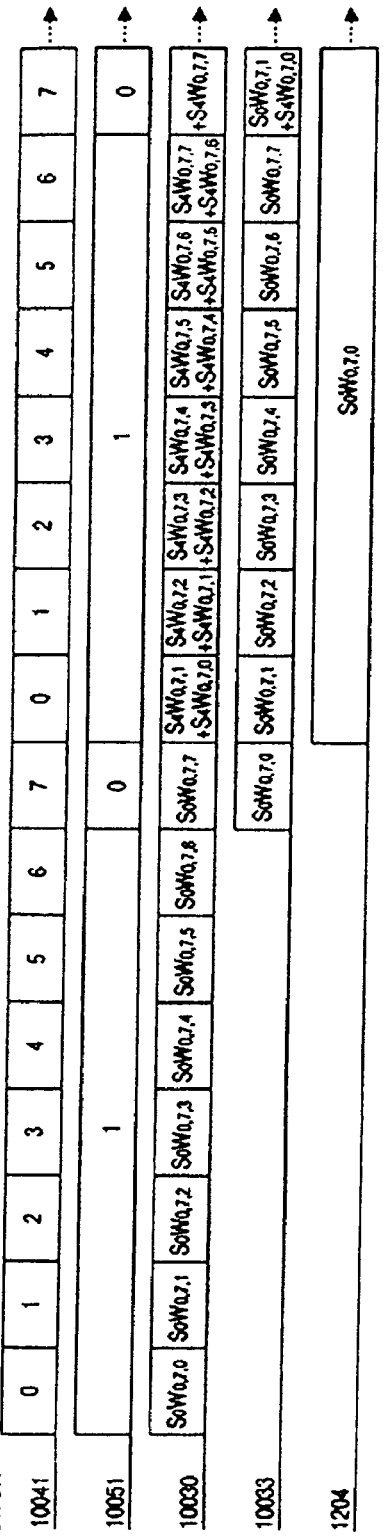

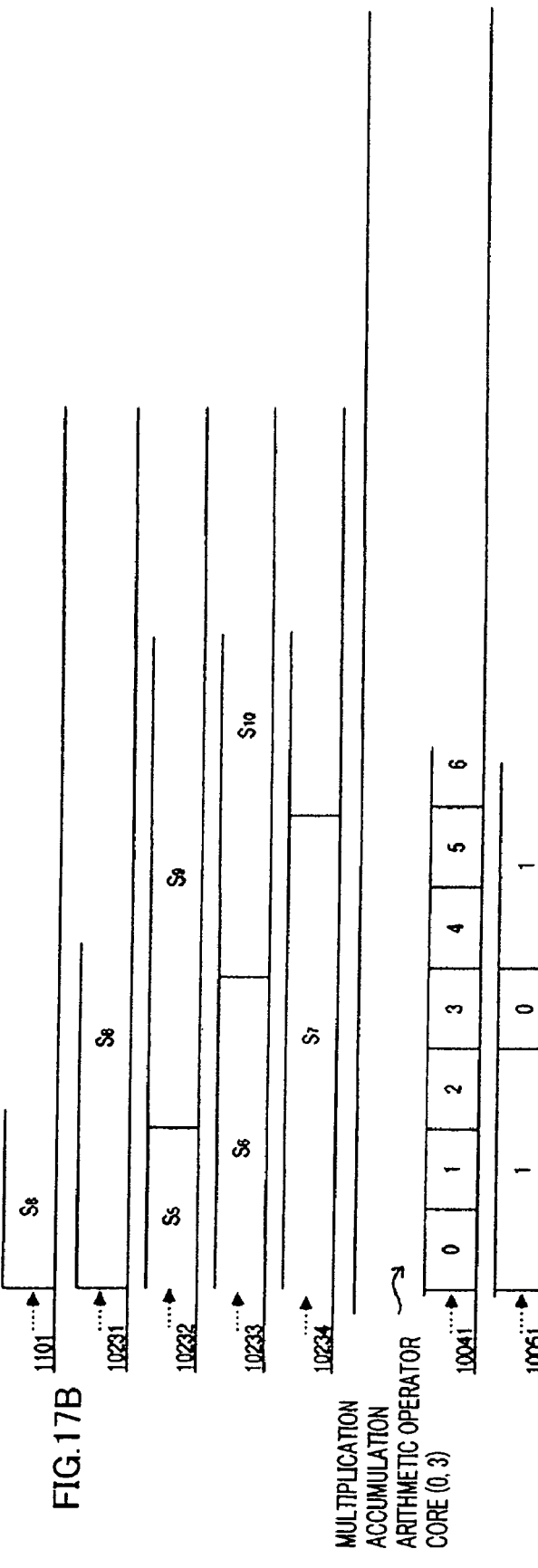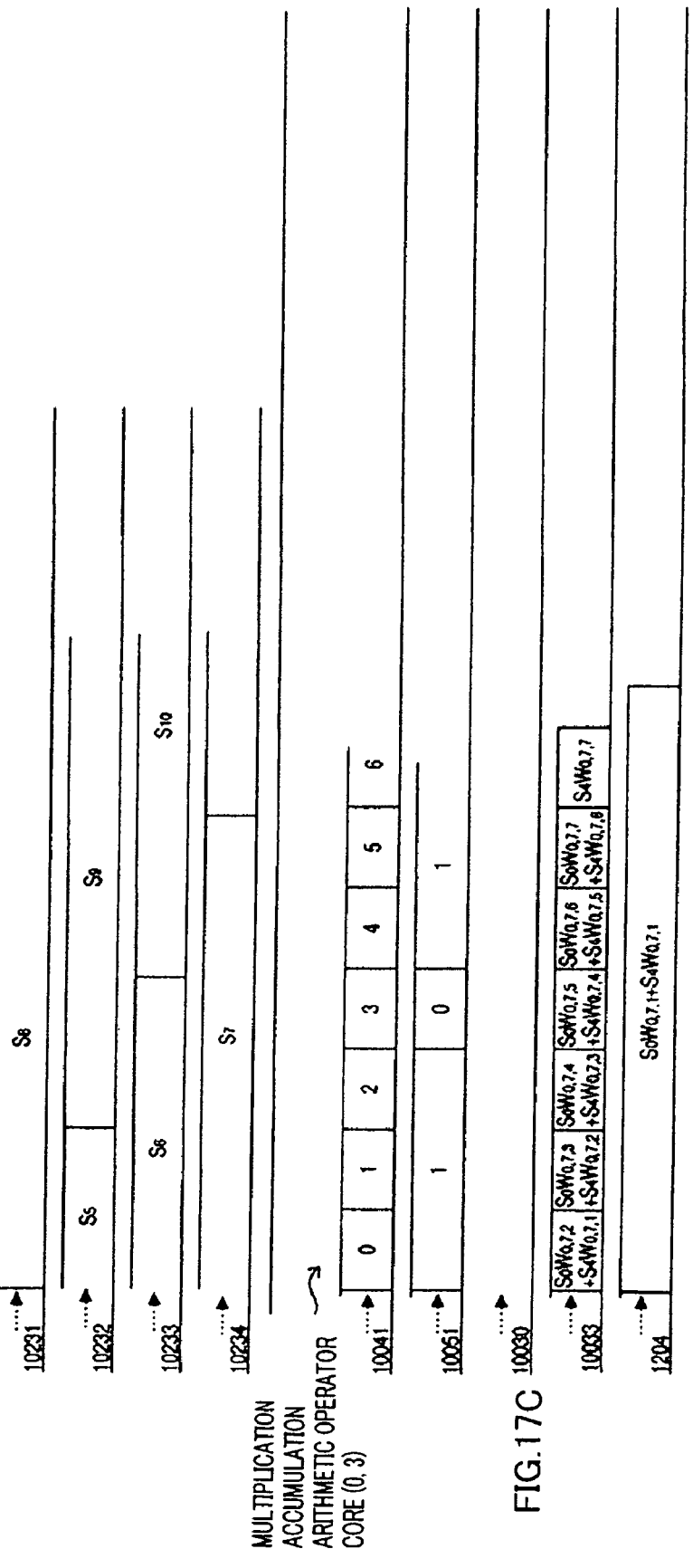

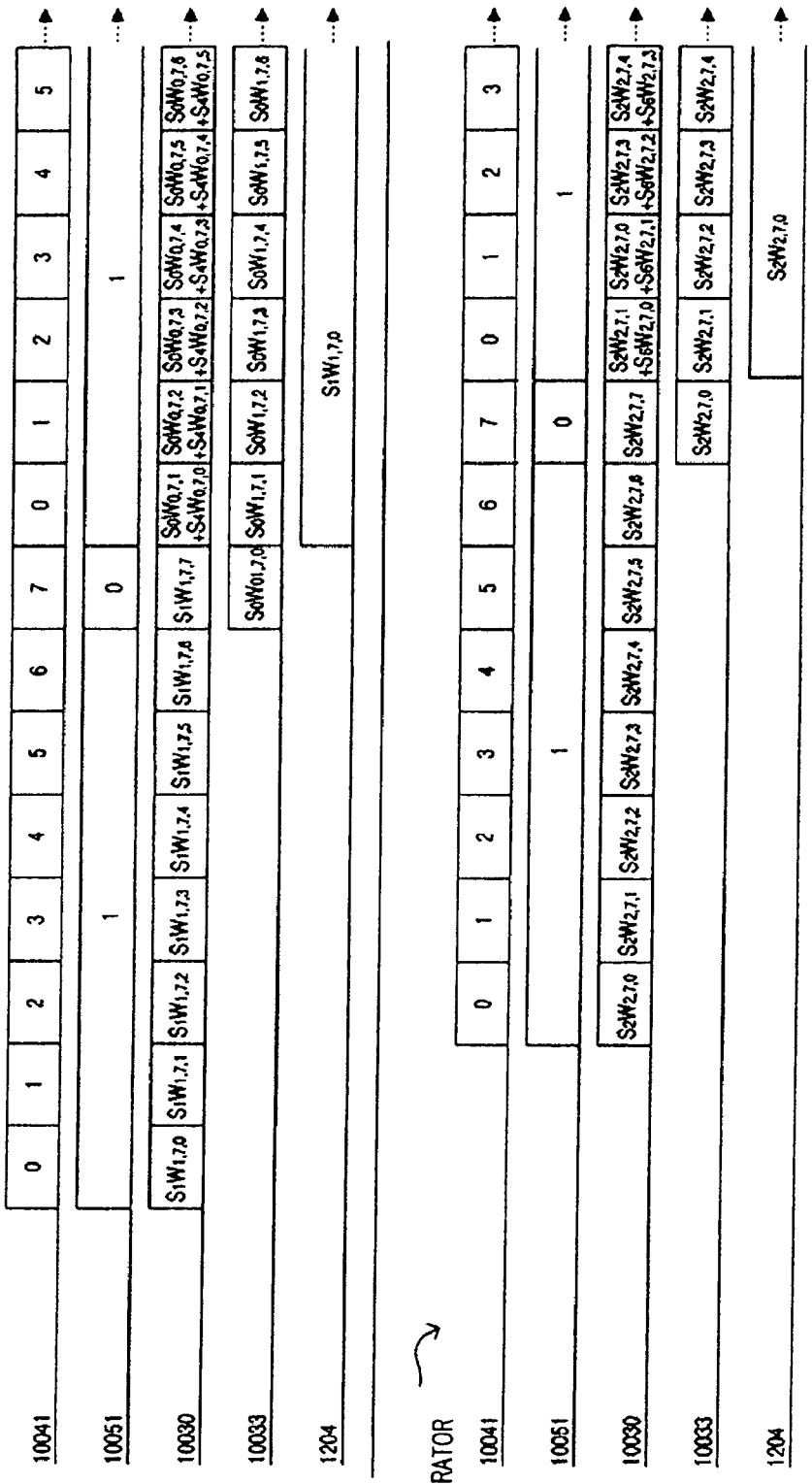

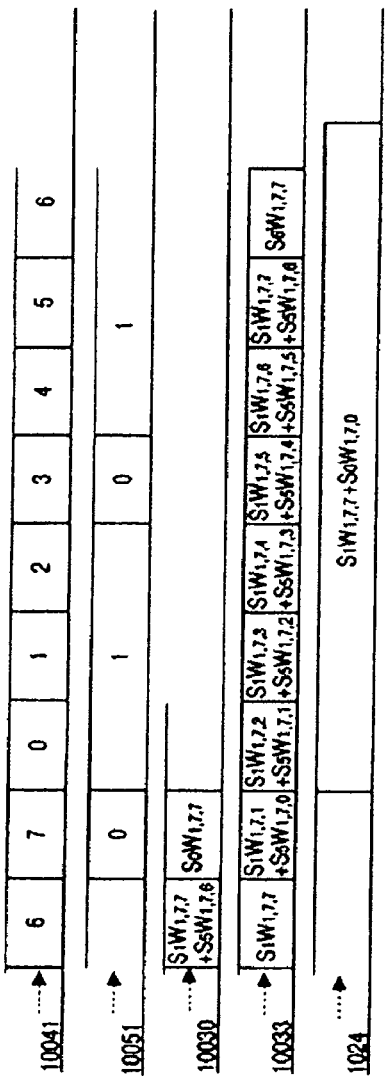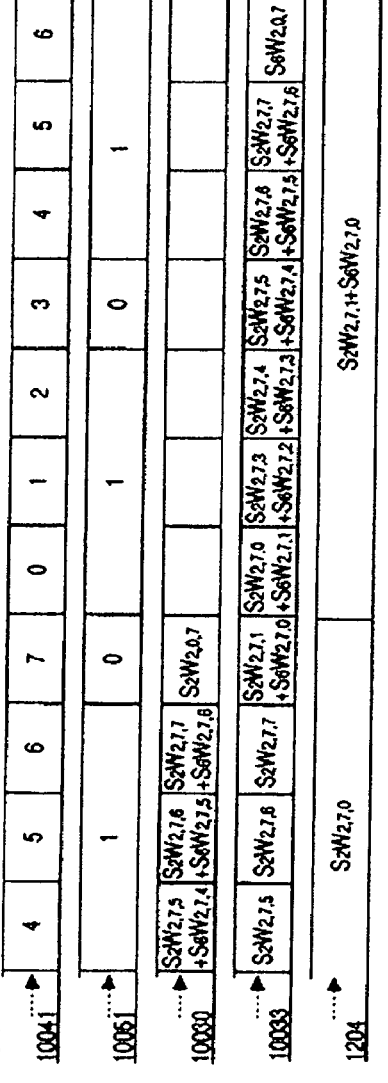

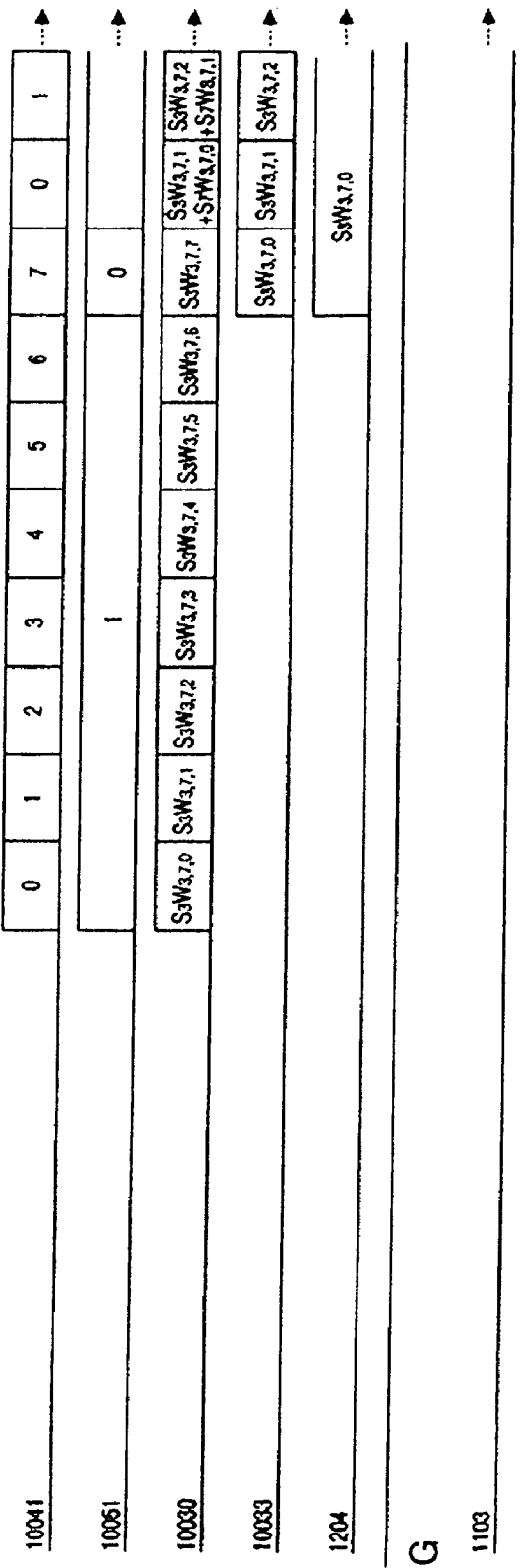

MULTIPLICATION ACCUMULATION ARITHMETIC OPERATOR CORE (3, 3)

| CONFIGURATION SECTION | SET VALUE | CONFIGURATION SECTION | SET VALUE | CONFIGURATION SECTION | SET VALUE |
|---|---|---|---|---|---|
| INPUT I/F SECTION | | ARITHMETIC OPERATOR CORE GROUP 1010 | | OUTPUT I/F SECTION | |
| SELECTOR | | SELECTOR 1006 | 3 | SELECTOR | |
| 10210 | 2 | OVERCLOCK RATIO | 4 | 10320 | 1 |
| 10211 | 2 | ARITHMETIC OPERATOR CORE GROUP 1011 | | 10321 | 1 |
| 10212 | – | SELECTOR 1006 | 3 | 10322 | 1 |
| 10213 | – | OVERCLOCK RATIO | 4 | 10323 | 1 |
| 10214 | – | ARITHMETIC OPERATOR CORE GROUP 1012 | | 10324 | – |
| 10215 | – | SELECTOR 1006 | – | 10325 | – |
| 10216 | – | OVERCLOCK RATIO | – | 10326 | – |
| 10217 | – | ARITHMETIC OPERATOR CORE GROUP 1013 | | 10327 | – |
| 10220 | 0 | SELECTOR 1006 | – | 10330 | 1 |
| 10221 | 0 | OVERCLOCK RATIO | – | 10331 | 1 |
| 10222 | – | ARITHMETIC OPERATOR CORE GROUP 1014 | | 10332 | – |
| 10223 | – | SELECTOR 1006 | – | 10333 | – |
| 10224 | – | OVERCLOCK RATIO | – | 10340 | 0 |
| 10225 | – | ARITHMETIC OPERATOR CORE GROUP 1015 | | 10341 | – |
| 10226 | – | SELECTOR 1006 | – | | |
| 10227 | – | OVERCLOCK RATIO | – | | |
| DEMULTIPLEXER 1023 | | ARITHMETIC OPERATOR CORE GROUP 1016 | | | |
| NUMBER OF BRANCHES | 2 | SELECTOR 1006 | – | | |
| MODE | 1 | OVERCLOCK RATIO | – | | |
| DEMULTIPLEXER 1024 | | ARITHMETIC OPERATOR CORE GROUP 1017 | | | |
| NUMBER OF BRANCHES | – | SELECTOR 1006 | – | | |
| MODE | – | OVERCLOCK RATIO | – | | |

FIG.22

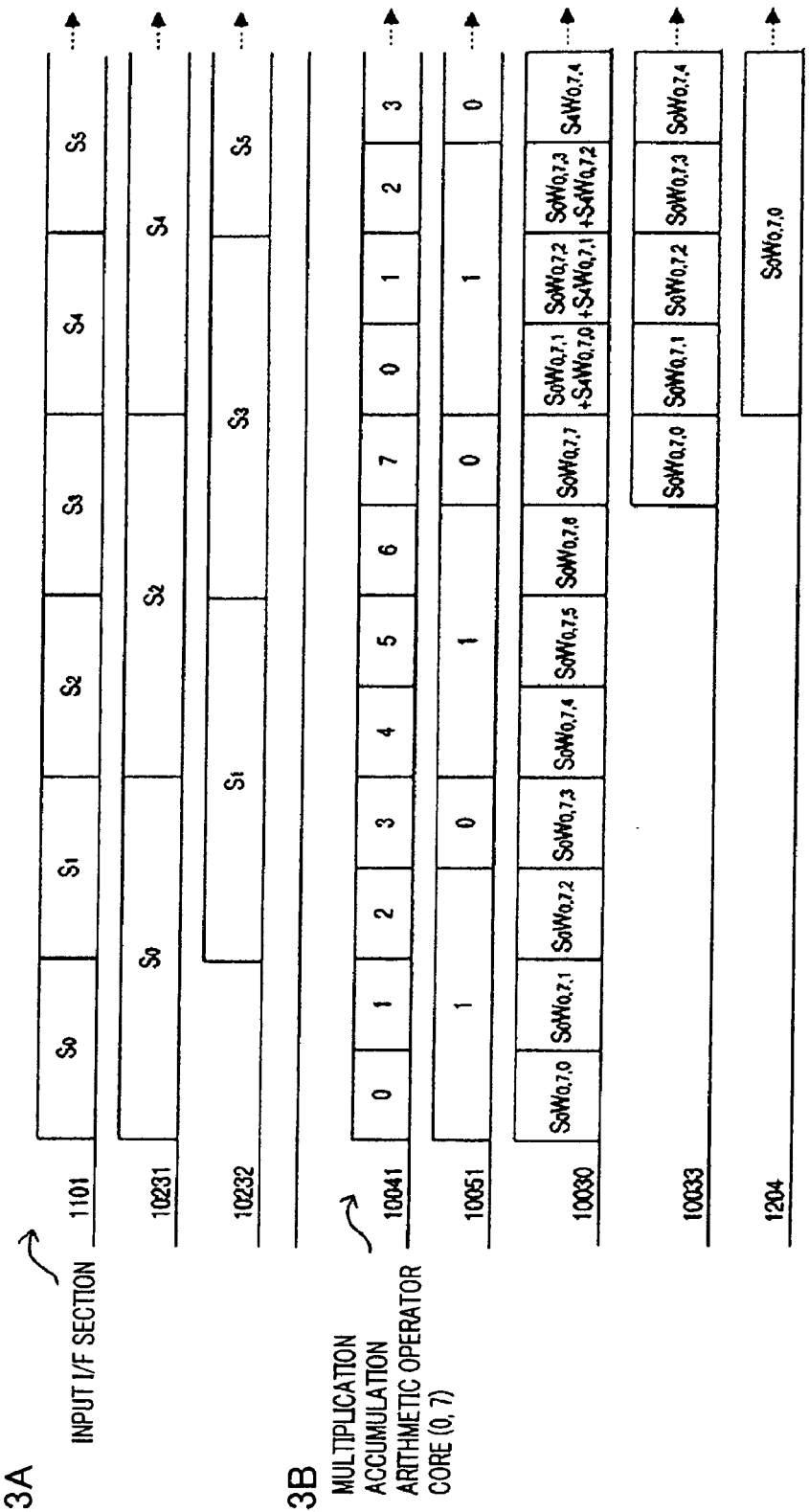

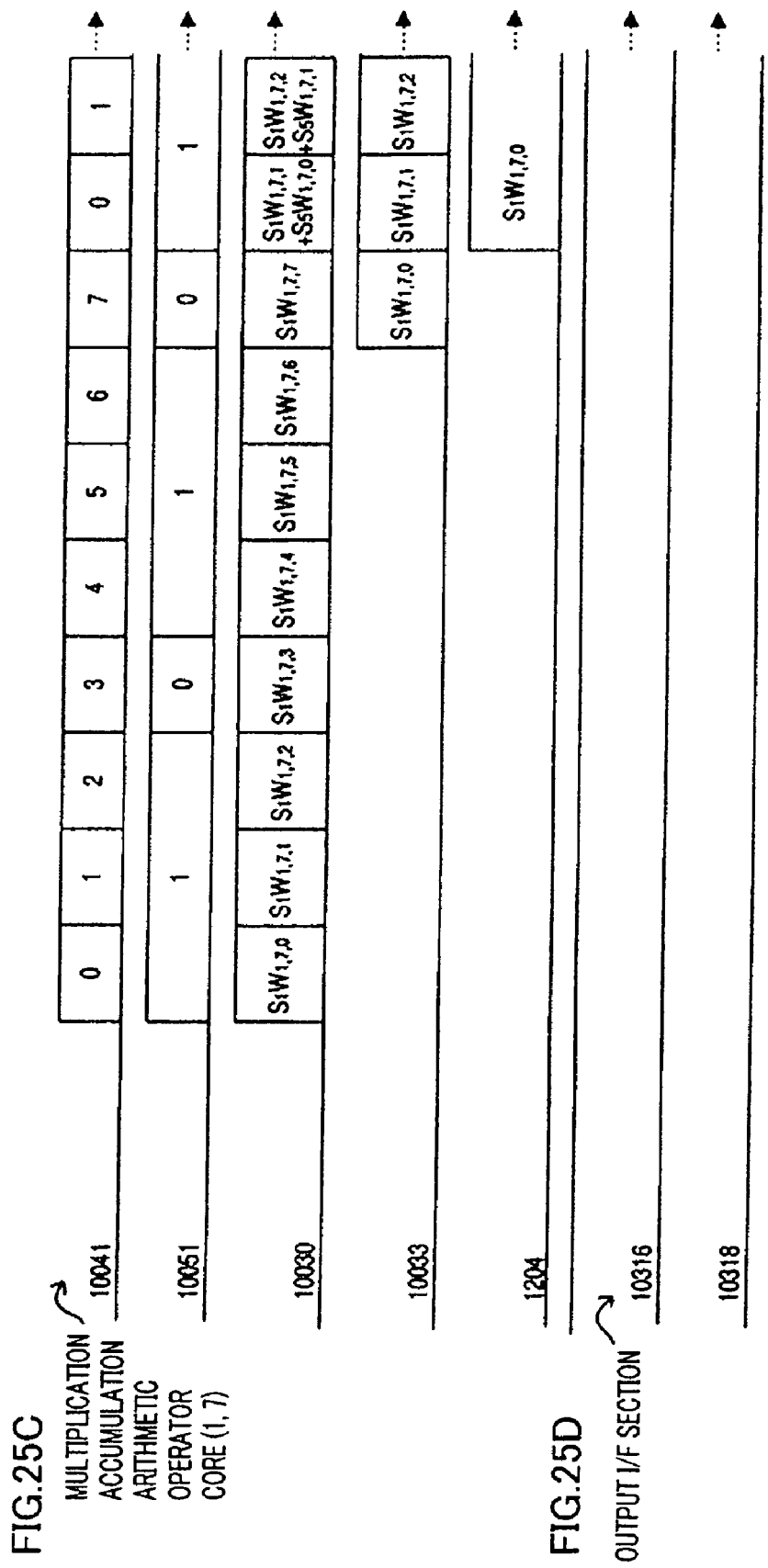

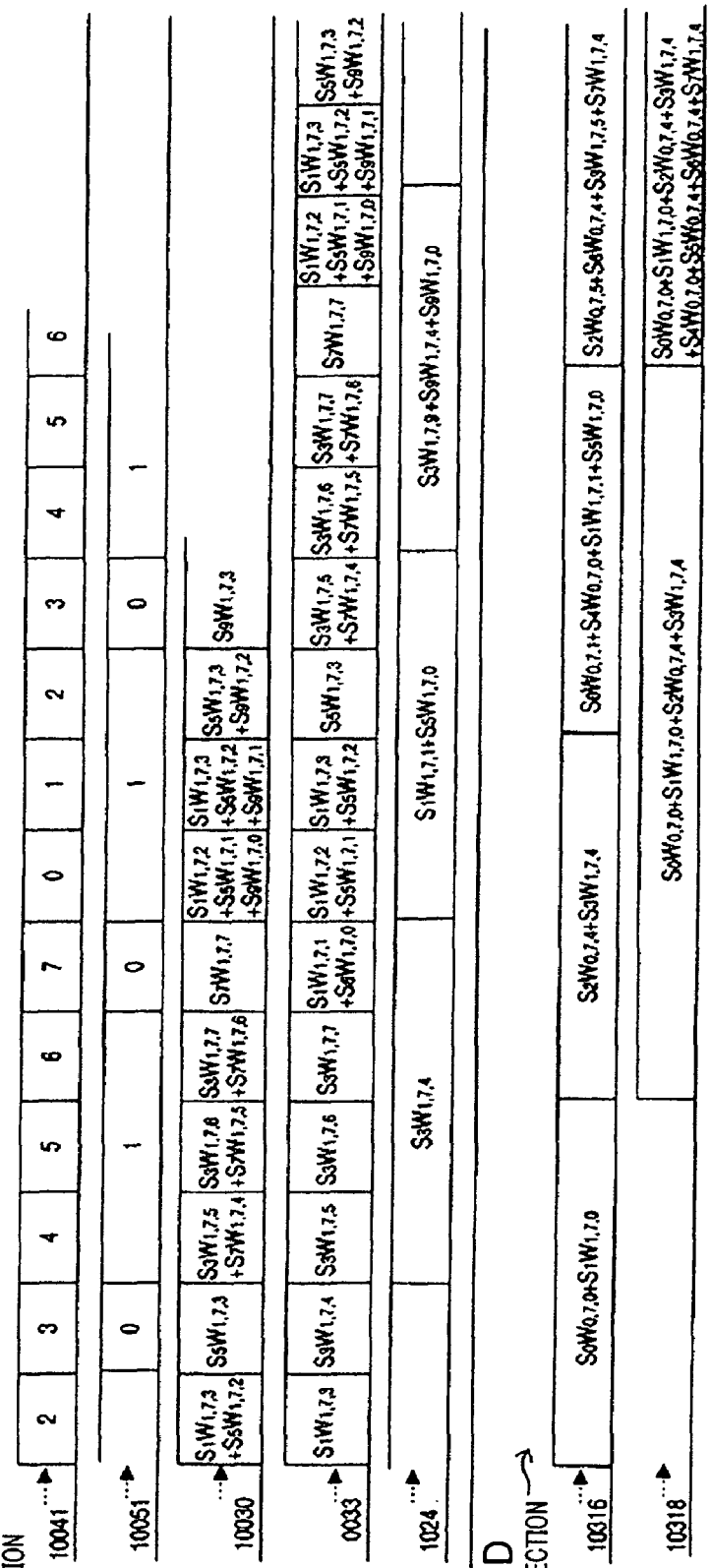

| STANDARD | NUMBER OF REQUIRED TAPS | TYPE OF FILTER | INPUT SIGNAL RATE | OUTPUT SIGNAL RATE | DECIMATION RATIO | SETTING | | | | | | MULTIPLICATION ACCUMULATION OPERATION PROCESSING FREQUENCY | NOTE |
|---|---|---|---|---|---|---|---|---|---|---|---|---|---|
| | | | | | | NUMBER OF BRANCHES FOR POLYPHASE | NUMBER OF ARITHMETIC OPERATOR GROUPS | NUMBER OF TIMES OF MULTIPLEXING | PROCESSING CLOCK RATIO | NUMBER OF ARITHMETIC OPERATIONS PER ARITHMETIC OPERATOR | NUMBER OF ARITHMETIC OPERATORS | | |
| UMTS | 47 | SERIAL | 15.36 MHz | 15.36 MHz | 1/1 | - | 3 | - | 4 | 4 | 12 | 61.44 MHz | |
| | | | | | | | 6 | - | 2 | 2 | 24 | 30.72 MHz | |
| GSM | 63 | POLYPHASE DECIMATION | 1.0833 MHz | 270.83 MHz | 1/4 | 4 | 4 | - | 1 | 4 | 16 | 1.08 MHz | |
| | | | | | | | 2 | 2 | 2 | 8 | 8 | 2.17 MHz | |
| IEEE 802.11 a/g | 48 | POLYPHASE DECIMATION | 80 MHz | 20 MHz | 1/4 | 4 | 4 | - | 1 | 4 | 16 | 80 MHz | |
| IEEE 802.11/11b | 48 | POLYPHASE DECIMATION | 44 MHz | 11 MHz | 1/4 | 4 | 4 | - | 1 | 4 | 4 | 44 MHz | |
| ISDB-T | 64 | POLYPHASE DECIMATION/ MULTIPLEXING | 8.127 MHz | 507.9 MHz | 1/16 | 16 | 4 | 4 | 1/4 | 4 | 16 | 2.03 MHz | |
| | | | | | | | 2 | 8 | 1/2 | 8 | 8 | 4.06 MHz | |
| DVB-H | 64 | POLYPHASE DECIMATION/ MULTIPLEXING | 36.57 MHz | 9.143 MHz | 1/4 | 4 | 4 | - | 1 | 4 | 16 | 36.57 MHz | |
| | | | | | | | 2 | 2 | 2 | 8 | 8 | 73.14 MHz | |
| IEEE 802.15.1 | 47 | SERIAL | 16 MHz | 16 MHz | 1/1 | - | 3 | - | 4 | 4 | 12 | 64 MHz | |
| | | | | | | | 6 | - | 2 | 2 | 24 | 32 MHz | |

| CONFIGURATION SECTION | SET VALUE | CONFIGURATION SECTION | SET VALUE | CONFIGURATION SECTION | SET VALUE |
|---|---|---|---|---|---|
| INPUT I/F SECTION | | ARITHMETIC OPERATOR CORE GROUP 1010 | | OUTPUT I/F SECTION | |
| SELECTOR | | SELECTOR 1006 | 2 | SELECTOR | |
| 10210 | 0 | OVERCLOCK RATIO | 4 | 10320 | 0 |
| 10211 | 0 | ARITHMETIC OPERATOR CORE GROUP 1011 | | 10321 | 0 |
| 10212 | 0 | SELECTOR 1006 | 2 | 10322 | 1 |
| 10213 | – | OVERCLOCK RATIO | 4 | 10323 | 0 |
| 10214 | – * | ARITHMETIC OPERATOR CORE GROUP 1012 | | 10324 | – * |
| 10215 | – * | SELECTOR 1006 | 2 | 10325 | – * |
| 10216 | – * | OVERCLOCK RATIO | 4 | 10326 | – * |
| 10217 | – * | ARITHMETIC OPERATOR CORE GROUP 1013 | | 10327 | – * |
| 10220 | 0 | SELECTOR 1006 | – | 10330 | 0 |
| 10221 | 1 | OVERCLOCK RATIO | – | 10331 | 1 |
| 10222 | 1 | ARITHMETIC OPERATOR CORE GROUP 1014 | | 10332 | – * |
| 10223 | – | SELECTOR 1006 | – * | 10333 | – * |
| 10224 | – * | OVERCLOCK RATIO | – * | 10340 | 0 |
| 10225 | – * | ARITHMETIC OPERATOR CORE GROUP 1015 | | 10341 | – * |
| 10226 | – * | SELECTOR 1006 | – * | | |
| 10227 | – * | OVERCLOCK RATIO | – * | | |
| DEMULTIPLEXER 1023 | | ARITHMETIC OPERATOR CORE GROUP 1016 | | | |
| NUMBER OF BRANCHES | – | SELECTOR 1006 | – * | | |
| MODE | – | OVERCLOCK RATIO | – * | | |
| DEMULTIPLEXER 1024 | | ARITHMETIC OPERATOR CORE GROUP 1017 | | | |
| NUMBER OF BRANCHES | – * | SELECTOR 1006 | – * | | |
| MODE | – * | OVERCLOCK RATIO | – * | | |
| | | | | | |
| | | | | | |

| CONFIGURATION SECTION | SET VALUE | CONFIGURATION SECTION | SET VALUE |
|---|---|---|---|
| INPUT I/F SECTION 204 | | DECIMATION PROCESSING SECTION | |
| SELECTOR | | DECIMATION RATIO Rx | |
| 2041 | 0~2 | (0) | $R_1$ |
| 2042 | 0~3 | (1) | $R_2$ |
| 2043 | 0~3 | (2) | $R_3$ |
| 2044 | 0~2 | (3) | $R_4$ |
| | | | |
| OUTPUT I/F SECTION 205 | | DIFFERENTIATOR GROUP | |
| SELECTOR | | NUMBER OF DELAY CLOCKS Mx | |
| 2051 | 0~3 | (0,j) | $M_1$ |
| 2052 | 0~3 | (1,j) | $M_2$ |
| | | (2,j) | $M_3$ |
| I/F SECTION 207 | | (3,j) | $M_4$ |
| SELECTOR | | | |
| 2071 | 0~4 | | |
| 2072 | 0~2 | | |
| 2073 | 0~2 | | |
| 2074 | 0~4 | | |
| | | | |

FIG.39

| CONFIGURATION SECTION | SET VALUE | CONFIGURATION SECTION | SET VALUE |
|---|---|---|---|
| INPUT I/F SECTION 204 | | DECIMATION PROCESSING SECTION | |
| SELECTOR | | DECIMATION RATIO Rx | |
| 2041 | 0 | (0) | — |
| 2042 | 0 | (1) | — |
| 2043 | 0 | (2) | 8 |
| 2044 | 2 | (3) | 2 |
| | | | |
| OUTPUT I/F SECTION 205 | | DIFFERENTIATOR GROUP | |
| SELECTOR | | NUMBER OF DELAY CLOCKS Mx | |
| 2051 | 2 | (0,j) | 1 |
| 2052 | 3 | (1,j) | 1 |
| | | (2,j) | 1 |
| I/F SECTION 207 | | (3,j) | 2 |
| SELECTOR | | | |
| 2071 | 0 | | |
| 2072 | 1 | | |
| 2073 | 1 | | |
| 2074 | 3 | | |
| | | | |

RECONFIGURABLE DIGITAL FILTER

TECHNICAL FIELD

The present invention relates to a digital filter. More particularly, the present invention relates to a digital filter that is used in communication signal processing and that supports digital filter processing for a plurality of communication sequences.

BACKGROUND ART

Demands for wireless communication significantly increase in recent years and a plurality of different wireless communication standards compete with one another, and so there are circumstances where a plurality of wireless communication systems according to various types of services are mixed. Under these circumstances, it is increasingly demanded that, by adding multimode functions that enable one terminal station or base station to support a plurality of wireless communication standards, an environment for seamless connection is provided and the efficiency in product development improves.

As a configuration example that enables one wireless communication terminal to support a plurality of wireless communication standards, for example, Patent Documents 1 and 2 disclose a configuration for, for example, separately providing wireless communication processing sections respectively corresponding to the supporting wireless communication standards and controlling switching to a desired processing sequence when necessary. On the other hand, as another configuration, for example, Patent Document 3 already disclosed a configuration using a software radio processing technique of changing wireless communication processing functions by switching function description of, for example, software.

A configuration example of a conventional multimode wireless communication terminal will be described later using FIG. 1 and FIG. 2. In FIG. 1, standard A wireless communication processing section 4001a that carries out wireless communication processing supporting wireless communication standard A and standard B wireless communication processing section 4001b that carries out wireless communication processing supporting wireless communication standard B, are connected with switching controlling section 4002. Switching controlling section 4002 selects and switches communication sequences for carrying out wireless communication according to a condition of a communication link of each wireless communication standard and a request from a user or an application, and connects data input/output terminals between the selected wireless communication processing sequence and upper layer processing section 4003. In this way, communication is carried out by selecting and switching desired wireless communication processing sequences when necessary, so that a wireless communication terminal is able to carry out communication supporting a plurality of wireless communication standards.

FIG. 2 shows a configuration example of a multimode wireless communication terminal that uses the software radio processing technique. In FIG. 2, standard A analogue signal processing section 4004a including a processing section that carries out analogue signal processing and a conversion of analogue signals into digital signals in wireless communication processing supporting wireless communication standard A, and standard B analogue signal processing section 4004b including a processing section that carries out analogue signal processing and a conversion of analogue signals into digital signals in wireless communication processing supporting wireless communication standard B, are connected with digital signal processing section 4005. Digital signal processing section 4005 is able to change the details of signal processing by changing software description of, for example, programs. Digital signal processing section 4005 carries out digital signal processing by switching the details of signal processing between digital signal processing supporting wireless communication standard A and digital signal processing supporting wireless communication standard B according to control by switching control section 4006, supplies data after reception processing, to upper layer processing section 4007, carries out digital transmission signal processing on transmission data supplied from upper layer processing section 4007 and then outputs transmission data to an analogue signal processing section supporting a desired wireless communication standard. In this way, software description of, for example, programs, supporting a desired wireless communication standard is changed when necessary, and communication functions are switched, so that one wireless communication terminal is able to carry out communication supporting a plurality of wireless communication standards.

On the other hand, a filter processing section, particularly, a digital filter processing section, which is one of functions required to select desired band signals upon wireless communication processing, is focused upon. To realize multimode functions as described above, functions are required to enable flexible change of characteristics such as frequency response characteristics according to different required specifications of the applicable wireless communication standards. In this way, for example, Patent Document 4 and Patent Document 5 already disclosed configurations for flexibly changing tap coefficients and operation modes in a digital filter. Patent Document 4 discloses a configuration and operation example of providing components of a plurality of adders, multipliers, delayers and registers at predetermined positions, forming these components with data bus line groups for switching connection between input/output terminals of each component and switching circuits for switching connection between these components, and setting an arbitrary digital filter. Further, Patent Document 5 discloses a configuration and operation example of changing the tap coefficients of a filter at random and switching processing types of a filter between serial and parallel when necessary.

Patent Document 1: Japanese Patent Application Laid-Open No. HEI10-174169 (page 3 to 4 and FIG. 1)
Patent Document 2: Japanese Patent Application Laid-Open No. 2002-190769 (page 6 and FIG. 4)
Patent Document 3: Japanese Patent Application Laid-Open No. 2004-153661 (page 6 and FIG. 4)
Patent Document 4: Japanese Patent Application Laid-Open No. SHO63-252009 (page 2 to 4 and FIG. 1)
Patent Document 5: Japanese Patent No. 2520451 (page 2 to 5 and FIG. 1)

DISCLOSURE OF INVENTION

Problems to be Solved by the Invention

However, the above conventional techniques have the following problems.

The configuration of the conventional multimode wireless communication terminal shown in FIG. 1 needs to be provided with the same number of wireless communication processing sections 4001 as the applicable wireless communication standards, and so, when the number of wireless communication processing sections 4007 increases, the circuit scale increases. However, if the details of processing in each wireless communication processing section are focused upon, there are processing sections for communication channel coding processing, digital modulation and demodulation processing and filtering processing for channel selection in almost all wireless communication processing sections and, although detailed specifications are different due to the difference between wireless communication standards, there are many sections carrying out similar processing. Separately providing the same number of processing sections as the applicable wireless communication standards is not efficient in terms of the circuit scale.

Further, the configuration of the multimode wireless communication terminal using the software radio processing technique as shown in FIG. 2 needs to rewrite the details of communication processing in digital signal processing section 4005 to a program for a wireless communication standard that must be appropriately supported, and takes time to change a function. Particularly, if digital signal processing 4005 is formed with a device operated by software processing such as FPGA (Field Programmable Gate Array) or DSP (Digital Signal Processor), the amount of data for setting a function is enormous, and so particularly time is required to change a function. For this reason, if applicable wireless communication standards are dynamically switched in the multimode communication terminal, time loss for switching functions occurs. Further, it is difficult to carry out communication at the same time with respect to communication links of a plurality of wireless communication standards.

Furthermore, for the configuration of the digital filter, the configuration disclosed in Patent Document 4 requires numerous data bus line groups for connecting components respectively and connection switching circuits to realize an arbitrary shape of a filter, and so there is a problem that the circuit scale for forming a wireless communication terminal increases.

Further, Patent Document 5 discloses a configuration that is superior, compared to the configuration disclosed in Patent Document 4, in the circuit scale that limits redundancy in connection between components and that nevertheless only carries out control to change the tap coefficients and switch the processing type between the serial type and the parallel type in terms of freedom in changing the digital filter. Patent Document 5 does not disclose a configuration and processing control method in terms of the efficient use of arithmetic operation resources according to the operation clock frequency for applicable filtering processing and the number of the arithmetic operation taps. Still further, Patent Document 5 does not disclose a configuration and control method for input and output interfaces that carry out communication at the same time with respect to communication links of a plurality of wireless communication standards.

It is therefore an object of the present invention to provide a digital filter for wireless communication processing that is able to dynamically change characteristics and process a plurality of sequences at the same time.

Means for Solving the Problem

The digital filter according to the present invention employs a configuration including: a plurality of arithmetic operator groups that change a function of a multiplication accumulation operation according to a function change control signal, carry out multiplication accumulation operation processing for a plurality of taps according to the function change, and output accumulation operation results; an output interface section that selectively adds the accumulation operation result outputs from the arithmetic operator groups according to the function change control signal, and outputs the accumulation operation result outputs as feedback outputs; an input interface section that has a plurality of signal input terminals, supplies desired input signals to the plurality of arithmetic operator groups at the same time or sequentially, according to the function change control signal, and supplies predetermined outputs in the feedback outputs to accumulation operation input stages of the plurality of arithmetic operator groups, according to the function change control signal; a resource assignment controlling section that, for arithmetic operation resources comprised of the plurality of arithmetic operator groups, determines arithmetic operation resources that can be assigned for new filter processing, based on a current use state of arithmetic operation resources and a filter setting candidate list where arithmetic resources required for new filter processing are set, and outputs resource assignment determination information; a function setting controlling section that outputs the function change control signal for setting functions, to the plurality of arithmetic operator groups, the input interface section and the output interface section, based on the resource assignment determination information; and a filter processing section that outputs an operation control signal for carrying out desired filter processing, to the plurality of arithmetic operator groups, the input interface section and the output interface section, where functions are set according to the function change control signal.

Further, the digital filter according to the present invention employs a configuration including: a plurality of integrator groups connecting a plurality of integrators in cascade; a plurality of decimation processing sections; a plurality of differentiator groups connecting a plurality of differentiators in cascade; a first interface section that supplies outputs of the plurality of integrator groups to the plurality of decimating processing sections, and transmits the outputs of the plurality of integrator groups as the first feedback outputs; a second interface section that switches outputs from the plurality of decimating processing sections and second feedback outputs according to a function change control signal and supplies these switching results to the plurality of differentiators; an input interface section that has a plurality of signal input terminals, switches input signals according to the function change control signal and supplies these switching results to the plurality of integrator groups; an output interface section that has a plurality of signal output terminals and switches connection relationships between the plurality of differentiators and the plurality of signal output terminals according to the function change control signal; a resource assignment controlling section that, for arithmetic operation resources comprised of the plurality of integrators, the plurality of decimation processing sections and the plurality of differentiators, determines arithmetic operation resources that can be assigned for new filter processing based on a current use state of arithmetic operation resources and a filter setting candidate list where arithmetic resources required for the new filter processing are set, and outputs resource assignment determination information; a function setting controlling section that outputs the function change control signal for setting functions, to the plurality of integrator groups, the plurality of decimation processing sections, the plurality of differentiator groups, the second interface section, the input interface section and the output interface section, based on the resource assignment determination information; and a filter processing controlling section that outputs an operation control signal for carrying out desired filter processing, to the plurality of integrator groups, the plurality of decimation processing sections, the plurality of differentiator groups, the second interface section, the input interface section and the output interface section, where functions are set according to the function change control signal.

Further, the digital filter according to the present invention employs a configuration including: arithmetic operation resources comprised of a plurality of arithmetic operator groups that output accumulation operation results based on multiplication accumulation operation processing for one or more taps; an output interface section that selectively adds accumulation operation results of the arithmetic operator groups of the arithmetic operation resources according to a function change control signal for setting functions; an input interface section that has a plurality of signal input terminals and supplies desired input signals to the plurality of arithmetic operator groups at the same time or sequentially, according to the function change control signal; a resource assignment controlling section that outputs resource assignment determination information for determining arithmetic operation resources assigned for new filter processing, based on a use state of arithmetic operation resources and a filter setting candidate list where arithmetic operation resources required for the new filter processing are set; a function setting controlling section that outputs the function change control signal to the input interface section and the output interface section, based on the resource assignment determination information; and a filter processing controlling section that outputs an operation control signal for carrying out desired filter processing, to the arithmetic operation resources, the input interface section and the output interface section, where functions are set according to the function change control signal.

Further, the digital filter according to the present invention employs a configuration including: arithmetic operation resources comprised of a plurality of integrator groups connecting a plurality of integrators in cascade, a plurality of decimation processing sections, and a plurality of differentiator groups connecting a plurality of differentiators in cascade; a first interface section that supplies outputs of the plurality of integrator groups to the plurality of decimation processing sections; a second interface section that supplies outputs from the plurality of decimation processing sections which are switched according to a function change control signal for setting functions, to the plurality of differentiators; an input interface section that has a plurality of signal input terminals and supplies input signals switched according to the function change control signal, to the plurality of integrator groups; an output interface section that selects at least one of output signals of the plurality of differentiator groups according to the function change control signal and outputs the selection result; a resource assignment controlling section that outputs resource assignment determination information for determining arithmetic operation resources assigned for new filter processing based on a use state of the arithmetic operation resources and a filter setting candidate list where arithmetic operation resources required for new filter processing are set; a function setting controlling section that outputs the function change control signal to the plurality of integrator groups, the plurality of decimation processing sections, the plurality of differentiator groups, the input interface section and the output interface section, based on the resource assignment determination information; and a filter processing controlling section that outputs an operation control signal for carrying out desired filter processing, to the plurality of integrator groups, the plurality of decimation processing sections, the plurality of differentiator groups, the input interface section and the output interface section where functions are set, according to the function change control signal.

Advantageous Effect of the Invention

Accompanying change in the communication mode of a wireless communication apparatus, arithmetic operation resources for use and the details of the setting of arithmetic operation resources are determined based on setting candidates of the required filter characteristics and the availability of arithmetic operation resources, the function of each section is changed based on this determination, and predetermined operation control is carried out, so that the present invention is able to support a plurality of different FIR filter processings by flexibly changing the number of arithmetic operation taps of limited multiplication accumulation operation resources, the operation clocks and the connection relationships, carry out a plurality of filtering processings in parallel at the same time, and, consequently, reduce the circuit scale compared to cases where filters are separately configured for a plurality of different operation modes.

BRIEF DESCRIPTION OF DRAWINGS

FIG. 8 shows an example of a function setting table that sets the function of the multimode FIR filter processing section according to Embodiment 1;

FIG. 9 shows part of an operation example of a demultiplexer in the input interface section according to Embodiment 1;

FIG. 10 shows an example of a function setting table when the function of the multimode FIR filter processing section is set to a filter of the serial connection type according to Embodiment 1;

Figures 11A, 11B, 11C, 11D:
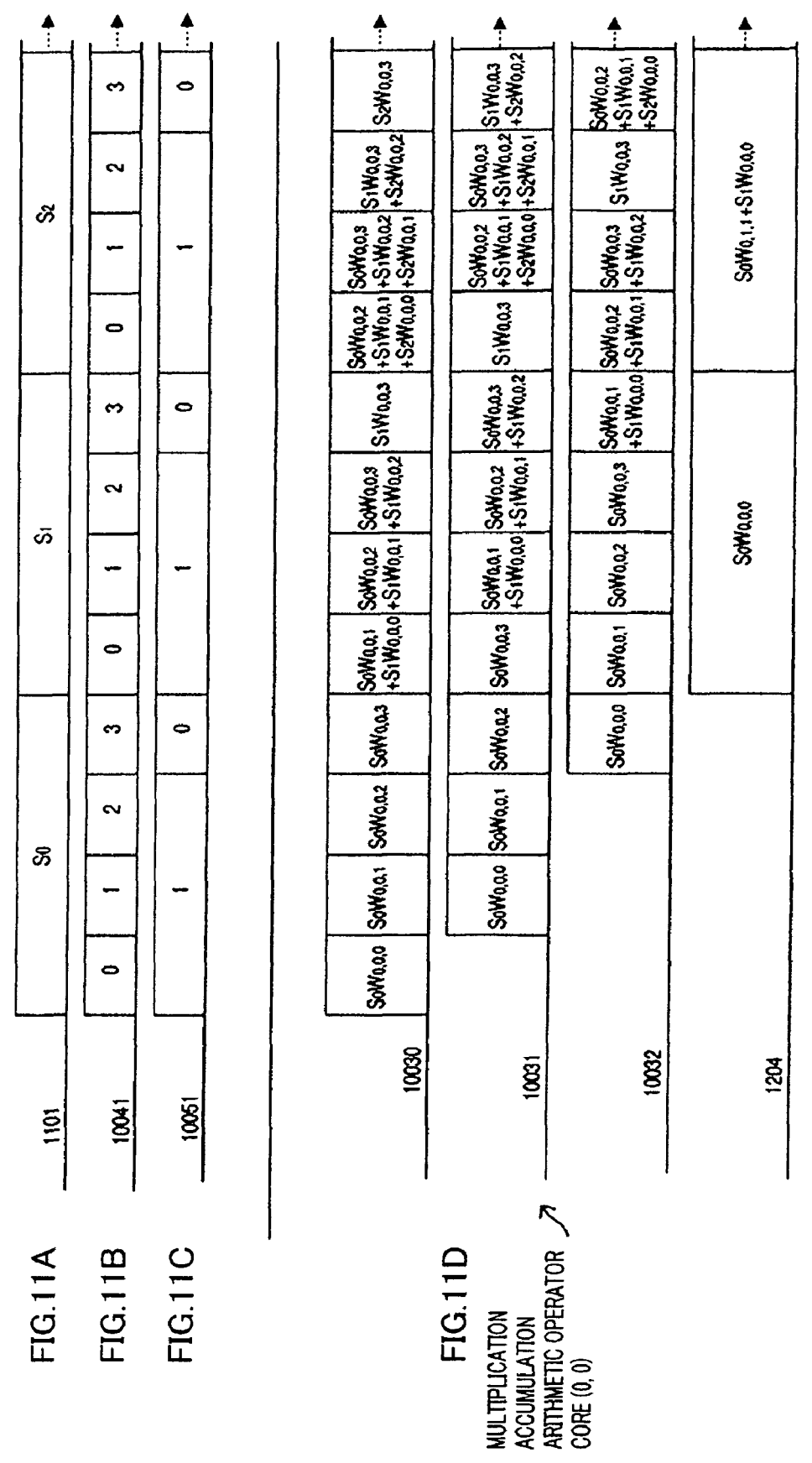

FIG. 11 shows part of an operation example of a filter of the serial connection type in the multimode FIR filter processing section according to Embodiment 1;

FIG. 12 shows the operation example subsequent to FIG. 11 according to Embodiment 1;

FIG. 15 shows an example of the function setting table when the function of the multimode FIR filter processing section is set to a decimation filter of the polyphase type according to Embodiment 1;

FIG. 16 shows part of an operation example of a decimation filter of the polyphase type in the multimode FIR filter processing section according to Embodiment 1;

FIG. 17 shows the operation example subsequent to FIG. 16 according to Embodiment 1;

FIG. 18 shows part of an operation example of a decimation filter of the polyphase type in the multimode FIR filter processing section according to Embodiment 1;

FIG. 19 shows the operation example subsequent to FIG. 18 according to Embodiment 1;

FIG. 20 shows part of an operation example as a decimation filter of the polyphase type in the multimode FIR filter processing section according to Embodiment 1;

FIG. 22 shows an example of the function setting table when the function of the multimode FIR filter processing section is set to a time division multiplexing decimation filter of the polyphase type according to Embodiment 1;

FIG. 23 shows part of an operation example of a time division multiplexing decimation filter of the polyphase type in the multimode FIR filter processing section according to Embodiment 1;

FIG. 25 shows part of an operation example of a time division multiplexing decimation filter of the polyphase type in the multimode FIR filter processing section according to Embodiment 1;

FIG. 26 shows the operation example subsequent to FIG. 25 according to Embodiment 1;

FIG. 27 shows an example of a filter setting candidate list supporting wireless communication standards according to Embodiment 1;

FIG. 30 shows an example of another function setting table for setting the function of the multimode FIR filter processing section according to Embodiment 1;

FIG. 39 shows an example of a list of configuration sections and set values for writing and reading the function setting in a function setting register of the controlling section according to Embodiment 2;

FIG. 40 shows an example of a list showing the setting of each section in the multimode CIC filter processing section according to Embodiment 2;

BEST MODE FOR CARRYING OUT THE INVENTION

Embodiments of the present invention will be described below in detail with reference to accompanying drawings.

(Embodiment 1)

A case will be described with Embodiment 1 with a configuration and operation example where a plurality of arithmetic operator core groups, which connect in serial a plurality of multiplication accumulation operator cores that are able to carry out multiplication accumulation operation for a plurality of taps, are arranged, interfaces that switch the connection relationships between the input/output terminals of the arithmetic operator core groups are provided, and the operation function setting of each multiplication accumulation operator core and the connection setting of input and output interfaces are switched, so that arithmetic operation resources for the multiplication accumulation operator cores are dynamically changed according to filter characteristics required for communication processing and operations of a plurality of filter processings are carried out at the same time.

Figure 1:
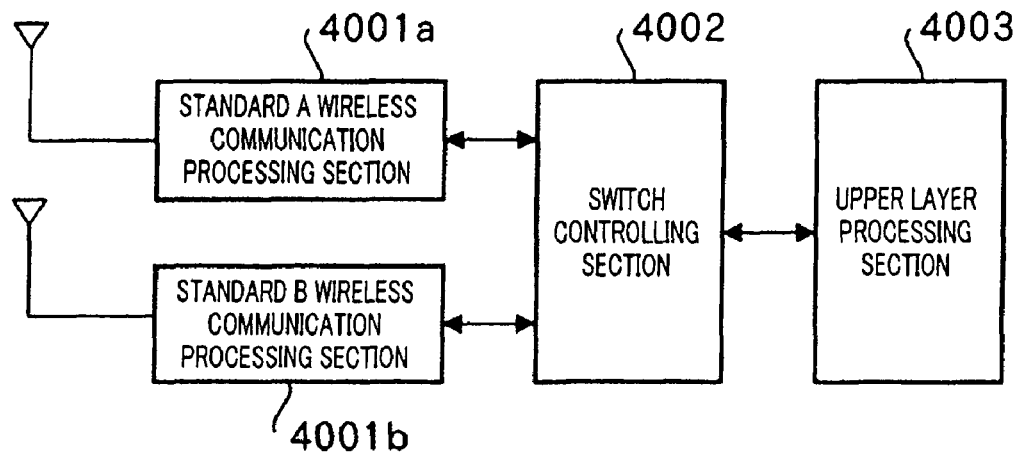
FIG. 1 shows a configuration example of a conventional multimode wireless communication apparatus.
Figure 2:
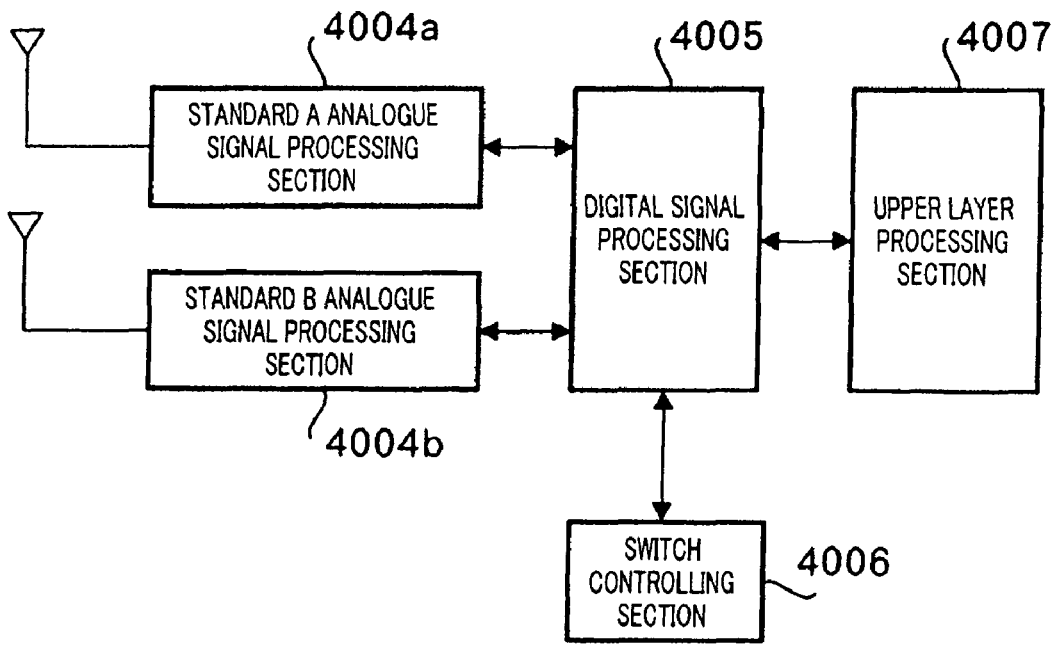
FIG. 2 shows a configuration example of a conventional multimode wireless communication apparatus.
Figure 3:
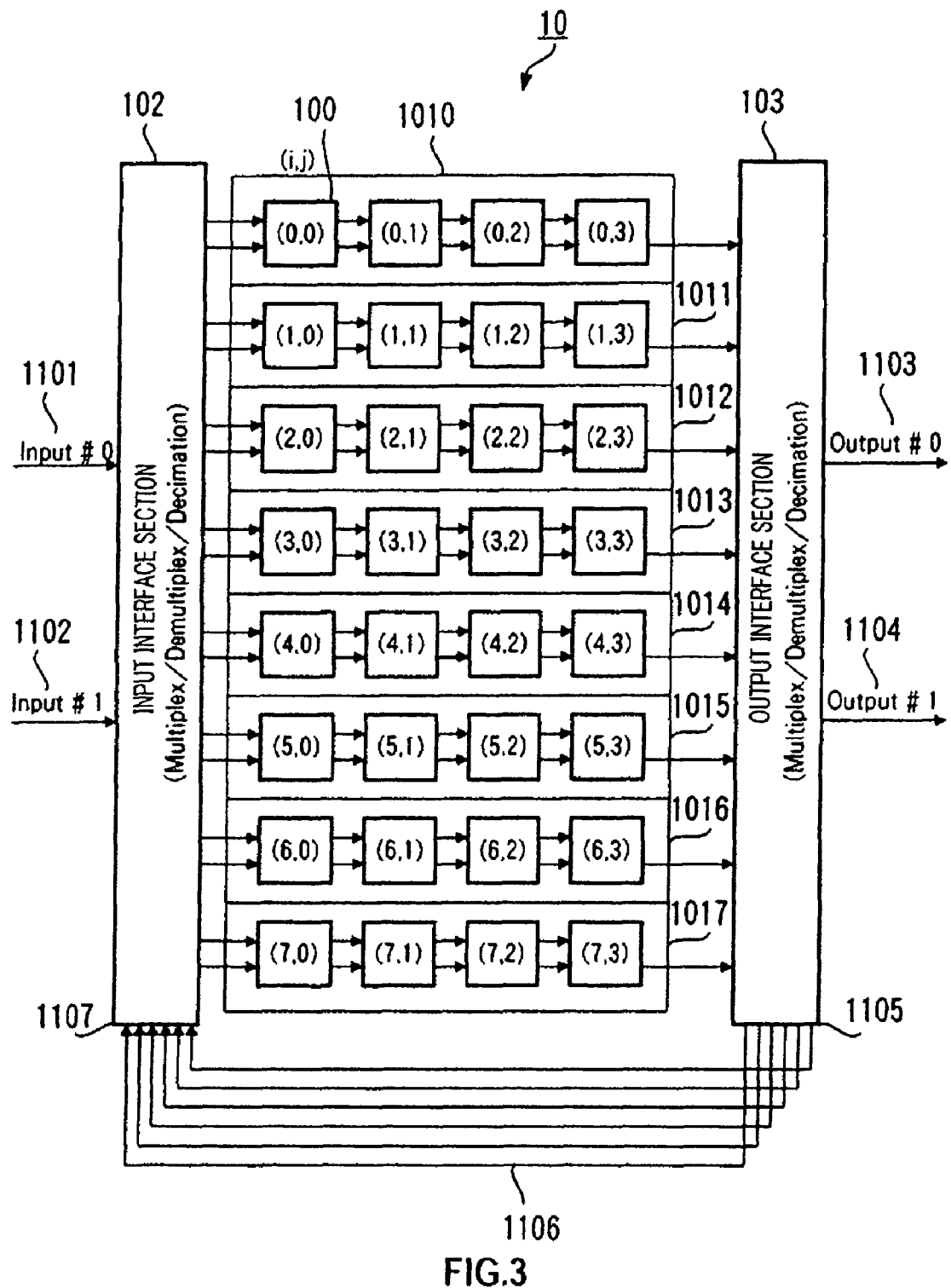
FIG. 3 shows a configuration of a multimode FIR filter processing section according to Embodiment 1 of the present invention.

FIG. 3 shows a configuration of multimode FIR (Finite Impulse Response) filter processing section 10 used to describe the present embodiment. Multimode FIR filter processing section 10 has signal input terminals 1101 and 1102 of two sequences to which signals of separate communication sequences are supplied. Further, multimode FIR filter processing section 10 has signal output terminals 1103 and 1104 of two sequences, and output signals from signal input terminals 1101 and 1102 after filter processing are outputted. Further, multimode FIR filter processing section 10 is formed with multiplication accumulation operator cores 100, eight arithmetic operator core groups 1010 to 1017 formed by connecting four of these multiplication accumulation operator cores 100 in serial, input interface section 102, output interface section 103 and input/output terminal connecting lines 1106.

Input/output terminal connecting line 1106 connects input/output terminal connecting terminal 1107 provided at input interface section 102 with feedback output terminal 1105 provided at output interface section 103.

Multiplication accumulation operator core 100 executes multiplication accumulation operations equivalent to a plurality of tap arithmetic operations in filter processing, switches the tap coefficients, the number of delay taps and signal connections accompanying the multiplication accumulation operations for a plurality of taps according to control signals inputted from controlling section 11 described later and outputs the resulting multiplication accumulation output. Multiplication accumulation operator core 100 has signal input terminals and accumulation operation input terminals for receiving inputs and signal output terminals and accumulation operation output terminals for transmitting outputs. Further, control lines for switching the tap coefficients, the number of delay taps and signal connections are connected, although the control lines are not shown. Further, the configuration of multiplication accumulation operator core 100 will be described later in detail using FIG. 5.

Arithmetic operator core groups 1010 to 1017 connect four of multiplication accumulation operator cores 100 in serial. To be more specific, a signal input terminal and a signal output terminal are connected, and an accumulation operation output terminal and an accumulation operation input terminal are connected between preceding and subsequent multiplication accumulation operator cores. Multiplication accumulation operator cores 100 formed as described above and included in arithmetic operator core groups 1010 to 1017 are configured to carry out common signal processing and connection operations except setting of the tap coefficient values.

Further, in FIG. 3, the number, (i, j), is assigned according to arrangement positions of a plurality of arranged multiplication accumulation operator cores 100 and represents the j-th multiplication accumulation operator core in the i-th arithmetic operator core group. In Embodiment 1, eight sets of arithmetic operator core groups 1010 to 1017 formed by connecting four of multiplication accumulation operator cores 100 in serial are arranged.

Input interface section 102 uses inputs of signal input terminals 1101 and 1102 of two sequences and input/output terminal connecting lines 1106, carries out route switching and demultiplexing processing according to the control signals inputted from controlling section 11 (described later) and supplies a predetermined signal to each of arithmetic operator core groups 1010 to 1017. This configuration will be described in detail later using FIG. 6.

According to the control signals inputted from controlling section 11 (described later), output interface section 103 carries out addition processing and route selection on the predetermined signals supplied from the accumulation operation output terminals of arithmetic operator core groups 1010 to 1017, outputs the signals from signal output terminals 1103 and 1104 of two sequences, branches the signal outputs from arithmetic operator core groups 1010 to 1017 and outputs the signal outputs to input/output terminal connecting lines 1106. This configuration will be described in detail later using FIG. 7.

Input/output terminal connecting lines 1106 connect a plurality of signals between output interface section 103 and input interface section 102, and, to be more specific, feed back accumulation operation outputs from a plurality of arithmetic operator core groups 1010 to 1017 to input interface section 102.

Figure 4:
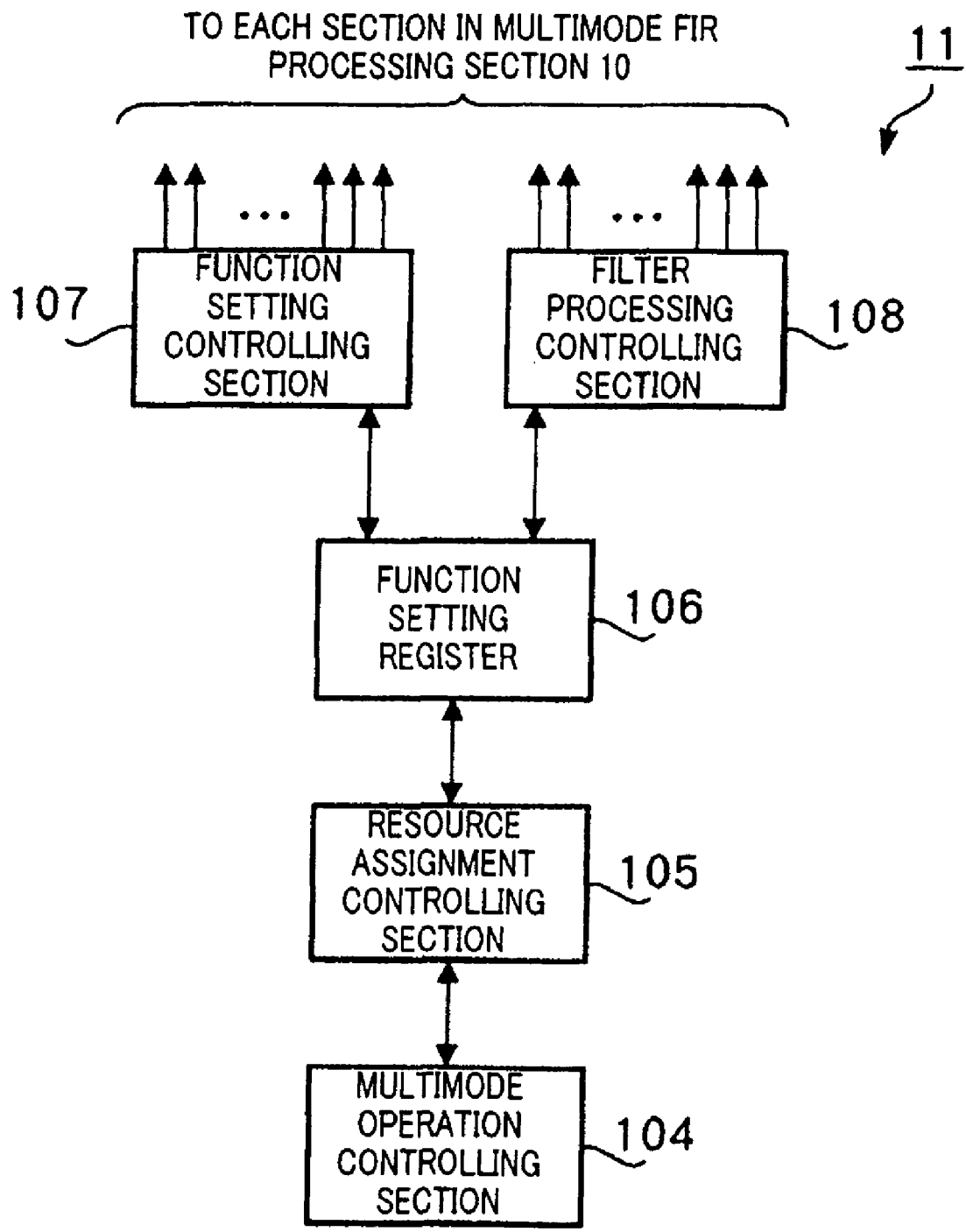
FIG. 4 shows a configuration of a controlling section that controls the multimode FIR filter processing section according to Embodiment 1.

FIG. 4 is a block diagram showing a configuration of controlling section 11 that carries out function setting and operation control of each component in multimode FIR filter processing section 10 of FIG. 3. Controlling section 11 is formed with multimode operation controlling section 104, resource assignment controlling section 105, function setting register 106, function setting controlling section 107 and filter processing controlling section 108.

Multimode operation controlling section 104 selects and controls communication mode in the multimode wireless communication apparatus in which multimode FIR filter processing section 10 is included as a component, and, to be more specific, decides which communication mode supporting which wireless communication standard or wireless communication scheme, is used to carry out communication processing, based on various conditions for decision and outputs an applicable communication mode control signal to resource assignment controlling section 105. Further, in Embodiment 1, which criterion is used to select communication mode, is not limited.

Resource assignment controlling section 105 determines multiplication accumulation operation resources required to realize desired filter specifications based on the communication mode control signal inputted from multimode operation controlling section 104, determines the assignment of multiplication accumulation operation resources based on the availability of multiplication accumulation operation resources in multimode FIR filter processing section 10, and outputs information of the determined resource assignment and the function change accompanying the resource assignment, to function setting register 106. This operation will be described in detail later.

In function setting register 106 which holds information of the resource assignment and the function change accompanying the resource assignment and in which registers supporting each setting section in multimode FIR filter processing section 10 are provided, the function change information inputted from resource assignment controlling section 105 is written into a predetermined register position and is read by function setting controlling section 107 or filter processing controlling section 108 when necessary.

Function setting controlling section 107 reads the function change information held in function setting register 106 when necessary, and controls tap coefficients, selectors for switching connection and demultiplexers in each multiplication accumulation operator core 100, input interface section 102 and output interface section 103 in multimode FIR filter processing section 10. The details and the connection relationships of the function change control signals are not shown in detail in FIG. 3, but will be described later using FIG. 8.

Filter processing controlling section 108 controls the filter processing operation in multimode FIR filter processing section 10 and connects control lines with the operating sections of arithmetic operator core groups 1010 to 1017, input interface section 102 and output interface section 103. The details of the control line will be described in detail later.

Figure 5:
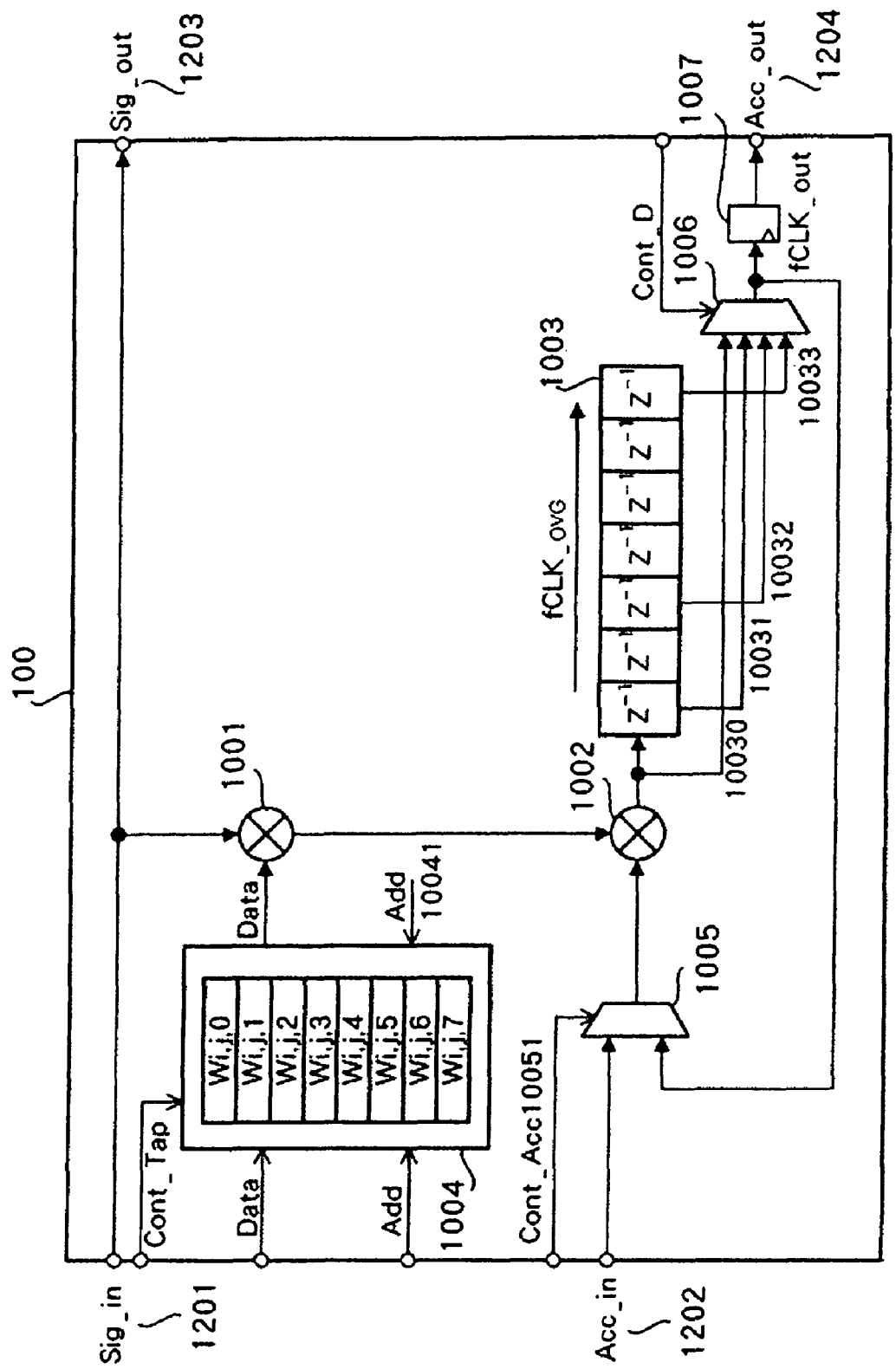
FIG. 5 shows a configuration of a multiplication accumulation operator according to Embodiment 1.

FIG. 5 shows a configuration of multiplication accumulation operator core 100 shown in FIG. 3 for carrying out multiplication accumulation operation processing in a transposition type FIR filter. Multiplication accumulation operator core 100 has signal input terminal 1201 and accumulation operation input terminal 1202 for receiving inputs and has signal output terminal 1203 and accumulation operation output terminal 1204 for outputting a signal, which is inputted to signal input terminal 1201, as is. Further, multiplication accumulation operator core 100 is formed with multiplier 1001, adder 1002, delay register group 1003, tap coefficient memory 1004, selector 1005, selector 1006 and latch circuit 1007.

Multiplier 1001 multiplies a signal inputted from signal input terminal 1201 by the tap coefficients inputted from tap coefficient memory 1004 and outputs the multiplication result to adder 1002.

Adder 1002 adds the multiplication result of multiplier 1001 and an output of selector 1005 and outputs the addition result to delay register group 1003.

In delay register group 1003, seven delay registers that delay an input signal in one clock cycle unit and output the signal are connected in serial.

Tap coefficient memory 1004 stores the tap coefficients for a plurality of taps used for multiplication accumulation operation upon filter processing, and stores eight tap coefficients ($W_{i,j,0}$ to $W_{i,j,7}$) in Embodiment 1.

Selector 1005 selects one of the two sequences of inputs, and outputs the result. Selector 1006 selects one of the four sequences of inputs, and outputs the result.

Latch circuit 1007 latches the signal inputted from selector 1006 at a predetermined clock frequency, outputs the signal and is formed with, for example, a D flip flop. Here, the clock frequency for latching is the same frequency as the signal input.

Writing changes in the tap coefficients in tap coefficient memory 1004 and controlling selection of inputs of delay register signals in selector 1006 are controlled based on the function change control signal inputted from function setting controlling section 107. Further, reading the tap coefficients in tap coefficient memory 1004, carrying out accumulation operation input in selector 1005, and selecting and switching an input signal through selector 1006 from delay register group 1003 are controlled based on the operation control signal inputted from filter processing controlling section 108. Here, four multiplication accumulation operator cores 100 included in the same arithmetic operator core group receive inputs of the same operation control signals as the operation control signal inputted from filter processing controlling section 108 to multiplication accumulation operator core 100, and carries out the same processing operation.

Further, the processing operation of each section in multiplication accumulation operator core 100 operates at the overclock frequency matching an overclock operation ratio set in function setting controlling section 107 with respect to the clock rate inputted to signal input terminal 1201.

Figure 6:
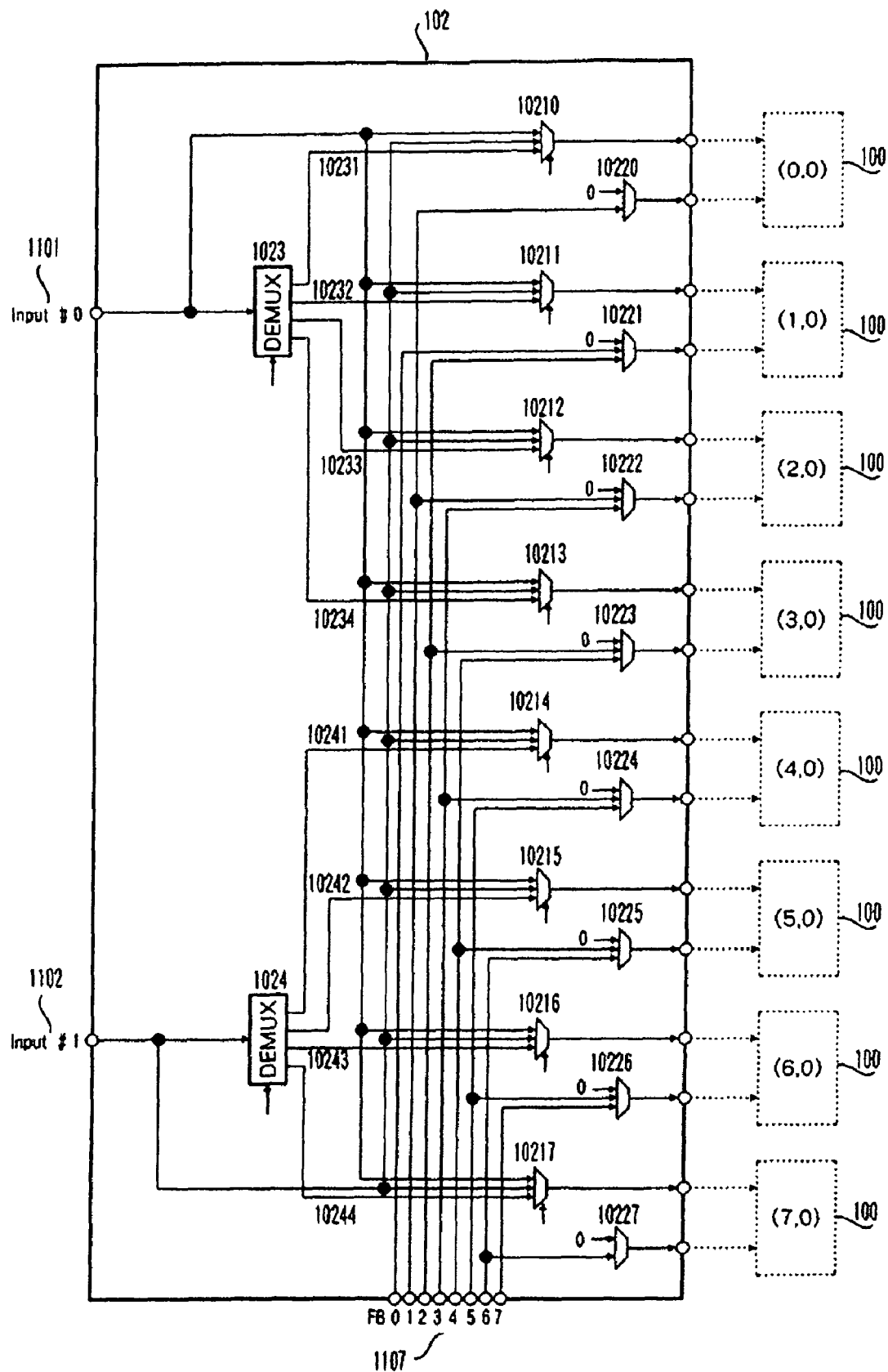
FIG. 6 shows a configuration of an input interface section according to Embodiment 1.

FIG. 6 shows a configuration of input interface section 102 shown in FIG. 3. Input interface section 102 has: signal input terminals 1101 and 1002 of two separate sequences for receiving inputs; input/output terminal connection terminals 1007 that receive feedback inputs of output signals of arithmetic operator core groups 1010 to 1017 inputted from output interface section 103 through input/output connecting lines 1106; and output terminals to signal input terminals and accumulation operation input terminals of arithmetic operator core groups 1010 to 1017. Further, input interface section 102 is formed with selectors 10210 to 10217 and 10220 to 10227, and demultiplexers 1023 and 1024. Further, connecting lines for controlling the function change are separately connected from function setting controlling section 107 with components, although the connecting lines are not shown in FIG. 6.

Selectors 10210 to 10217 and 10220 to 10227 each select one of a plurality of input signals according to the function change control signals inputted separately from function setting controlling section 107 and outputs the signal to arithmetic operator core groups 1010 to 1017 connected with output stages. Selectors 10210 to 10217 have three input terminals, and the first input terminals of the selectors are connected with signal input terminal 1101 and the second input terminals are connected with signal input terminal 1102. The third input terminals of selectors 10210 to 10213 are connected with first output terminal 10231, second output terminal 10232, third output terminal 10233 and fourth output terminal 10234 of demultiplexer 1023, respectively. Further, the third input terminals of selectors 10214 to 10217 are connected with first output terminal 10241, second output terminal 10242, third output terminal 10243 and fourth output terminal 10244 of demultiplexer 1024, respectively.

Selectors 10220 and 10227 with two input terminals and selectors 10221 to 10226 with three input terminals each select an output signal according to the function change control signal inputted separately from function setting controlling section 107. Outputs of selectors 10220 to 10227 are connected with accumulation operation input terminals of arithmetic operator core groups 1010 to 1017 in FIG. 3. The first input terminals of selectors 10220 to 10227 receive inputs of data equivalent to the constant "0." Further, in arithmetic operator core groups 1010 to 1017 shown in FIG. 3, the other input terminals of selectors 10220 to 10227 are each connected with accumulation operation output terminals of arithmetic operator core groups in the upper row and the lower row of an arithmetic operator core group connected with an output terminal of each selector, through output interface section 103 and input/output terminal connecting lines 1106. That is, for example, the accumulation operation output terminal of arithmetic operator core group 1010 is connected with the second input terminal of selector 10221, and the accumulation operation output terminal of arithmetic operator core group 1011 is connected with the second input terminal of selector 10220 and the second input terminal of selector 10222.

Figure 7:
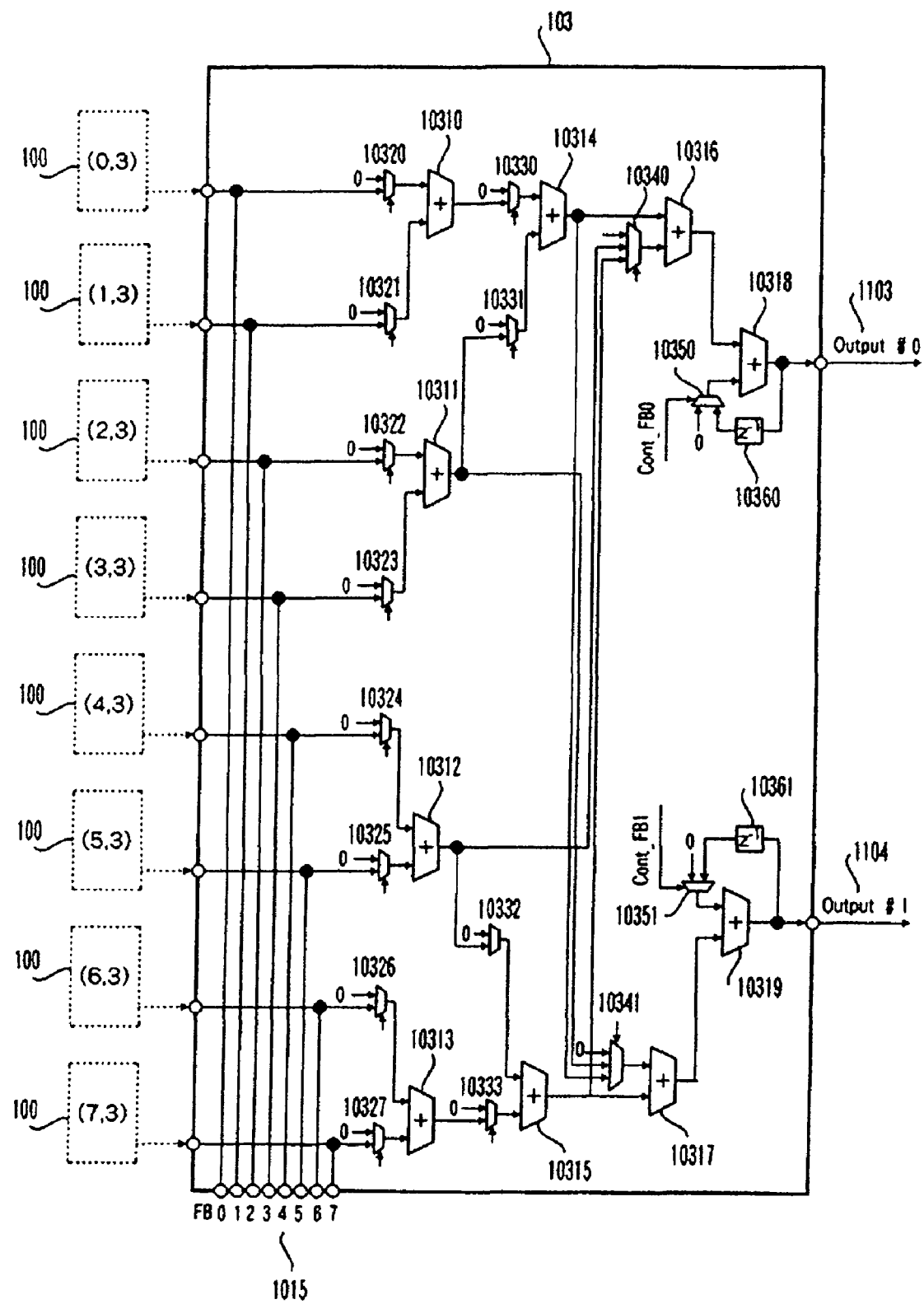
FIG. 7 shows a configuration of an output interface section according to Embodiment 1.
Figure 13E:
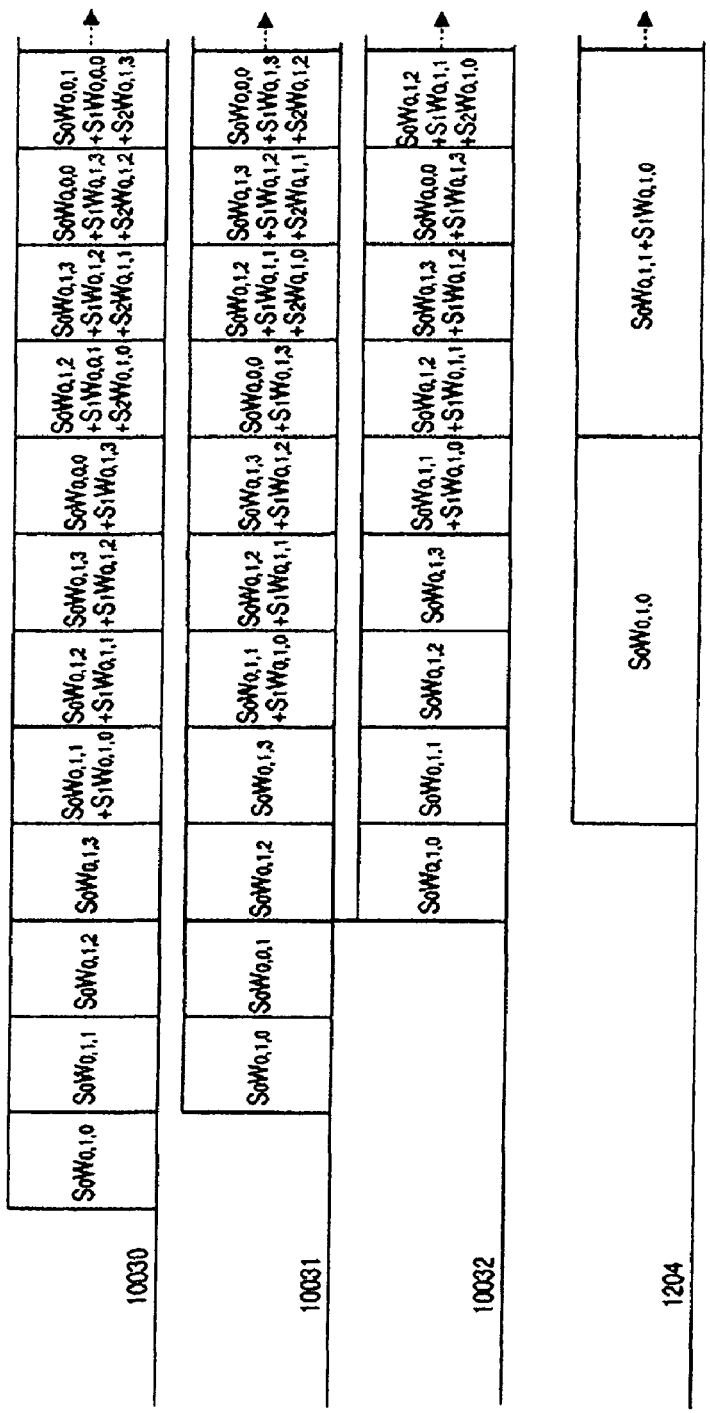
FIG. 13 shows part of an operation example of a filter of the serial connection type in the multimode FIR filter processing section according to Embodiment 1.
Figure 14E:
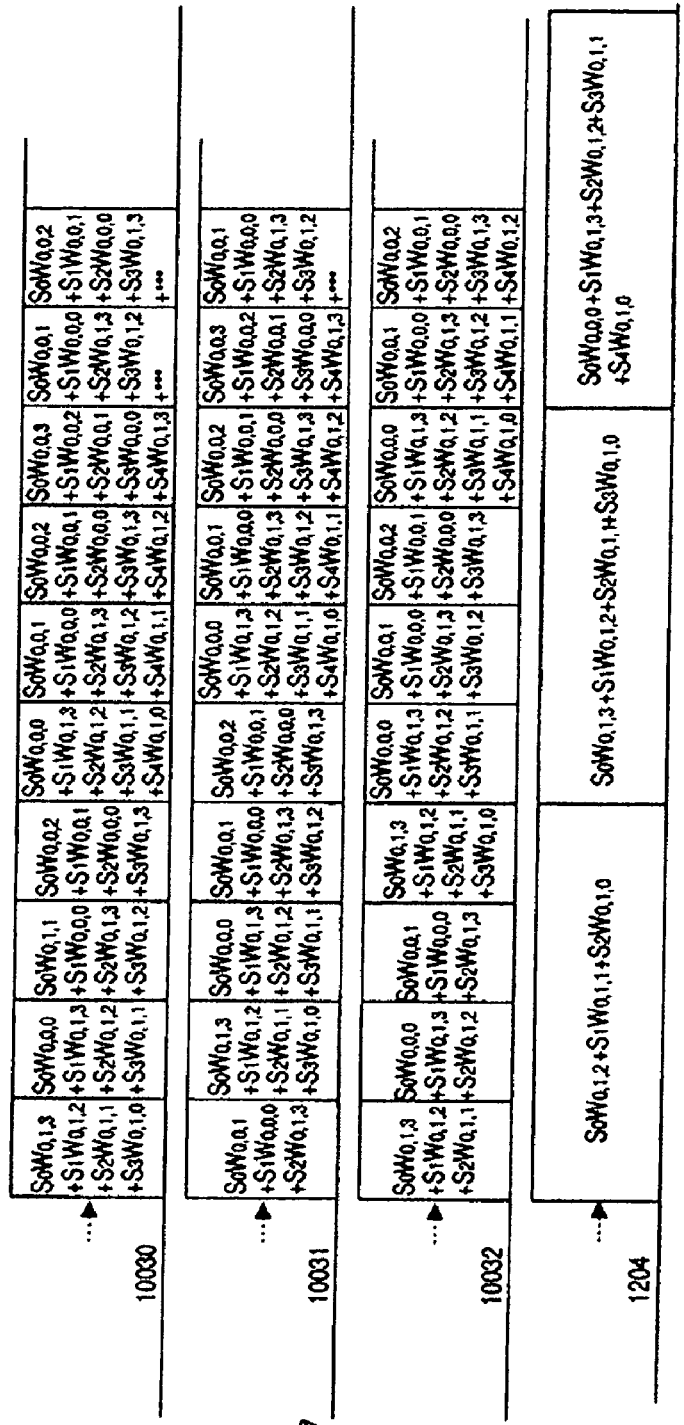
FIG. 14 shows an operation example subsequent to FIG. 13 according to Embodiment 1.

FIG. 7 shows a configuration of output interface section 103 shown in FIG. 3. Output interface section 103 receives the accumulation operation outputs of arithmetic operator core groups 1010 to 1017 in FIG. 3 as input, and has signal output terminals 1103 and 1104 of two sequences and feedback output terminal 1105 to input interface section 102. Further, output interface section 103 has a plurality of selectors for route selection, a plurality of adders and a plurality of delay registers. To be more specific, output interface section 103 is formed with adders 10310 to 10319, selectors 10320 to 10327, 10330 to 10333, 10340, 10341, 10350 and 10351, and delay registers 10360 and 10361. Further, connecting lines for controlling the function change are separately connected with components from function setting controlling section 107, although the connecting lines are not shown in FIG. 7. Adders 10310 to 10319 add input digital values of two sequences and output addition results. Adders 10310 to 10315 receive outputs of selectors 10320 and 10321, 10322 and 10323, 10324 and 10325, 10326 and 10327, 10330 and 10331, and 10332 and 10333, respectively. Adders 10316 and 10317 receive outputs of adder 10314 and selector 10340 as input, and outputs of adder 10315 and selector 10341 as input, respectively. Adders 10318 and 10319 receive outputs of adder 10316 and selector 10350 as input and outputs of adder 10317 and selector 10351 as input, respectively.

Selectors 10320 to 10327, 10330 to 10333, 10340, 10341, 10350 and 10351 with two input terminals each select output signals according to the function change control signals separately inputted from function setting controlling section 107. One of input terminals of selectors other than selectors 10340 and 10341 receives an input of a value equivalent to the constant "0." The other input terminals of selectors 10320 to 10327 are connected with accumulation operation output terminals of arithmetic operator core groups 1010 to 1017. The other input terminals of selectors 10330 to 10333 are connected with output terminals of adders 10310, 10311, 10312 and 10313, respectively. The other input terminals of selectors 10350 and 10351 are connected with output terminals of delay registers 10360 and 10361, respectively. Selectors 10340 and 10341 are connected with output terminals of adders 10312 and 10315, and output terminals of adders 10311 and 10314, respectively. Delay registers 10360 and 10361 delay the addition results by one cycle, to carry out accumulation addition of a plurality of filter operation values in adders 10318 and 10319, and output the results to selectors 10350 and 10351, respectively.

FIG. 8 shows an example of function setting table 600 illustrating configuration sections and set values for writing and reading the function setting in function setting register 106. For example, in this table, setting registers are provided for selectors 10210 to 10217 and 10220 to 10227 and demultiplexer 1023 and 1024 in input interface section 102 shown in FIG. 6. In selectors 10210 to 10217 and 10220 to 10227, values of 0, 1 and 2 may be set, and the three sequences of input terminals shown in FIG. 6 are selected from top of input terminals.

As for the selectors in arithmetic operator core groups 1010 to 1017 and output interface section 103, inputs are selected in order from the top to the bottom or from the left to the right of signal input terminals according to the ascending order of set values.

Each overclock ratio in arithmetic operator core groups 1010 to 1017 is the ratio of the processing clock rate in an arithmetic operator core with respect to the clock frequency for a signal input to each arithmetic operator core group, and is set to values of one-fold, two-fold, four-fold and eight-fold. Demultiplexers 1023 and 1024 change output operations for input signals according to two types of set values of operation mode and the number of branches. Operation mode sets operations of demultiplexers 1023 and 1024. When set value is "0," the same number of the same signals as branches is outputted, and, when set value is "1," the same number of inputs as branches of outputs is switched and outputted sequentially.

FIG. 9 shows an example of the relationships between the input and output and each set value in demultiplexer 1023. In this figure, FIG. 9A shows an example of an input signal inputted to demultiplexer 1023 through signal input terminal 1101. FIG. 9B shows an example of an output signal when "mode: 0 and the number of branches: 4" as the set value. FIG. 9C shows an example of an output signal when "mode: 1 and the number of branches: 2" as the set value. FIG. 9D shows an example of an output signal when "mode: 1 and the number of branches: 4" as the set value.

Further, assume that a predetermined address is assigned to each function setting register shown in FIG. 8, and writing and reading of a predetermined register can be carried out by specifying the address. However, to assign which register to which address is not the subject of the present invention, and so will not be described.

Further, to enable multimode FIR filter processing section 10 formed as shown in FIG. 3 to FIG. 7 to separately set processing clock frequencies of filter processing with respect to signal input terminal 1101 and filter processing with respect to signal input terminal 1102, the configuration of supplying operation clocks of two sequences to each processing section and selecting a clock for use upon function setting is employed.

What kind of filter processing operation will be realized in multimode FIR filter processing section 10 formed as described above will be described. According to the configuration shown in Embodiment 1, the function setting is switched and predetermined filter processing is controlled, so that it is possible to support filter processing of, for example, a filter of the serial connection type, a decimation filter of the polyphase type, and a multiplexing decimation filter of the polyphase type. An example of the function setting and filter processing control when filter processing is carried out with each type of a filter will be described below.

(1) Filter of Serial Connection Type

Here, a case will be described with a setting and operation example where the FIR filer for 128 taps is formed using arithmetic operator core groups 1010 to 1017 with respect to signal input terminal 1101 and outputting is carried out to signal output terminal 1103.

FIG. 10 shows an example of function setting table 800 for setting the function of each section in function setting register 106 when the filter function for the serial connection type is realized in the configuration of multimode FIR filter processing section 10 according to Embodiment 1.

In input interface section 102 of FIG. 6, selectors 10210 to 10217 select an input from signal input terminal 1101 and selectors 10221 to 10227 select an accumulation operation output from an arithmetic operator core group in a row above the present row in FIG. 3 as an input. By this means, the same signal is inputted as signal inputs of all multiplication accumulation operator cores 100, which means that input terminals of multiplication accumulation operator cores 100 are connected in serial. Further, selector 10220 selects zero as an input default value to multiplication accumulation operator core 100. Further, in this case, there is no influence upon settings of demultiplexers 1023 and 1024.

In each multiplication accumulation operator core 100, operation is carried out at the overclock rate four, that is, multiplication accumulation operation processing for four taps is carried out per signal input, input 10032 is selected in selector 1006, arithmetic operation results for four delay taps are stored per multiplication accumulation operator core 100 and, once in every four multiplication accumulation operations, the accumulation operation results stored in delay register group 1003 are outputted to subsequent multiplication accumulation operator core 100. In tap coefficient memory 1004 in each multiplication accumulation operator core 100, part of the tap coefficients for 128 taps are written in each area of addresses 0 to 3 for four taps. To be more specific, if the tap coefficients of the FIR filter for 128 taps are c(m) {m=0, 1, ..., 127}, tap coefficients $w_{i,j,k}$ written in the k-th address in multiplication accumulation operator (i, j) are represented by following equation 1.

$$w_{i,j,k}=c(127-(i\times16+j\times4-k))  \quad \text{(Equation 1)}$$

The details of control carried out by filter processing controlling section 108 after the setting of each section is carried out as described above by function setting controlling section 107, will be described below.

FIG. 11 to FIG. 14 show the details of the operation in the process of signal processing in each section of input interface section 102 and arithmetic operator core group 1010 in multimode FIR filter processing section 10. In these figures, the details of series of operations are divided and shown in FIG. 11 to FIG. 14.

These figures show the details of the operation in case where signal sequences Sn are sequentially inputted from signal input terminal 1101 in multiplication accumulation operator cores (0, 0) and (0, 1) as multiplication accumulation operator cores 100 forming arithmetic operator group 1010 of FIG. 3. In FIG. 11 to FIG. 14, "A" in these figures shows an example of signal sequences Sn inputted to signal input terminal 1101, "B" in these figures shows an example of read address 10041 inputted from filter processing section 108 to each of multiplication accumulation operator cores (0, 0) and (0, 1), "C" in these figures shows an example of a control signal inputted to selector 1005 of each of multiplication accumulation operator cores (0, 0) and (0, 1), "D" in these figures shows an example of the processing operation in multiplication accumulation operator core (0, 0) and "E" in the figures shows an example of the processing operation in multiplication accumulation operator core (0, 1).

Read address (Add) 10041 (0, 1, 2, 3, of (b)) inputted to tap coefficient memory 1004 in each of multiplication accumulation operator cores (0, 0) and (0, 1) from filter processing controlling section 108 is updated sequentially at a rate four times as much as a signal input, the tap coefficients ($w_{0,0,0,0,0,1,0,0,2,0,0,3}$) for four taps are read per signal input of one sample, integration processing of signal sequences Sn is sequentially carried out in multiplier 1001 and the integration results are subjected to accumulation addition in adder 1002.

The other input to adder 1002 is selected according to control signal (Cont_Acc) 10051 inputted to selector 1005, a signal of only one clock in four-fold overclock processing is inputted from an accumulation operation output terminal in preceding multiplication accumulation operator 100, and output 10032 from delay register group 1003 is fed back through selector 1006 at the other timings.

The details of delay register group 1003 is latched by latch circuit 1007 once in every four clocks and is supplied to the accumulation operation input terminal of subsequent multiplication accumulation operator core 100. By carrying out the above operations in multiplication accumulation operator cores 100 and arithmetic operator core groups 1010 to 1017, multiplication accumulation processing is carried out for four taps per multiplication accumulation operator core, for sixteen taps per arithmetic operator core group and for 128 taps for a whole sequence, and the entire multiplication accumulation operation result is finally outputted from an accumulation operation output terminal of arithmetic operator core group 1017.

Output interface section 103 selects a route of the output signal of arithmetic operator core group 1017 according to each setting of selectors 10320 to 10327, 10330 to 10333, 10340, 10341, 10350 and 10351 of FIG. 7, and the route of the output signal is selected and finally outputted to signal output terminal 1103.

According to the above configuration, FIR filter processing of the serial connection type for 128 taps is carried out by multimode FIR filter processing section 10. Further, although multiplication accumulation operation for four taps is carried out per multiplication accumulation operator core in the above example, the present invention is not limited to this, and, if the overclock frequency in each multiplication accumulation operator core enables an operation, a configuration of setting the overclock rate to eight-fold, carrying out a multiplication accumulation operation for eight taps per multiplication accumulation operator core and carrying out the same FIR filter processing for 128 taps using only multiplication accumulation resources for sixteen multiplication accumulation operator cores of arithmetic operator core groups 1010 to 1013, may be possible.

(2) Decimation Filter of Polyphase Type

A case will be described with a setting and operation example where the FIR filter of the polyphase type for 128 taps for carrying out multiplication accumulation operation for eight taps per multiplication accumulation operator core 100 at the decimation ratio 1/4 using arithmetic operator core groups 1010 to 1013 is formed with respect to input signal terminal 1101 and outputting is carried out to signal output terminal 1103.

FIG. 15 shows an example of function setting table 900 for setting the function of each section when a decimation filter function for the polyphase type is realized in the multimode FIR filter configuration according to Embodiment 1.

Based on the details of the setting in this function setting table 900, in input interface section 102, the operation of demultiplexer 1023 is set and the routes of selectors 10210 to 10213 are selected such that signals inputted to signal input terminal 1101 are switched to outputs 10231, 10232, 10233, and 10234 per sample at demultiplexer 1023 and are outputted as a supply to arithmetic operator core groups 1010 to 1013 through selectors 10210 to 10213.

Further, based on the details of the setting of function setting table 900, selectors 10220 to 10223 are set such that the constant "0" is supplied to accumulation operation input terminals of arithmetic operator core groups 1010 to 1013. Further, the function setting with respect to this filter processing does not influence the setting of arithmetic operation resources and function setting sections of the lower half of arithmetic operator core groups 1014 to 1017, input interface section 102 and output interface section 103, that is, selectors 10214 to 10217, 10224 to 10227 and selectors 10324 to 10327, and, if another filter processing is carried out with respect to a signal of another input sequence, the function setting supporting this filter processing is separately carried out. The operation of this dynamic function setting will be described later.

If decimation filter processing is carried out at the decimation ratio 1/4 in the decimation filter of the polyphase type, signals are outputted at one-fourth of the rate of the signal input from each of output 10231 to 10234 of four sequences in demultiplexer 1023 of input interface section 102, and these outputs are supplied to arithmetic operator core groups 1010 to 1013 through selectors 10210 to 10213.

Then, multiplication accumulation operator cores 100 ((0, 0), (1, 0), (2, 0), and (3, 0) of FIG. 3) of arithmetic operator core groups 1010 to 1013 carry out multiplication accumulation operation processing at the overclock rate eight times as much as signal inputs from input interface section 102. That is, the multiplication accumulation operation processing is carried out at the overclock rate four times as much as an original rate of a signal inputted to signal input terminal 1101.

Further, in selector 1006 in multiplication accumulation operator core 100, input 1033 is selected, the arithmetic operation result for eight delay taps is stored per multiplication accumulation operator core 100, and, once in every eight multiplication accumulations, the accumulation operation results held in delay register group 1003 are outputted to subsequent multiplication accumulation operator core 100. In tap coefficient memory 1004 in each multiplication accumulation operator core 100, part of the tap coefficients for 128 taps are written in each area of addresses 0 to 7 for eight taps. To be more specific, if the tap coefficients of the FIR filter for 128 taps are c(m) {m=0, 1, ..., 127}, tap coefficients $w_{i,j,k}$ written in the k-th address in multiplication accumulation operator core (i, j) are represented by following equation 2.

$$w_{i,j,k}=c(99-(i+j\times32-k\times4)) \quad \text{(Equation 2)}$$

The details of control carried out by filter processing section 108 after the function setting of each section in input interface section 102, arithmetic operator core groups 1010 to 1013 and output interface section 103 is carried out by function setting controlling section 107, will be described below.

FIG. 16 to FIG. 21 show the details of the operation in the process of the FIR filter signal processing of the polyphase type for 128 taps carried out at the decimation ratio 1/4 in each section of input interface section 102, arithmetic operator core groups 1010 to 1013 and output interface section 103 in multimode FIR filter section 10. In these figures, the details of series of operations are divided and shown in FIG. 16 to FIG. 21.

These figures show the details of the operation in case where signal sequences Sn are sequentially inputted from signal input terminal 1101 in multiplication accumulation operator cores (0, 3), (1, 3), (2, 3) and (3, 3) as multiplication accumulation operator cores 100 forming arithmetic operators 1010 to 1013 of FIG. 3. In FIG. 16 to FIG. 21, "A" in these figures shows an example of signal sequences Sn inputted to signal input terminal 1101, "B" in these figures shows outputs 10231 to 10234 of four sequences in demultiplexer 1023 of input interface section 102, "C" in these figures shows an example of input and output signals processed in each section of the multiplication accumulation operator core (0, 3), "D" in these figures shows an example of input and output signals processed in each section in the multiplication accumulation operator core (1, 3), "E" in these figures shows an example of input and output signals processed in each section in multiplication accumulation operator core (2, 3), "F" in these figures shows an example of input and output signals processed in each section of multiplication accumulation operator core (3, 3) and "G" in these figures shows an example of a signal outputted from signal output terminal 1103 of output interface section 103.

Signal sequences Sn shown in above FIG. 16A and FIG. 17A are inputted sequentially to signal input terminal 1101 of input interface section 102, and output signals 10231, 10232, 10233 and 10234 of four sequences shown in FIG. 16B and FIG. 17B are sequentially switched per sample at demultiplexer 1023 and outputted.

Addresses are supplied sequentially to read address (Add) 10041 of tap coefficient memory 1004 in each of multiplication accumulation operator cores (0, 3), (1, 3), (2, 3) and (3, 3) from filter processing controlling section 108 at the rate eight times as much as signal input terminal 1201, the tap coefficients for eight taps (for example, $w_{0,7}, 0, 0, 7, 1, 0, 7, 2, 0, 7, 3, 0, 7, 4, 0, 7, 5, 0, 7, 6, 0, 7, 7}$ in FIG. 16C and FIG. 17C) are read per signal input of one sample, integration processing of signal sequences Sn is sequentially carried out in multiplier 1001 and the integration results are subjected to accumulation addition in adder 1002.

The other input to adder 1002 is selected according to control signal (Cont_Acc) 10051 inputted to selector 1005, a signal of only one clock in the eight-fold overclock processing is inputted from an accumulation operation output terminal in preceding multiplication accumulation operator 100, and output 10033 from delay register group 1003 is fed back through selector 1006 at the other timings. Output 10033 of delay register group 1003 from selector 1006 is latched by latch circuit 1007 once in every eight clocks and is supplied to an accumulation operation input terminal of subsequent multiplication accumulation operator core 100.

By carrying out the above operations in multiplication accumulation operator cores 100 and arithmetic operator core groups 1010 to 1013, multiplication accumulation operation processing is carried out for eight taps per multiplication accumulation operator core 100, for thirty two taps per arithmetic operator core group 1010 to 1013 and for 128 taps for a whole sequence, and the entire multiplication accumulation operation result is finally outputted from an accumulation operation output terminal of arithmetic operator core group 1013.

Figure 21F:
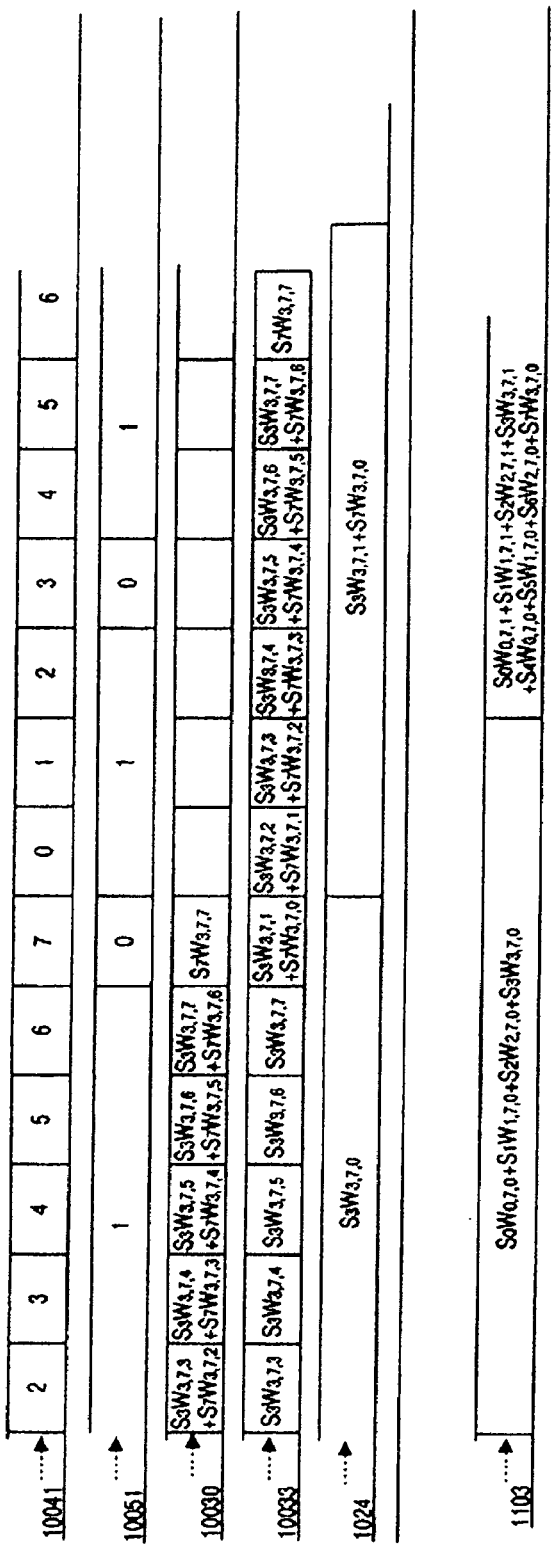
FIG. 21 shows the operation example subsequent to FIG. 20 according to Embodiment 1.

Output interface section 103 selects routes of selectors 10320 to 10323, 10330, 10331, 10340, and 10350 shown in FIG. 7 according to the setting of function setting table 900 shown in FIG. 15, adders 10310, 10311, 10314, 10316 and 10318 add and combine accumulation operation outputs of arithmetic operator core groups 1010 to 1013, and signal output terminal 1103 finally outputs the signal shown in FIG. 21G.

According to the above configuration, multimode FIR filter processing section 10 carries out FIR filter processing of the polyphase type for 128 taps at the decimation ratio 1/4. Further, although multiplication accumulation operation for eight taps is carried out per multiplication accumulation operator core in the above example, the present invention is not limited to this, and, if the overclock frequency in each multiplication accumulation operator core does not enable an operation in the device, a configuration of setting the overclock ratio to four-fold, carrying out multiplication accumulation operation for four taps per multiplication accumulation operator core and carrying out the same FIR filter processing for 128 taps using multiplication accumulation operation resources for thirty two multiplication accumulation operator cores of arithmetic operator core groups 1010 to 1017 may be possible.

(3) Time Division Multiplexing Decimation Filter of Polyphase Type

Here, a case will be described with a setting and operation example where the FIR filter of the polyphase type for sixty four taps for carrying out multiplication accumulation operation for eight taps at the decimation ratio 1/4 per multiplication accumulation operator core is formed with respect to a signal inputted to signal input terminal 1101 using arithmetic operator core groups 1010 and 1011, and this signal is outputted to signal output terminal 1103. Although the FIR filter of the polyphase type at the decimation ratio 1/4 generally carries out filter processing with one-fourth of the amount of operations per sequence by sequentially branching an input signal into four sequences, a case will be described with an operation example where multiplication accumulation processing for two sequences is time-multiplexed in one sequence and FIR filter processing of the polyphase type for four sequences is carried out in two sequences.

FIG. 22 shows an example of function setting table 1000 for setting the function of each section when the time division multiplexing decimation filter function for the polyphase type is realized in the multimode FIR filter configuration in Embodiment 1.

Based on the details of the setting of this function setting table 1000, in input interface section 102, the operation of demultiplexer 1023 is set and routes of selectors 10210, 10211, 10220 and 10221 are selected such that the signals inputted to signal input terminal 1101 are sequentially switched to outputs 10231 and 10232 per sample in demultiplexer 1023 and outputted as a supply to arithmetic operator core groups 1010 and 1011 through selectors 10210 and 10211.

Further, based on the details of the setting of function setting table 1000, selectors 10220 and 10221 are set such that the constant "0" is supplied to accumulation operation input terminals of arithmetic operator core groups 1010 and 1011. Further, in function setting with respect to this filter processing, the settings of function setting sections of selectors and demultiplexers which are not on signal routes in arithmetic operator core groups 1012 to 1017, input interface section 102 and output interface section 103 do not influence the operation, and, if another filter processing is carried out on a signal of another input sequence, function setting supporting this filter processing is carried out separately.

If decimation filter processing of the polyphase type is carried at the decimation ratio 1/4 and twice division multiplexing processing is carried out separately per sequence of a route, demultiplexer 1023 sequentially outputs a signal input from signal input terminal 1101 at one-half of the original rate of the signal input from outputs 10231 and 10232 of two sequences, as a supply to arithmetic operator core groups 1010 and 1011 through selectors 10210, 10211, 10220 and 10221. Then, multiplication accumulation operator core 100 ((0, 0) and (1, 0) of FIG. 3) of each of arithmetic operator core groups 1010 and 1011 carries out multiplication accumulation operation processing at the overclock rate eight times as much as the signal input from input interface section 102. That is, the multiplication accumulation operation processing is carried out at the overclock rate four times as much as the original rate of the signal inputted to signal input terminal 1101.

Further, selector 1006 of multiplication accumulation operator core 100 selects input 10033, and so the arithmetic operation result for eight delay taps is obtained per multiplication accumulation operator core 100, and, once in every eight multiplication accumulation operations, the accumulation operation results held in delay register 1003 are outputted to subsequent multiplication accumulation operator core 100. Here, of data for eight taps subjected to multiplication accumulation operation, and so signal inputs are different between the former four taps and the latter four taps, signals of separate sequences in processing for the polyphase type are supplied in time division, and multiplication accumulation results of separate sequences for four taps each are alternately stored. In tap coefficient memory 1004 in each multiplication accumulation operator core 100, part of tap coefficients for sixty four taps is written in each area of addresses 0 to 7 for eight taps. To be more specific, if the tap coefficients of the FIR filter for sixty four taps is c(m) $\{0, 1, \ldots, 63\}$, tap coefficients $w_{i,j,k}$ written in the k-th address in multiplication accumulation operation (i, j) are represented by following equation 3.

$$w_{i,j,k} = c(49-(i+j\times16-([k/4]\times4+(k \bmod 4)))) \quad \text{(Equation 3)}$$

Here, [ ] in equation 3 is the maximum integer not exceeding the value of [ ], and (k mod 4) is the excess obtained by dividing k by four.

The details of control carried out by filter processing controlling section 108 after the function of each section in input interface section 102, arithmetic core groups 1010 and 1011 and output interface section 103 is set by function setting controlling section 107 as described above, will be described below.

FIG. 23 to FIG. 26 show the details of the operation in the process of FIR filter signal processing of the polyphase type for sixty four taps carried out at the decimation ratio 1/4 in time division in each section in multimode FIR filter section 10. The details of series of operations are divided and shown in FIG. 23 to FIG. 26.

These figures show the details of the operation when signal sequences Sn are sequentially inputted from signal input terminal 1101 in multiplication accumulation operator cores (0, 7) and (1, 7) as multiplication accumulation operator cores 100 forming arithmetic operator core groups 1010 and 1011 of FIG. 3. In FIG. 23 to FIG. 26, "A" in these figures shows an example of a signal processed in input interface section 102, "B" in these figures shows an example of input and output signals processed in each section of multiplication accumulation operator core (0, 7), "C" in these figures shows an example of input and output signals processed in each section of multiplication accumulation operator core (1, 7) and "D" in these figures shows an example of signals outputted from adders 10316 and 10318 of output interface section 103.

Figures 24A, 24B:
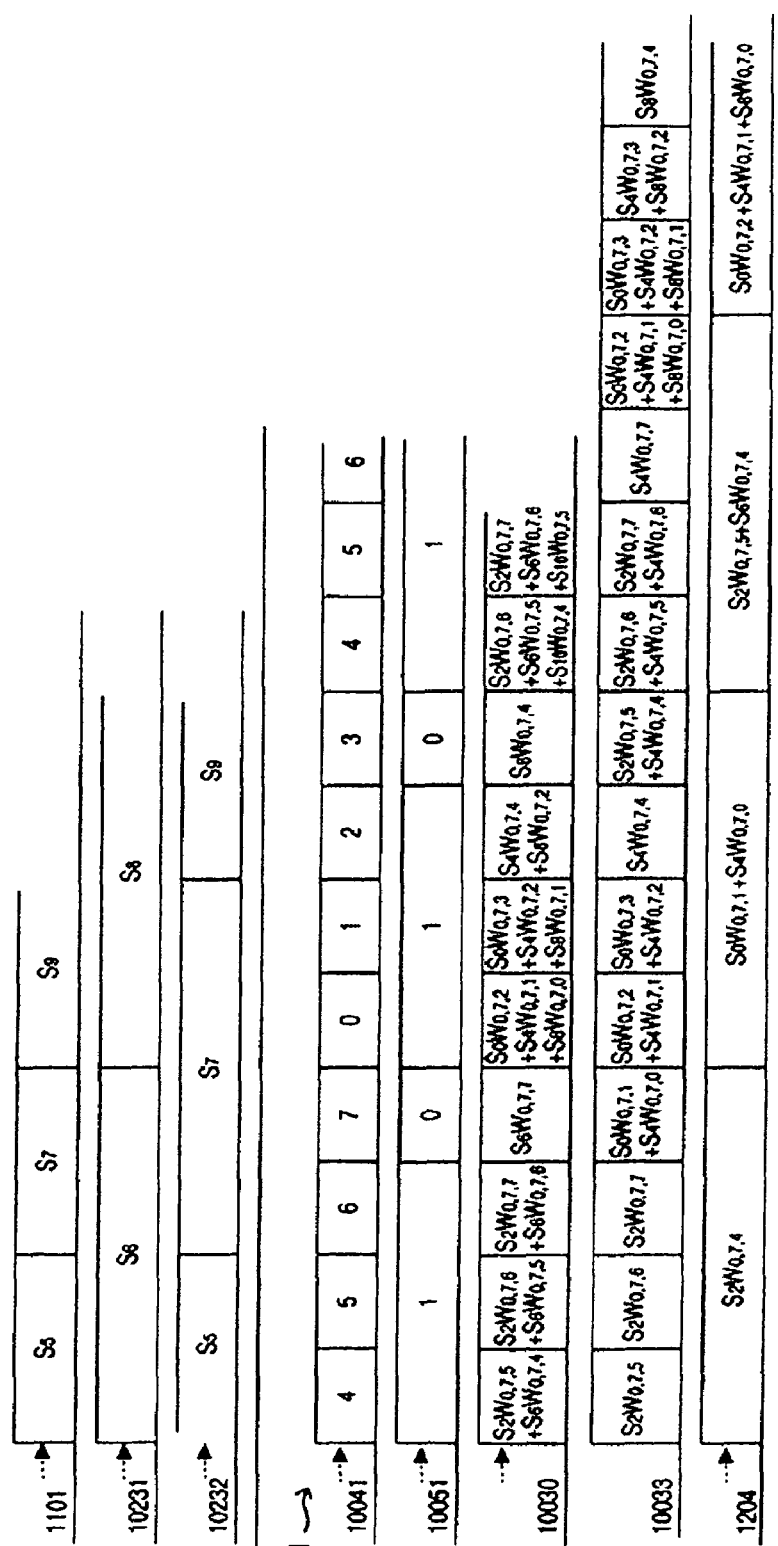
FIG. 24 shows the operation example subsequent to FIG. 23 according to Embodiment 1.

Signal input terminal 1101 of input interface section 102 sequentially receives an input of signal sequences Sn shown in above FIG. 23A and FIG. 24A and demultiplexer 1023 sequentially switches signal sequences Sn to output signals 10231 and 10232 shown in FIG. 23A and FIG. 24A per sample and transmits output signals.

Addresses are sequentially supplied from filter processing controlling section 108 at the rate eight times as much as the signal inputted to signal input terminal 1201, to read address (Add) 10041 of tap coefficient memory 1004 of each of multiplication accumulation operator cores (0, 7) and (1, 7), the tap coefficients for four taps (for example, $w_{0,7,0}, w_{0,7,1,0}, w_{7,2,0,7,3}$ in FIG. 23B and FIG. 24B) are read per signal input of one sample, integration processing of signal sequences Sn is sequentially carried out in multiplier 1001 and the result is subjected to accumulation addition in adder 1002.

The other input to adder 1002 is selected according to control signal (Cont_Acc) 10051 inputted to selector 1005, a signal of only one clock in eight-fold overclock processing is inputted from the accumulation operation output terminal of a preceding multiplication accumulation operator core, and output 10033 from delay register 1003 is fed back through selector 1006 at the other timings.

Output 10033 of delay register 1003 from selector 1006 is latched by latch circuit 1007 once in every four clocks and is supplied to an accumulation operation input terminal of a subsequent multiplication accumulation operator core. By carrying out the above operations in multiplication accumulation operator cores 100 and arithmetic operator core groups 1010 and 1011, multiplication accumulation processing is carried out for eight taps per multiplication accumulation operator core 100, for thirty two taps for arithmetic operator core groups 1010 and 1011 and for sixty four taps for a whole sequence, and the entire multiplication accumulation operation result is finally outputted from an accumulation operation output terminal of arithmetic operator core group 1011.

Output interface section 103 selects routes of selectors 10320 to 10323, 10330, 10331, and 10340 in FIG. 7 according to the setting of function setting table 1000 shown in FIG. 22, adder 103110 adds and combines accumulation operation outputs of arithmetic operator core groups 1010 and 1011, adder 10318 carries out accumulation and addition processing on multiplication accumulation operation results of two sequences subjected to multiplication accumulation processing in time division and signal output terminal 1103 finally outputs the output signal shown in FIG. 26D.

FIR filter processing for sixty four taps is carried out by carrying out FIR filter processing of the polyphase type at the decimation ratio 1/4 in time division at arithmetic operator groups of two sequences in multimode FIR filter processing section 10.

Next, a case will be described with an operation example where resource assignment control is carried out when communication mode is selected and the required specification of filter processing is specified in multimode FIR filter processing section 10 that is able to carry out filter processings of a plurality of different types by changing the function as described above.

When communication mode in the multimode wireless communication apparatus is selected based on a predetermined condition for decision and a communication mode control signal supporting the selected communication mode is inputted, multimode operation controlling section 104 outputs the communication mode control signal to resource assignment controlling section 105, and resource assignment controlling section 105 reads information related to a predetermined filter specification required by the applicable communication standard, based on the communication mode control signal.

FIG. 27 shows list 2000 associating an example of a wireless communication standard that the multimode wireless communication apparatus supports, the required specification of filter processing required when communication processing supporting each standard is carried out and an example of the details of the setting of filter processing. Further, this example shows an example assuming that the maximum frequency of multiplication accumulation operation processing for the multimode FIR filter processing section is 80 MHz. For example, this example shows that, to support the UMTS (Universal Mobile Telecommunications System) standard, a filter for forty seven tap length is required, input signals and output signals are inputted and outputted at a rate of 15.36 MHz and the filter is formed as the serial type at the decimation ratio 1/1.

Further, this example shows that there are two examples of settings to carry out this filter processing. The first setting example uses resources for three arithmetic operator core groups and carries out multiplication accumulation operation for four taps per multiplication accumulation operator core at 61.44 MHz four times as much as the original input signal rate. The second setting example uses resources for six arithmetic operator core groups and carries out multiplication accumulation operation for two taps per arithmetic operator core at 30.27 MHz twice as much as the original input signal rate. In this way, to support one communication standard, a plurality of filter setting candidates are listed up by the amount of use of arithmetic operation resources or in the range to the upper limit of the processing frequency.

Figure 28:
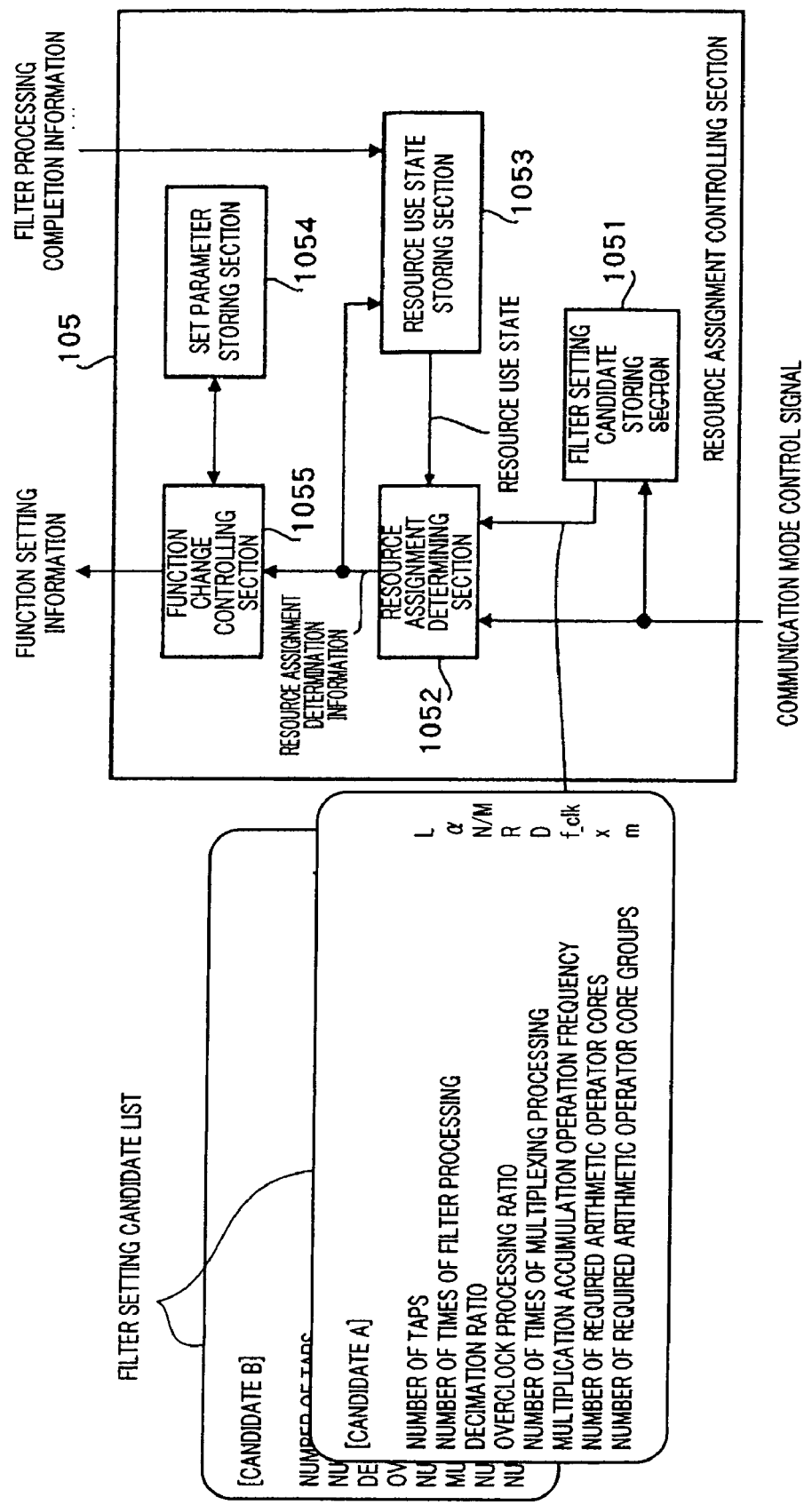
FIG. 28 shows a configuration of a resource assignment controlling section according to Embodiment 1.

FIG. 28 shows a configuration of resource assignment controlling section 105 and a flow of processing and control. Filter setting candidate storing section 1051 stores in advance information related to filter setting examples supporting communication standards, in list 2000 as shown in FIG. 27, reads a candidate list of setting examples of filter processing supporting communication standards based on a communication mode control signal requesting switching to the selected communication mode, and outputs the candidate list to resource assignment determining section 1052.

Resource use state storing section 1053 stores use states of arithmetic operator core groups in multimode FIR filter processing section 10. Resource use state storing section 1053 updates use states of resources in arithmetic operators in multimode FIR filter processing section 10 based on the resource assignment result determined in resource assignment determining section 1052 and provides this information to resource assignment determining section 1052. Further, resource use state storing section 1053 updates information showing that arithmetic operator resources are in use to information showing that resources are available, based on filter processing completion information supplied through function setting register 106 from filter processing controlling section 108.

Figure 29:
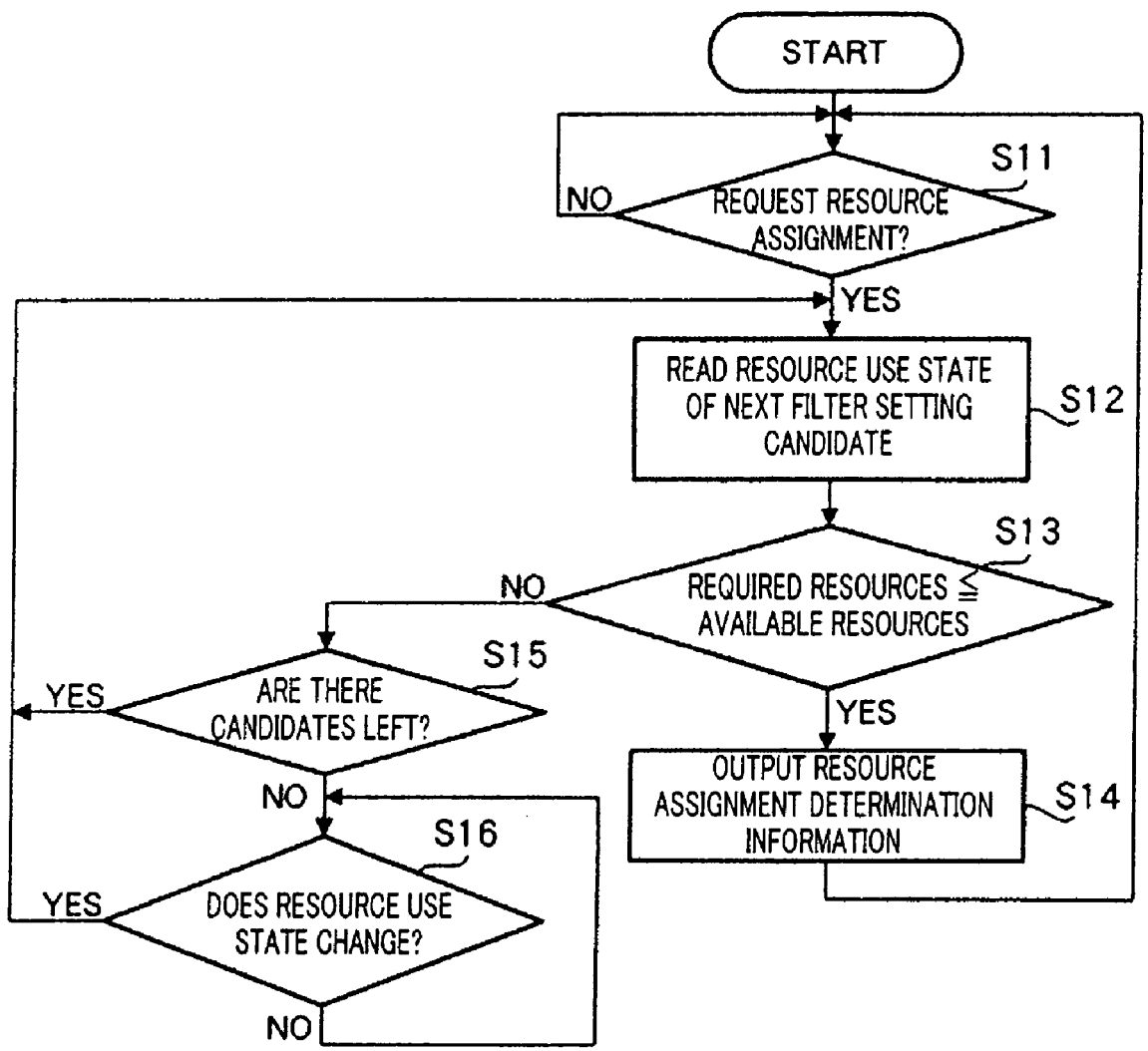
FIG. 29 is a flowchart showing a processing step of the resource assignment controlling section in FIG. 28 according to Embodiment 1.

FIG. 29 is a flowchart when a filter setting that enables resource assignment is selected from candidates in resource assignment determining section 1052 and this flow chart will be described.

First, when resource assignment request is detected upon detection of an input of the communication mode control signal (step S11: "Yes"), resource assignment determining section 1052 reads a filter setting candidate supporting the selected communication mode from filter setting candidate storing section 1051 (step S12). Here, if there are a plurality of filter setting candidates as in list 2000 of above FIG. 27 stored in filter setting candidate storing section 1051, setting candidates are read in order from a larger number of arithmetic operator core groups.

Next, resource assignment determining section 1052 compares the number of arithmetic operator core groups required by the read setting candidate, that is, the amount of required resources, with the number of arithmetic operator core groups not in use that is learned based on the resource use state supplied from resource use state storing section 1053, that is, the number of available resources (step S13). If the amount of required resources is equal to or less than the amount of available resources (step S13: "Yes"), the flow proceeds to step S14, and resource assignment determining section 1052 determines to select the above filter setting candidate and outputs determined information of resource assignment to function change controlling section 1055 and resource use state storing section 1053.

Further, if the amount of required resources is larger than available resources upon the above resource comparison (step S13: "No"), the flow proceeds to step S15, and resource assignment determining section 1052 decides whether or not there are filter setting candidates left in filter setting candidate storing section 1051, and, if there are candidates left (step S15: "Yes"), the flow proceeds to step S12.

If resource assignment determining section 1052 decides that there is no setting candidate left (step S15: "No"), the flow proceeds to step S16, and resource assignment determining section 1052 is in the stand-by condition until the resource use state supplied from resource use state storing section 1053 changes. If the resource use state changes (step S16: "Yes"), the flow proceeds to step S12.

Based on the resource assignment determined by resource assignment determining section 1052 as described above, function change controlling section 1055 outputs function control information for changing the function setting of each section in multimode FIR filter processing section 10. To be more specific, the value required to realize the filter setting selected by function change controlling section 1055 is written in each setting register in function setting register 106 forming function setting table 600 as shown in FIG. 8, and the details of the setting regarding the details of operation control in filter processing controlling section 108 is written in function setting register 106.

Here, as an example of resource assignment control, a case will be described with an operation example where FIR filter processing has already been carried out in communication mode supporting IEEE802.11a in multimode FIR filter processing section 10 and FIR filter processing is carried out in communication mode supporting the UMTS in addition to the above communication mode. FIR filter processing supporting IEEE802.11a requires four arithmetic operator core groups as shown in FIG. 27. Here, received signals supporting IEEE802.11a are inputted from signal input terminal 1102 of FIG. 3, are supplied to arithmetic operator core groups 1014 to 1017 through input interface section 102, are subjected to predetermined multiplication accumulation operation processing and are outputted to signal output terminal 1104 through output interface section 103.

Filter setting candidate storing section 1051 of resource assignment controlling section 105 stores two candidates shown in the row of the UMTS in list 2000 of FIG. 27, as setting candidates of filter processing supporting the UMTS standard. That is, there are a setting (hereinafter "candidate A") of processing each multiplication accumulation operator core at the operation clock of 30.72 MHz using six arithmetic operator core groups and a setting (hereinafter "candidate B") of processing each multiplication accumulation operation core at the operation clock of 61.44 MHz using three arithmetic operator core groups.

When receiving an input of the communication mode control signal requesting resource assignment (step S11: "Yes"), resource assignment determining section 1052 reads setting information of candidate A with a greater number of required arithmetic operator core groups as the first candidate of filter setting information, according to processing of reading operation mode candidates of step S12. Further, resource assignment determining section 1052 receives an input of information as the resource use state from resource use state storing section 1053, showing that four arithmetic operator core groups (1013 to 1017) are currently in use for filter processing supporting IEEE802.11a, that is, information showing that the number of available arithmetic operator core groups is four.

In this case, in the processing of comparing the amount of resources in step S13, the amount of required resources exceeds the amount of available resources (step S13: "No"), and so the flow proceeds to step S15, and there are the filter setting candidates left (candidate B) (step S15: "Yes"), and so the flow proceeds to step S12 again. In step S12, filter setting information of candidate B is read again from filter setting candidate storing section 1051 through resource assignment determining section 1052. In this case, the number of required arithmetic operator core groups is three (step S13) and the requirement that required resources are equal to or less than available resources, is satisfied (step S13: "Yes"), and so the flow proceeds to step S14 and the filter setting of candidate B is selected and outputted to function change controlling section 1055 as resource assignment determination information. Function change controlling section 1055 reads setting information from function setting table 2100 as shown in FIG. 30 stored in set parameter storing section 1054 based on the determined resource assignment determination information and writes this information in function setting register 106.

Next, a case will be described below with an operation example where, assuming that filtering processing is in use in the above example, the setting of this filter processing is carried out as filter processing supporting the IEEE.802.15.1 standard instead of filter processing supporting the above IEEE802.11a standard.

To be more specific, a case will be described with an operation example where filter processing is operated according to the filter setting using six arithmetic operator core groups shown in candidate B in list 2000 of FIG. 27.

In this case, six arithmetic operator core groups (1012 to 1017) have already been used for filter processing supporting the IEEE802.15.1 standard and the number of available arithmetic operator core groups do not reach the number of required arithmetic operator core groups even in cases of filter setting candidates supporting the UMTS standard, and so filter processing cannot be carried out by assigning resources for arithmetic core groups. In this case, the flow proceeds to step S16 shown in FIG. 29, resource use state storing section 1053 detects whether or not the resource use state changes, and, if the resource use state changes (step S16: "Yes"), the flow proceeds again to step S12, and resource assignment determining section 1052 decides the resource assignment.

According to the above configuration and operation, accompanying change in the communication mode of the multimode wireless communication apparatus, arithmetic operation resources for use and the details of the setting of arithmetic operation resources are determined based on setting candidates of the required filter characteristics and the availability of arithmetic operation resources, the function of each section is changed based on this determination and a predetermined operation is controlled. For this reason, the number of arithmetic operation taps of limited resources for multiplication and arithmetic operation, the operation clocks and the connection relationships are flexibly changed, so that it is possible to support a plurality of different FIR filter processings and carry out a plurality of filter processings in parallel at the same time. Consequently, it is possible to reduce the circuit scale more than a case where filters are formed separately for a plurality of different operation modes.

Further, according to the configuration of multimode FIR filter processing section 10 illustrated in Embodiment 1, the number of multiplication accumulation operation processings that can be carried out per multiplication accumulation operator core is eight at maximum, four multiplication accumulation operator cores are connected in serial per arithmetic operator core group, eight arithmetic operator core groups are provided, the number of signal input terminals are two and the number of branches in demultiplexers per signal input terminal is four. However, the present invention is not limited to these numbers in this configuration, and can change this design as a scalable configuration according to the required specification of filter processing capability required in the multimode wireless communication apparatus.

Further, although the configuration of each multiplication accumulation operator core 100 is provided with signal input terminal 1201 and signal output terminal 1203, the present invention is not limited to this configuration, and, if a common signal input is supplied to each multiplication accumulation operator core included in the same arithmetic operator core group in multimode FIR filter processing section 10, it naturally follows that a signal output of each multiplication accumulation operator core is not necessary.

Further, the filter specification required according to each wireless communication standard shown in FIG. 27 is only an example, the specification values may vary depending on system design in the wireless communication apparatus including other design specifications. In this case, a candidate list of specifications required for the multimode FIR filter processing section and setting examples supporting these specifications may be stored in advance in filter setting candidate storing section 1051 in multimode operation controlling section 104.

Further, the frequency for processing in each multiplication accumulation operator core is not limited to the frequency illustrated in FIG. 27, a configuration may be possible where processing is carried out using a higher frequency up to the maximum frequency of multiplication accumulation operation processing (Embodiment 1 assumes 80 MHz). In this case, inputting signals and carrying out an operation in the multiplication accumulation operator core are asynchronous processing, and so a configuration may be possible where a FIFO (First-In First-Out) buffer which is generally used and the like are provided at a preceding stage to the signal input terminal and a subsequent stage to the input signal terminal, and a timing and the amount of data are adjusted.

(Embodiment 2)

A case will be described with Embodiment 2 with a configuration and operation example where a plurality of integrators, differentiators and decimation processing sections, which are components of the CIC (Cascaded Integrator Comb) filter, are arranged, interfaces that switch the connection relationships between the input/output terminals of the components are provided, resources for each component are dynamically changed by switching the setting of the operation function of each component and the connection setting of input and output interfaces according to the required filter characteristics and a plurality of filter processings are operated at the same time.

Figure 31:
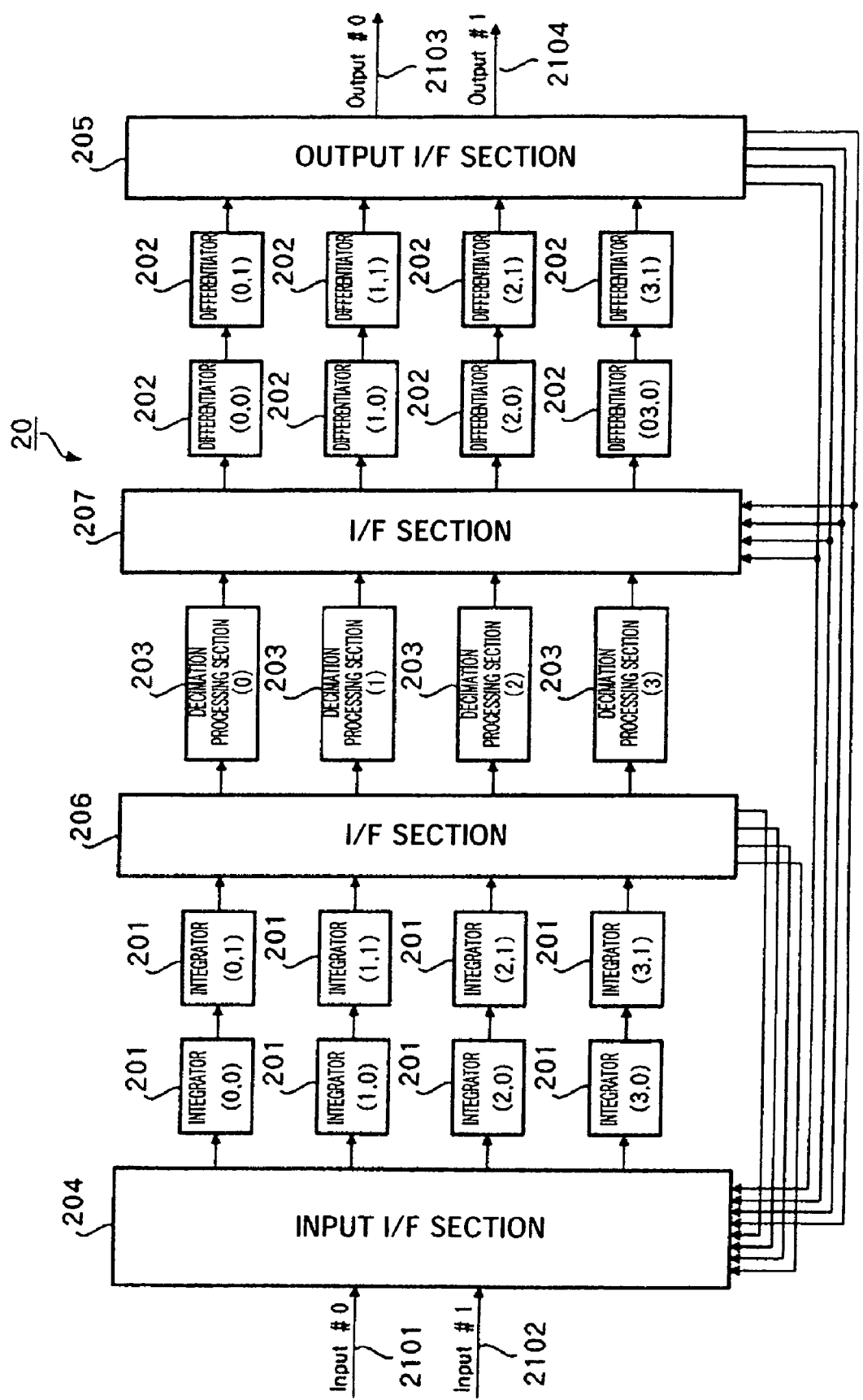
FIG. 31 shows a configuration of a multimode CIC filter processing section according to Embodiment 2 of the present invention.

FIG. 31 is a block diagram showing a configuration of multimode CIC filter processing section 20 used for description of Embodiment 2. Multimode CIC filter processing section 20 has signal input terminals 2101 and 2102 of two sequences to which signals of separate communication sequences are inputted. Further, multimode CIC filter processing section 20 has signal output terminals 2103 and 2104 of two sequences that each transmit output signals of signal input terminals 2101 and 2102 after filter processing. Further, multimode CIC filter processing section 20 has four sequences of integrator groups formed by connecting a plurality of integrators 201 in cascade, four sequences of differentiator groups formed by connecting a plurality of differentiators 202 in cascade and decimation processing sections 203 of four sequences. Four sequences of integrator groups and decimation processing sections 203 are connected through interface section 206, and differentiator groups and decimation processing sections 203 are connected through interface section 207. Further, signal input terminals 2101 and 2102 and four sequences of integrator groups are connected through input interface section 204, and signal output terminals 2103 and 2104 and four sequences of differentiator groups are connected through output interface section 205.

Figure 32:
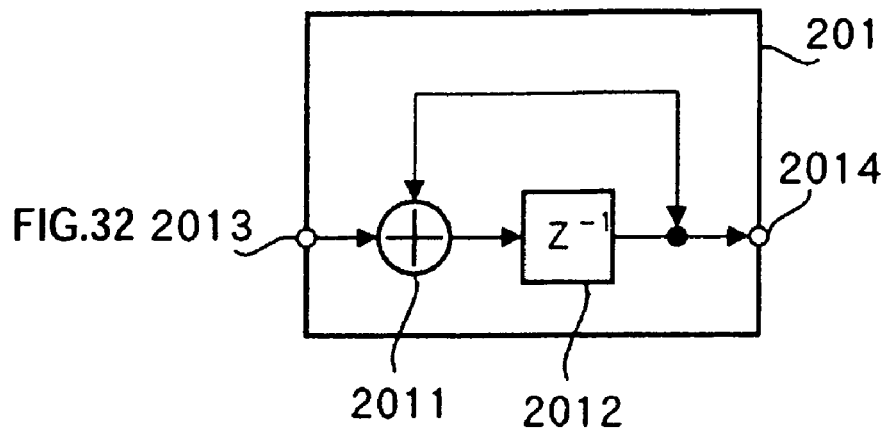
FIG. 32 shows a configuration of an integrator according to Embodiment 2.

Integrator 201 outputs a result obtained by carrying out accumulation addition on an input signal and carrying out integration processing on the result, and is formed, for example, as shown in FIG. 32. In FIG. 32, adder 2011 outputs an addition result of input signals of two sequences, and delay tap 2012 holds and delays an input signal for one cycle, and outputs this input signal. Adder 2011 receives outputs of input terminal 2013 and delay tap 2012 of integrator 201 as input and the output of delay tap 2012 is outputted from output terminal 2014 of integrator 201.

Figure 34:
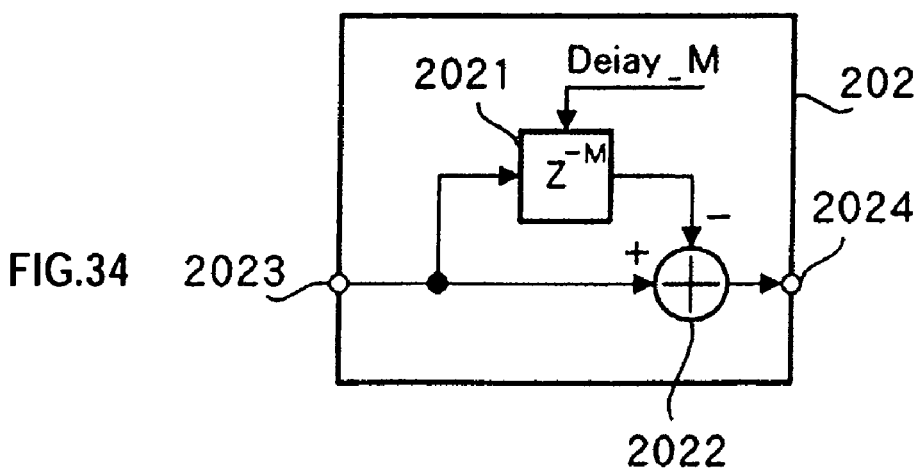
FIG. 34 shows a configuration of a differentiator according to Embodiment 2.

Differentiator 202 outputs a result obtained by subtracting a signal, which is obtained by delaying an input signal by a predetermined time, from the input signal, and, for example, is formed as shown in FIG. 34. In FIG. 34, delay tap 2021 holds and delays the input signal inputted to signal input terminal 2023 of differentiator 202 for a predetermined clock cycle and outputs the result, and subtractor 2022 subtracts the output signal of delay tap 2021 from the input signal and outputs the subtraction result as the output of differentiator 202 from output terminal 2024. The time length delayed in delay tap 2021 is supplied from function setting controlling section 107 (described later).

Decimation processing section 203 carries out decimation processing on input signals at a predetermined ratio and outputs only part of signals, and the predetermined decimation ratio is set based on a value supplied from function setting controlling section 107 (described later).

Further, in FIG. 31, the number, (i, j), is assigned according to positions of a plurality of arranged integrators 201 and differentiators 202, and the number corresponding to (i) is assigned according to positions of decimation processing sections. "i" represents arrangement in the i-th processing sequence and "j" in integrator 201 and differentiator 202 represents arrangement in the j-th cascade.

Input interface section 204 receives inputs from signal input terminals 2101 and 2102 of two sequences (Input #0 and Input #1) and feedback connection from interface section 206 and output interface section 205, and switches connection between integrator groups of four sequences according to the function change control signals inputted from function setting controlling section 107 (described later). A configuration example will be described in detail later using FIG. 35.

Output interface section 205 outputs signals outputted from differentiator groups of four sequences as feedback outputs, to input interface section 204, selects a predetermined output signal from the output signals of differentiator groups of four sequences according to the function change control signal supplied from function change controlling section 107 (described later) and outputs the predetermined signal from signal output terminals 2103 and 2104. A configuration example will be described in detail later using FIG. 36.

Interface section 206 outputs signals outputted from integrator groups of four sequences, to input interface section 204 as feedback outputs and outputs these output signals to decimation processing sections 203 of four sequences. A configuration example will be described in detail later using FIG. 37. Further, interface section 206 functions as the first interface section.

Interface section 207 receives signals outputted from decimation processing sections 203 of four sequences and feedback outputs of four sequences outputted from output interface section 205 as input, and selects signals to be connected with subsequent differentiator groups of four sequences according to the function setting control signal supplied from function setting controlling section 107 (described later) and connects the signals with the differentiator groups of four sequences. A configuration example will be described in detail later using FIG. 38. Further, interface section 207 functions as the second interface section.

Figure 35:
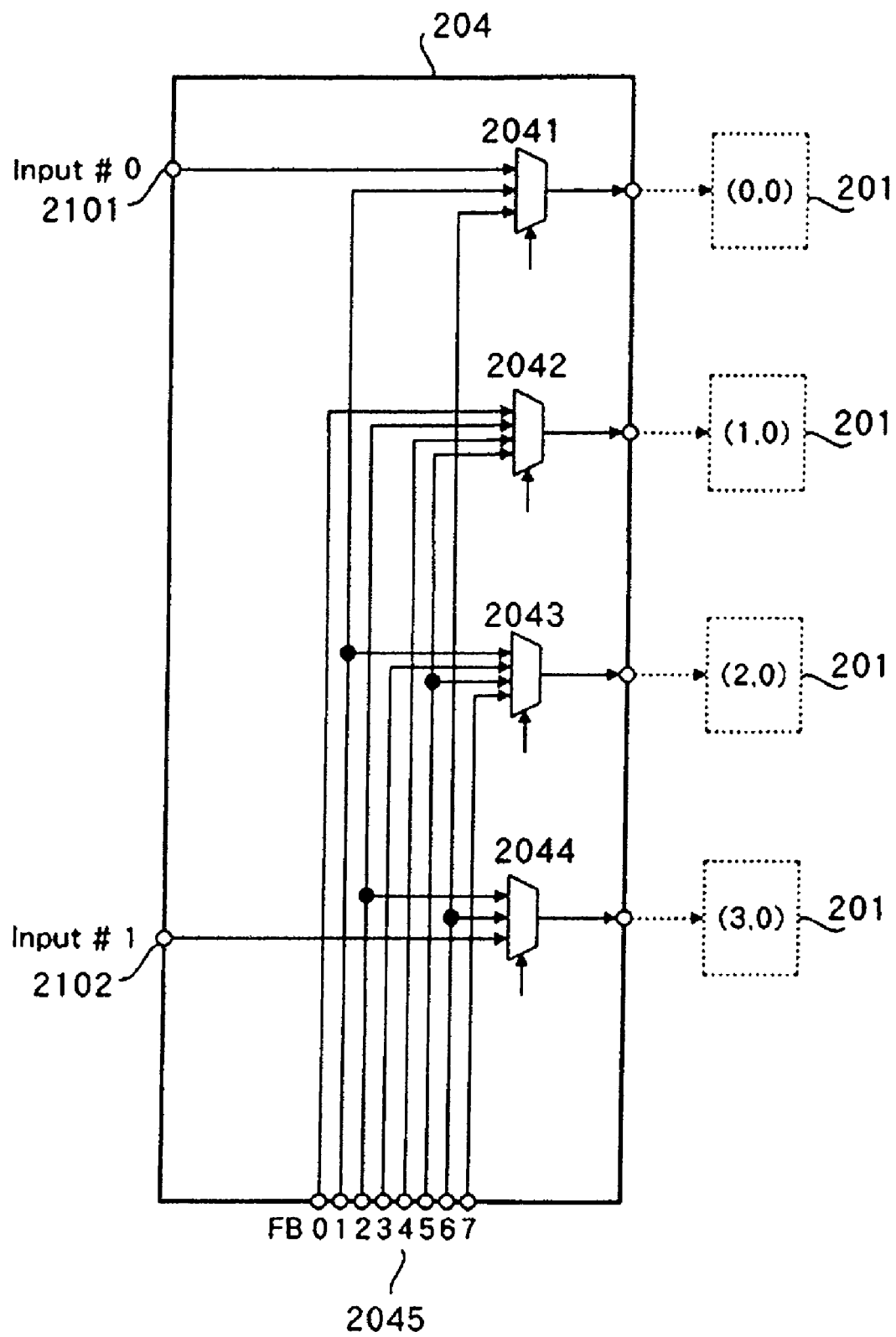
FIG. 35 shows a configuration of the input interface section according to Embodiment 2.

FIG. 35 shows a configuration example of input interface section 204. In FIG. 35, selector 2041 to 2044 each select one of a plurality of input signals according to function change control signals supplied separately from function setting controlling section 107, and output the input signal to an integrator group of each sequence. Selector 2041 makes signal input terminal 2101 as one of input terminals and selector 2044 makes signal input terminal 2102 as one of input terminals. Further, selectors 2041 to 2044 are connected with feedback input terminal 2045 such that outputs of integrators 201 of adjacent processing sequences and outputs of differentiators 202 are inputted.

Figure 36:
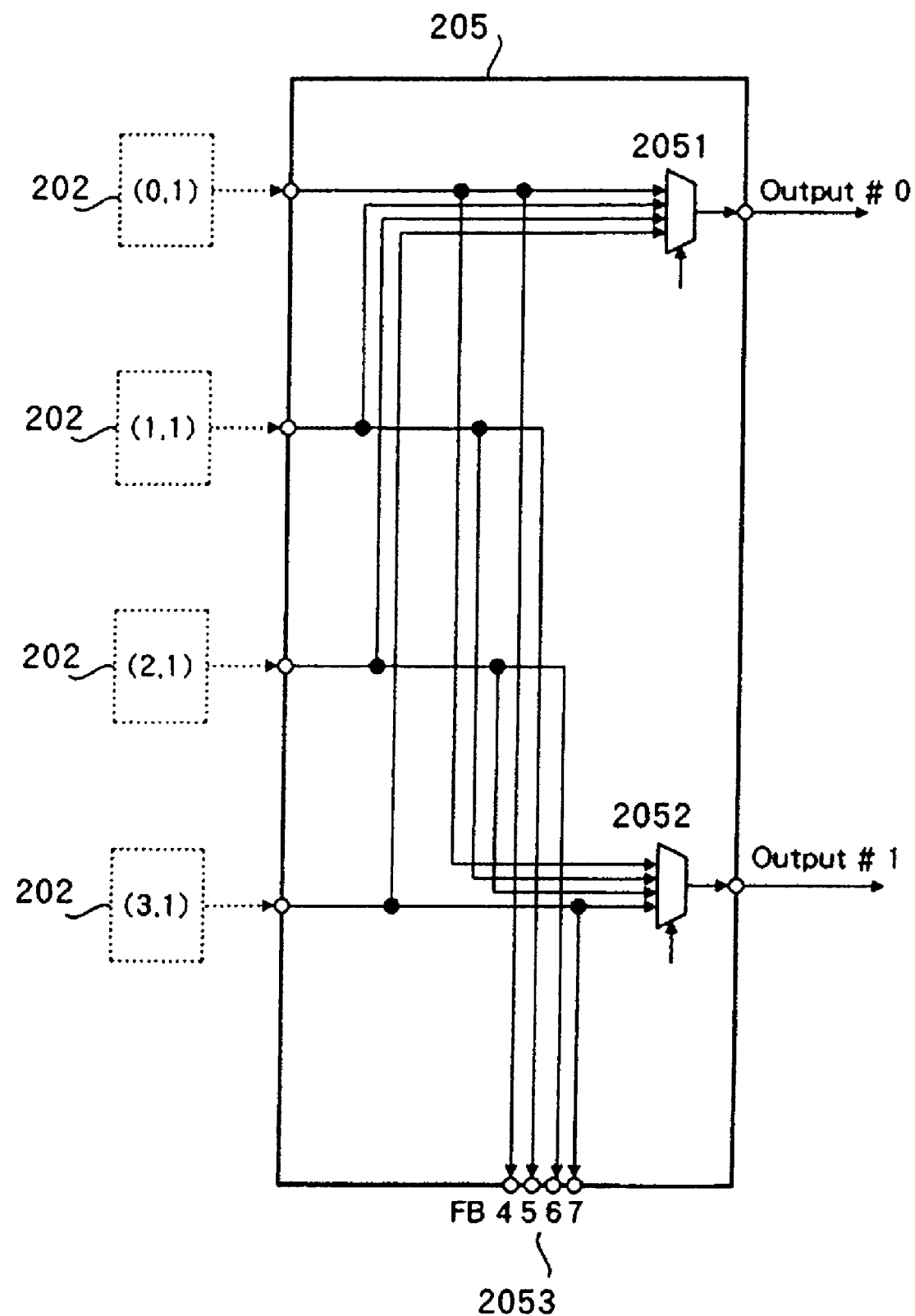
FIG. 36 shows a configuration of the output interface section according to Embodiment 2.

FIG. 36 is a configuration example of output interface section 205. In FIG. 36, selectors 2051 and 2052 each select one of input signals inputted from a plurality of differentiator groups according to function change control signals supplied separately from function setting controlling section 107 and each output the input signals to signal output terminals 2103 and 2104. Further, output interface section 205 has feedback output terminal 2053 and outputs the input signals from a plurality of differentiator groups, from feedback output terminal 2053 to input interface section 204 and interface section 207.

Figure 37:
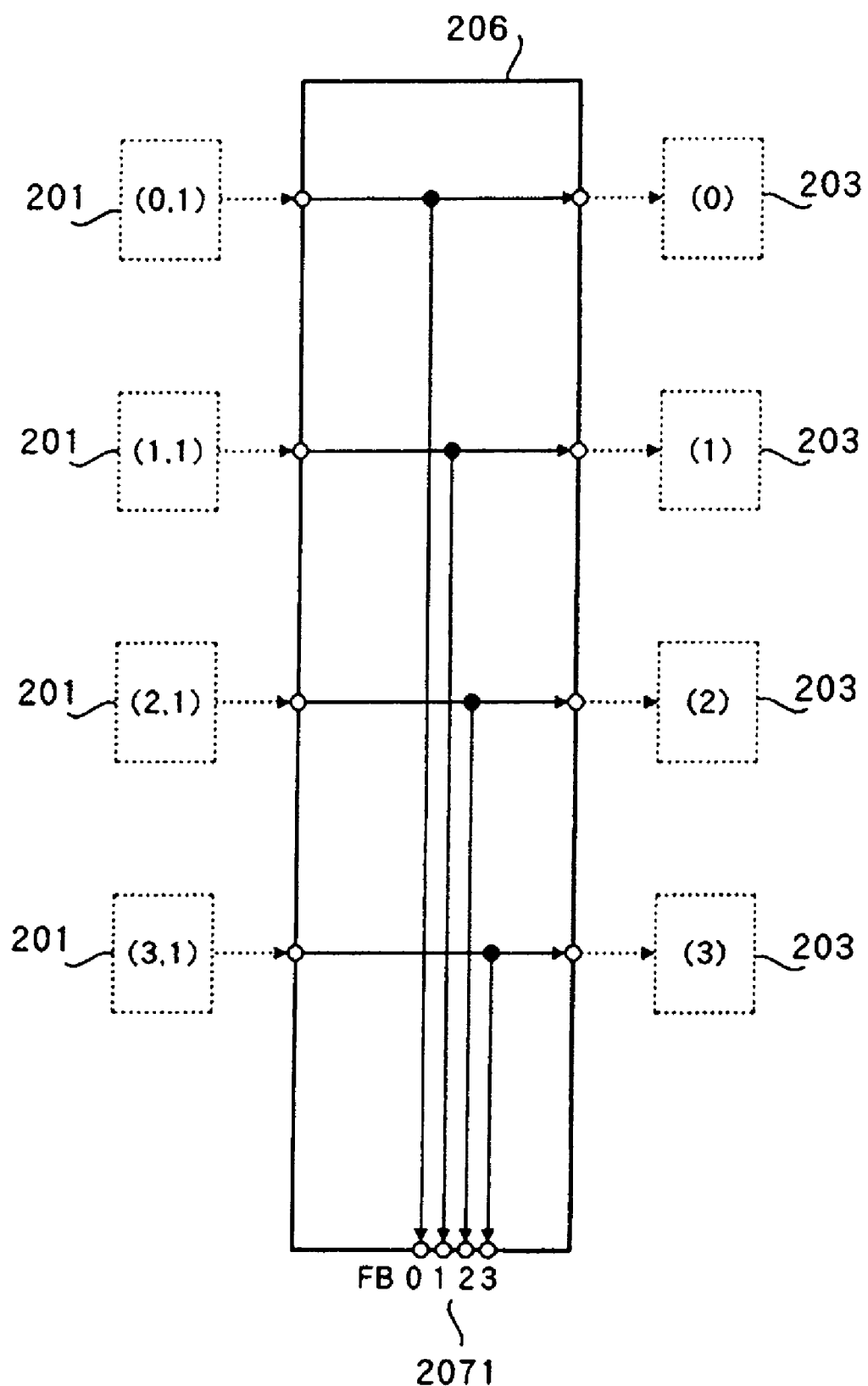
FIG. 37 shows a configuration of an interface section according to Embodiment 2.

FIG. 37 is a configuration example of interface section 206. In FIG. 37, the signals outputted from four sequences of integrator groups are each outputted to decimation processing sections 203 of respective sequences, are branched for feedback output terminal 2071 and are outputted to input interface section 204.

Figure 38:
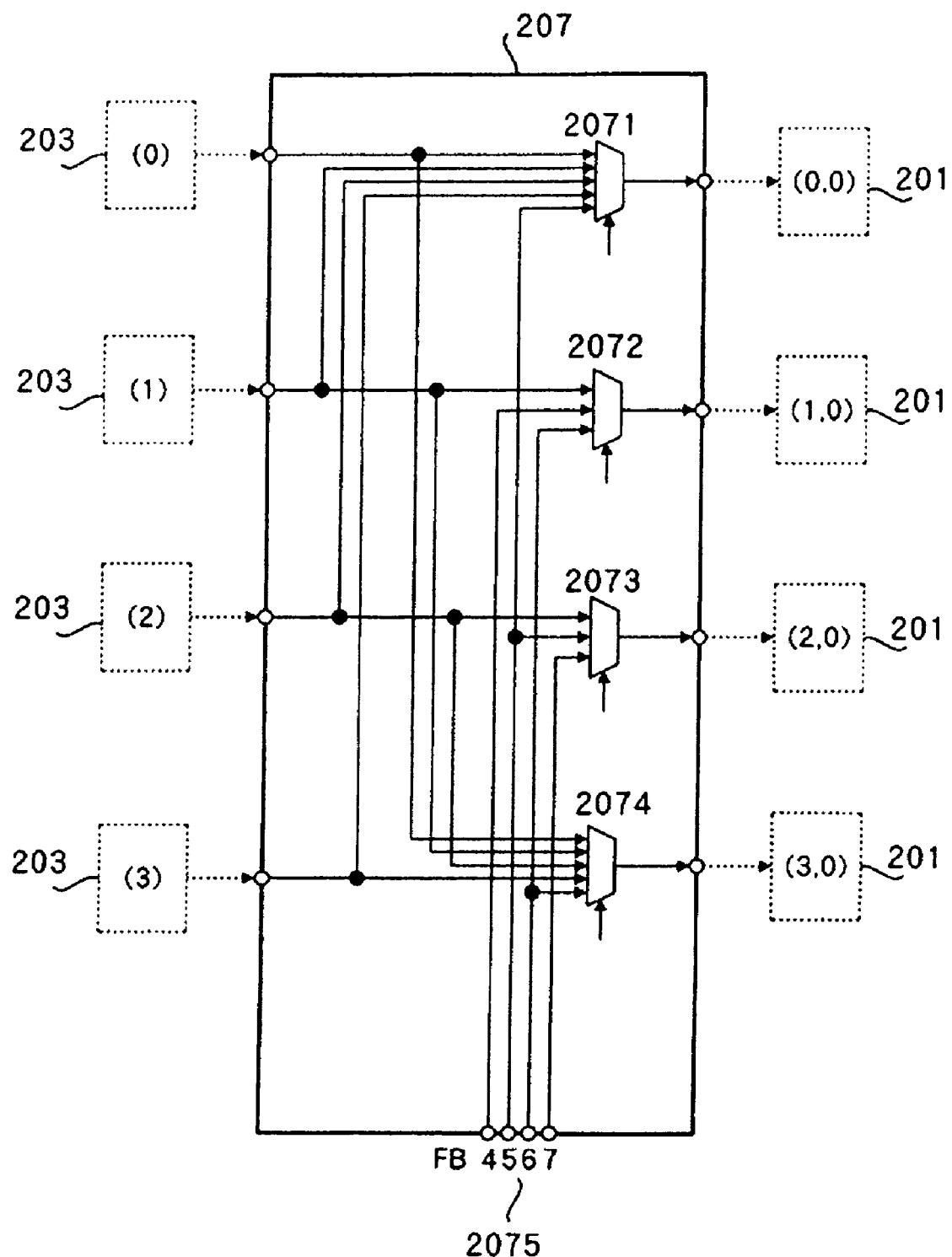
FIG. 38 shows a configuration of the interface section according to Embodiment 2.

FIG. 38 is a configuration example of interface section 207. In FIG. 38, selectors 2071 to 2074 each select one of input signals inputted from a plurality of decimation processing sections 203 according to function change control signals supplied separately from function setting controlling section 107 and each output the input signals to differentiator groups of respective sequences. Selectors 2071 and 2074 receive outputs of decimation processing sections 203 of four sequences as input and are connected with output terminals of differentiator groups of adjacent sequences through feedback input terminal 2075. Selectors 2072 and 2073 receive outputs of decimation processing sections 203 in respective rows in FIG. 38 as input and outputs of differentiators 202 of adjacent sequences through feedback input terminal 2075 as input.

Further, similar to the case of multimode FIR filter processing section 10 in above Embodiment 1, function setting and control of operation of each component are carried out by controlling section 11 shown in FIG. 4 with respect to multimode CIC filter processing section 20 shown in FIG. 31, but, in each component, function setting and operation control are changed to support multimode CIC filter processing section 20. For example, resource assignment controlling section 105 is set to determine request information related to required arithmetic operation resources for the CIC filter required to realize a desired filter specification based on a communication mode control signal and assignment of arithmetic operation resources based on the availability of arithmetic operation resources in multimode CIC filter processing section 20, and to output information of the determined resource assignment and function change accompanying the resource assignment.

Further, in a register which holds function change information of function setting register 106 and in which a register supporting each setting section in multimode CIC filter processing section 20 is provided, function change information outputted from resource assignment controlling section 105 is written in a predetermined register position, and is read and outputted to function setting controlling section 107 when necessary.

Further, function setting controlling section 107 is set to read function change information held in function setting register 106 when necessary and control a function change in integrators 201, differentiator 202, decimation processing sections 203, and interface sections 204, 205, 206 and 207 in multimode CIC filter processing section 20. Further, filter processing controlling section 108 is configured to control the filter processing operation in multimode CIC filter processing section 20.

FIG. 39 shows list 3000 of each configuration section and set value for writing and reading the function setting at function setting register 106 of controlling section 11 in Embodiment 2. For example, setting registers of selectors 2071 to 2074 in interface section 207 shown in FIG. 38 are provided, and inputs are selected in order from the top of FIG. 39 by selecting setting values in an ascending order from zero. Each differentiator group of separate four sequences has a configuration where the number of delay clocks are variable and the number of delay clocks are set at integer value Mx. Function setting controlling section 107 reads the setting value of each section written in function setting register 106 based on list 3000 illustrated in FIG. 39 and controls the function and operation.

An operation example of configuring CIC filters of a plurality of specifications in multimode CIC filter processing section 20 formed as described above will be described below. Here, assume a case where processing with the first CIC filter characteristics is carried out with respect to a signal inputted to signal input terminal 2101 using resources for arithmetic operator groups of three rows from the top in FIG. 31 and the signal is outputted to signal output terminal 2103, and, on the other hand, processing with the second CIC filter characteristics is carried out with respect to a signal inputted to signal input terminal 2102 using resources for one arithmetic operator group from the bottom row of FIG. 31 and the input signal is outputted to signal output terminal 2104.

Generally, it is known that a CIC filter is able to realize frequency response characteristics represented by equation 4 shown below, according to the number of columns N for connecting integrators and differentiators in cascade, the decimation ratio R in the decimation processing sections, and the number of delay clocks M in differentiators.

$$H(Z) = (1 - Z^{-RM})^N / (1 - Z^{-1})^N \quad \text{(Equation 4)}$$

By setting the setting of each section in multimode CIC filter processing section 20 as shown in list 3100 shown in FIG. 4, values of the first filter in equation 4 are N=6, R=8 and M=1 and the values of the second filter N=2, R=2 and M=2.

Figure 41:
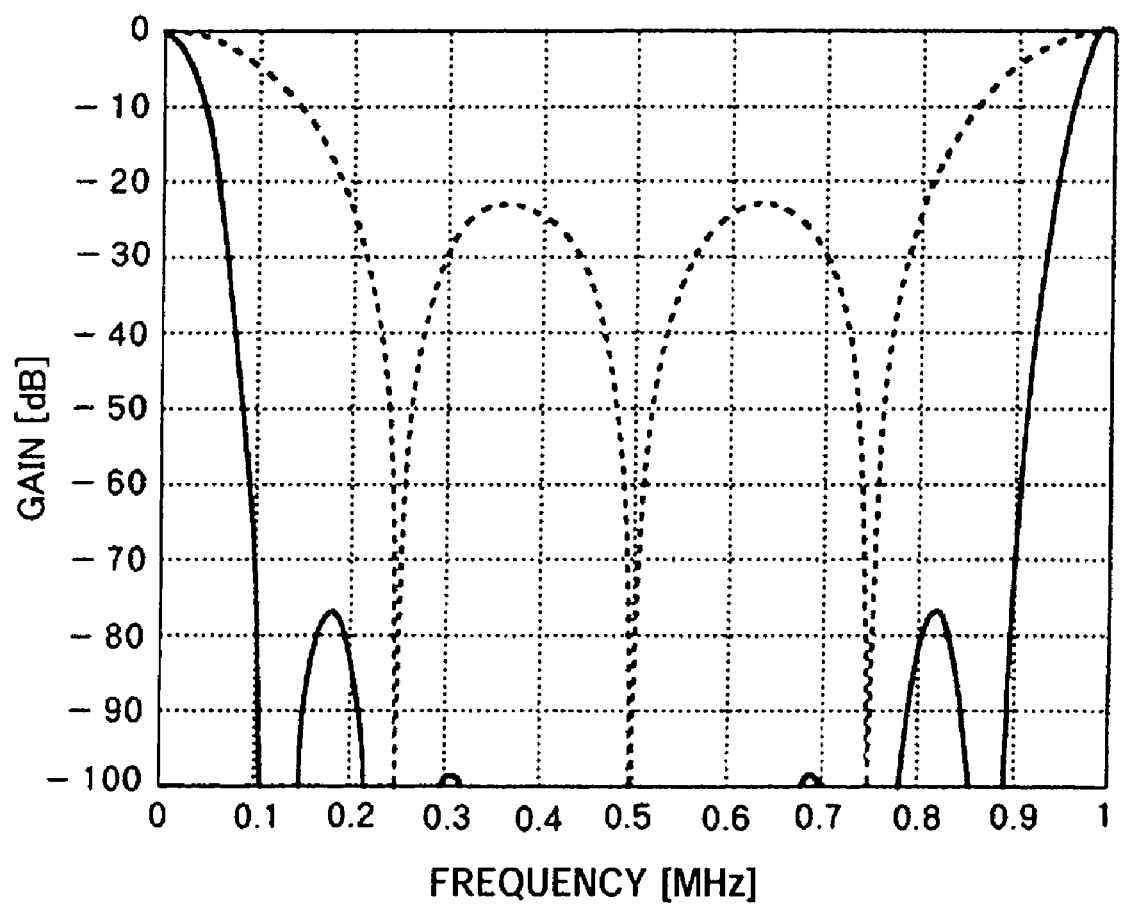
FIG. 41 shows an example of frequency response characteristics of a CIC filter formed with the multimode CIC filter processing section according to Embodiment 2.

FIG. 41 shows frequency response characteristic of the setting of each CIC filter. Here, FIG. 41 illustrates a case assuming both sampling frequencies are the same. It is confirmed that separate filter characteristics are realized using different resources.

Further, if communication mode is selected and the required specification of filter processing is specified in multimode CIC filter processing section 20 that is able to carryout filter processing with a plurality of different frequency response characteristics by changing the function as described above, the details of control for carrying out resource assignment control of integrator groups and differentiator groups can be applied for the multimode CIC filter processing section based on the details described using FIG. 27 to FIG. 29 of Embodiment 1.

According to the above configuration and operation, accompanying change in the communication mode in the multimode wireless communication apparatus, arithmetic operation resources for use and the details of the setting of arithmetic operation resources are determined based on setting candidates of the required filter characteristics and the availability of arithmetic operation resources, the function of each section is changed based on this determination and a predetermined operation is controlled, so that it is possible to support a plurality of different CIC filter processings by flexibly changing the number of arithmetic operation taps of limited resources for multiplication accumulation arithmetic operation, operation clocks and the connection relationships, carry out a plurality of CIC filter processings in parallel at the same time, and reduce the circuit scale more than a case where filters are separately formed for a plurality of different operation modes.

Further, the present invention is not limited to decimation CIC filter processing for down-converting the sampling rate by carrying out decimation, but it is clear for one of ordinary skill in the art that the present invention is applicable to interpolation processing CIC filter processing used in transmission signal processing and the like by, for example, shifting arrangement of integrators and differentiators and providing interpolation processing sections instead of decimation processing sections.

Further, similar to the case of the multimode FIR filter processing section in above Embodiment 1, the number of integrators, differentiators and sequences are not limited to the numbers described in Embodiment 2 and can be changed as a scalable configuration.

(Embodiment 3)

A case will be described with Embodiment 3 with a configuration and operation example where a multimode receiving filter processing section that is able to change the function and performance flexibly is formed by providing both the multimode FIR filter processing section described in above Embodiment 1 and the multimode CIC filter processing section described in above Embodiment 2.

Figure 42:
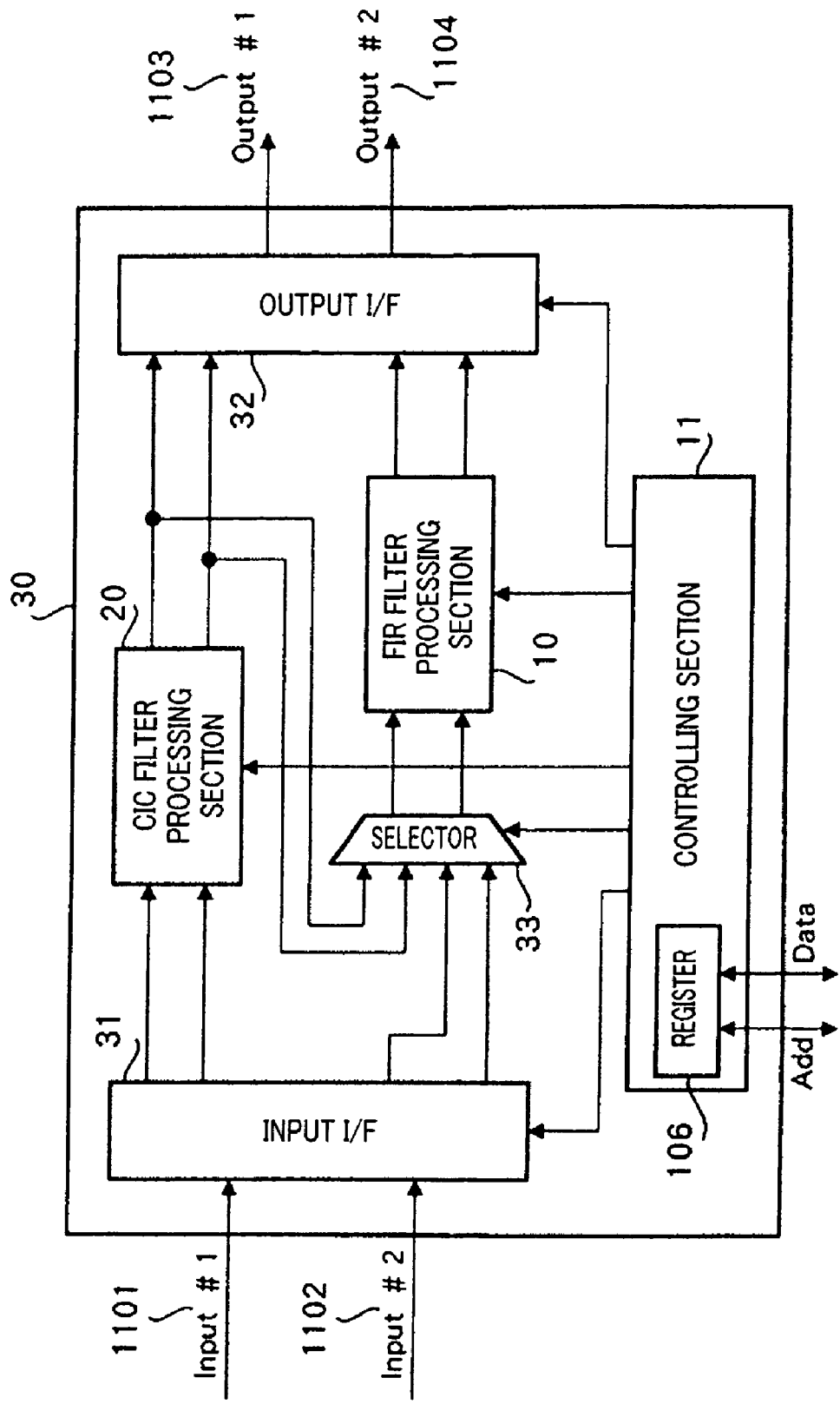
FIG. 42 shows a configuration of a multimode reception filter processing section according to Embodiment 3 of the present invention.

FIG. 42 shows a configuration of multimode receiving filter processing section 30 used to describe Embodiment 3. Similar to Embodiments 1 and 2, multimode receiving filter processing section 30 has signal input terminals 1101 and 1102 of two sequences that each receive signals of separate communication sequences and has signal output terminals 1103 and 1104 of two sequences that each transmit output signals of signal input terminals 1011 and 1012 after filter processing. Further, multimode receiving filter processing section 30 has multimode FIR filter processing section 10 described in Embodiment 1 and multimode CIC filter processing section 20 described in Embodiment 2. A plurality of signal input terminals, a plurality of signal output terminals, multimode FIR filter processing section 10 and multimode CIC filter processing section 20 are connected through input interface section 31, output interface section 32, and selector 33.

Input interface section 31 connects a plurality of signal input terminals 1101 and 1102 with multimode CIC filter processing section 20 or selector 33 according to the function change control signals inputted from function setting controlling section 107 in controlling section 11.

Output interface section 32 receives as input the output of multimode CIC filter processing section 20 and the output of multimode FIR filter processing section 10, and selects signal output terminals 1103 and 1004 based on the function change control signal inputted from function change controlling section 107 in controlling section 11.

Of outputs from multimode CIC filter processing section 20 and input interface section 31, selector 33 selects a signal to output to multimode FIR filter processing section 10 according to the function change control signals inputted from function setting controlling section 107 in controlling section 11.

Although controlling section 11 has the same basic configuration as described in FIG. 4 of above Embodiment 1, resource assignment controlling section 105 is set to determine request information related to arithmetic operation resources for the FIR filter and arithmetic operation resources for the CIC filter required to realize the desired filter specification based on the communication mode control signal, determine assignment of arithmetic operation resources based on the availability of arithmetic operation resources in multimode FIR filter processing section 10 and multimode CIC filter processing section 20, and output information of the determined resource assignment and function change accompanying the resource assignment.

Further, in a register which holds function change information in function setting register 106 and in which a register supporting each setting section in both multimode FIR filter processing section 10 and multimode CIC filter processing section 20 is provided, function change information outputted from resource assignment controlling section 105 is written in a predetermined register position, and is read and is outputted when necessary.

Further, function setting controlling section 107 is set to read function change information held in function setting register 106 when necessary, carry out control for changing the function of the tap coefficients, selectors for switching connection and the demultiplexers in each multiplication accumulation arithmetic operator core 100, input interface section 102 and output interface section 103 in multimode FIR filter processing section 10, and carry out control for changing the function in integrators 201, differentiators 202, decimation processing sections 203 and interface sections 204 to 207 in multimode CIC filter processing section 20.

Further, filter processing controlling section 108 controls filter processing operation in both multimode FIR filter processing section 10 and multimode CIC filter processing section 20.

According to the above configuration and operation, accompanying change in the communication mode of the multimode wireless communication apparatus, arithmetic operation resources for use and the details of the setting of arithmetic operation resources are determined based on setting candidates of the required filter characteristics and the availability of arithmetic operation resources, the function of each section is changed based on this determination, and predetermined operation control is carried out, so that it is possible to support a plurality of filter processings by flexibly changing the number of arithmetic operation taps of limited arithmetic operation resources, the operation clocks and the connection relationships, carry out a plurality of filter processings in parallel at the same time, and reduce the circuit scale more than a case where filters are formed separately for a plurality of different operation modes. Particularly, with Embodiment 3, one of FIR type and CIC type filter processings may be selected according to the required specification of each communication mode, and higher frequency response characteristics can be realized by connecting the FIR filter and the CIC filter in cascade.

Further, although cases have been described with Embodiments 1 to 3 assuming that input signals and output signals are scalar data, the present invention is not limited to these, and, if a configuration of providing each signal line and component in multimode FIR filter processing section 10 and multimode CIC filter processing section 20 per vector element is provided, it is possible to support vector data where inputs are orthogonal IQ signals. However, tap coefficient memory 1004 in multiplication accumulation operation core 100 in multimode FIR filter processing section 10 may be configured to be shared between I signals and Q signals may be possible.

Further, multimode FIR filter processing section 10 is able to carry out filter processing on each vector element in time division by inserting vector data every other vector data in time division multiplexing with respect to a signal input of a sequence and receiving the results as input. However, in this case, the number of samples that can be processed in each multiplication accumulation operator core 100 decreases in reverse proportion to the increase in the number of vector elements. For example, if time division multiplexing is carried out on two vector elements of I and Q, tap arithmetic operation that can be carried out per multiplication accumulation operator core 100 shown in FIG. 5 is four samples.

Figure 33:
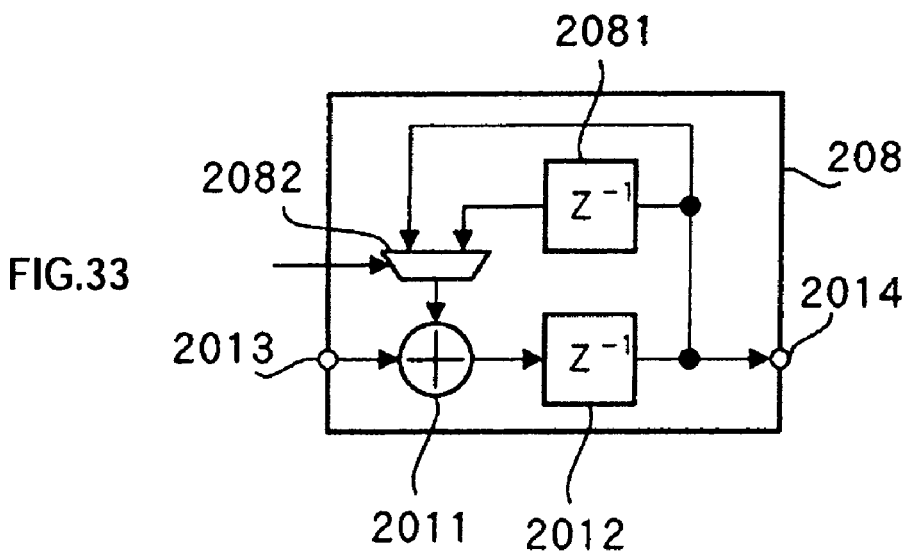
FIG. 33 shows another configuration of the integrator according to Embodiment 2.

Further, multimode CIC filter processing section 20 is able to insert vector data every other vector data in time division multiplexing, receive the result as input and carry out filter processing in time division by changing the configuration of integrator 201 to the configuration shown in FIG. 33. Here, the configuration of integrator 208 of FIG. 33 differs from the configuration of integrator 201 shown in FIG. 32 in providing delay tap 2031 in a sequence for feeding back an output of delay tap 2012 and providing selector 2082 for selecting one of outputs fedback through delay tap 2031 and without delay tap 2031.

Upon the above processing of vector data in time division, a configuration may be possible where inputting and outputting is carried out by carrying out time division multiplexing outside input/output terminals of multimode FIR filter processing section 10, multimode CIC filter processing section 20 and multimode receiving filter processing section 30, or time division multiplexing is carried out in input and output interface sections in each component by providing signal input/output terminals separately per vector element.

Further, although a case has been described with above Embodiment 3 where a receiving filter processing section is formed by combining a multimode FIR filter processing section and multimode CIC filter processing section, the present invention is not limited to receiving filter processing, but is applicable to, for example, transmission filter processing, and changes accompanying the application to the transmitting filter processing is obvious to one of ordinary skilled in the art.

The disclosure of Japanese Patent Application No. 2005-363847, filed on Dec. 16, 2005, including the specification, drawings and abstract is incorporated herein by reference in its entirety.

INDUSTRIAL APPLICABILITY

The digital filter according to the present invention provides an advantage of dynamically assigning arithmetic operation resources for multiplication accumulation operation and carrying out filter processing for a plurality of wireless communication standards in parallel at the same time, supports a plurality of different wireless communication standards in, for example, a multimode wireless communication apparatus and is applicable to a case where communication is carried out in parallel at the same time. Further, the present invention is not limited to the field of wireless communication and is applicable to cases where, in the field of wired communication, a communication apparatus supports a plurality of communication standards and carry out communication in parallel at the same time.

The invention claimed is:

1. A digital filter comprising:
a plurality of arithmetic operator groups that change a multiplication accumulation operation function according to a function change control signal, carry out multiplication accumulation operation processing for a plurality of taps according to the function change, and output accumulation operation results;
an output interface section that selectively adds the accumulation operation result outputs from the plurality of arithmetic operator groups according to the function change control signal, and outputs the accumulation operation result outputs as feedback outputs;
an input interface section that has a plurality of signal input terminals, supplies desired input signals to the plurality of arithmetic operator groups at the same time or sequentially, according to the function change control signal, and supplies predetermined outputs in the feedback outputs to accumulation operation input stages of the plurality of arithmetic operator groups, according to the function change control signal;
a resource assignment controlling section that, for arithmetic operation resources comprised of the plurality of arithmetic operator groups, determines allocation of arithmetic operation resources assigned to new filter processing, based on a current use state of arithmetic operation resources and a filter setting candidate list where arithmetic operation resources required by the new filter processing are set according to a matched filter setting candidate from the filter setting candidate list, and outputs resource assignment determination information;
a function setting controlling section that outputs the function change control signal for setting functions, to the plurality of arithmetic operator groups, the input interface section and the output interface section, based on the resource assignment determination information; and
a filter processing controlling section that outputs an operation control signal for carrying out desired filter processing, to the plurality of arithmetic operator groups where functions are set according to the function change control signal.

2. The digital filter according to claim 1, wherein the plurality of arithmetic operator groups are formed by connecting in serial a plurality of multiplication accumulation operators that are able to change a number of times of tap arithmetic operation processing and tap coefficients when processing the input signals inputted to the signal input terminals, according to the function change control signal.

3. The digital filter according to claim 2, wherein the multiplication accumulation operators comprise:
the signal input terminals:
accumulation operation input terminals;
accumulation operation output terminals;
a tap coefficient memory that stores a plurality of tap coefficients, and reads and outputs tap coefficients of predetermined addresses at predetermined timings according to the operation control signal;
a multiplier that multiplies the input signals from the signal input terminals by the tap coefficients outputted from the tap coefficient memory and outputs multiplication results;
a first selector that selects one of accumulation operation inputs and delay register outputs from the accumulation operation input terminals according to the operation control signal and outputs selection results;
an adder that adds outputs of the first selector and the multiplication results and outputs addition results;
a delay register group that sequentially delays the addition results according to clocks and outputs part of the delayed addition results;
a second selector that receives inputs of part of addition results of different delay times outputted from the delay register group, selects at least one of the delayed addition results of the different delay times according to the operation control signal and outputs this selection result as the delay register outputs; and
a latch circuit that holds the delay register outputs in synchronization with predetermined clock signals according to the operation control signal and outputs the delay register outputs as accumulation operation outputs.

4. The digital filter according to claim 1, wherein the input interface section comprises:
a demultiplexer that sequentially switches outputting of input signals inputted from the plurality of signal input terminals, to the plurality of arithmetic operator groups according to the function change control signal;
a first selector group that selects one sequence in the input signals and outputs of the demultiplexer according to the function change control signal, and supplies this selection result to signal input terminals of the arithmetic operator groups; and
a second selector group that, according to the function change control signal, selects either zero as a default value or the feedback outputs comprising accumulation operation outputs of adjacent arithmetic operator groups, and outputs this selection result to accumulation operation input terminals of the arithmetic operator groups.

5. The digital filter according to claim 1, wherein the resource assignment controlling section comprises:
a filter setting candidate storing section that stores a plurality of items of information related to filter setting candidates supporting filter specifications, and reads and outputs applicable information of filter setting candidates according to an input of a communication mode control signal;
a resource assignment determining section that determines a filter setting candidate that can be assigned in a range of arithmetic operation resources not in use, based on the communication mode control signal, the information of filter setting candidates and resource use state information, and outputs resource assignment determination information;
a resource use state storing section that stores the use state of the arithmetic operation resources based on the resource assignment determination information and filter processing completion information outputted from the filter processing controlling section, and outputs the use state as resource use state information;
a set parameter storing section that stores a plurality of parameters that are set according to types of filters: and
a function change controlling section that reads an applicable parameter from the set parameter storing section based on the resource assignment determination information, generates a function change control signal for sections in the plurality of arithmetic operator groups, the input interface section and the output interface section, based on the parameter, and outputs the function change control signal to the sections.

6. A digital filter comprising:

a plurality of integrator groups connecting a plurality of integrators in cascade;

a plurality of decimation processing sections;

a plurality of differentiator groups connecting a plurality of differentiators in cascade;

a first interface section that supplies outputs of the plurality of integrator groups to the plurality of decimating processing sections, and transmits the outputs of the plurality of integrator groups as the first feedback outputs;

a second interface section that switches outputs from the plurality of decimation processing sections and second feedback outputs according to a function change control signal and supplies these switching results to the plurality of differentiators;

an input interface section that has a plurality of signal input terminals, switches input signals according to the function change control signal and supplies these switching results to the plurality of integrator groups;

an output interface section that has a plurality of signal output terminals and switches connection relationships between the plurality of differentiators and the plurality of signal output terminals according to the function change control signal;

a resource assignment controlling section that, for arithmetic operation resources comprised of the plurality of integrators, the plurality of decimation processing sections and the plurality of differentiators, determines allocation of arithmetic operation resources assigned to new filter processing based on a current use state of arithmetic operation resources and a filter setting candidate list where arithmetic resources required for the new filter processing are set according to a matched filter setting candidate from the filter setting candidate list, and outputs resource assignment determination information;

a function setting controlling section that outputs the function change control signal for setting functions, to the plurality of integrator groups, the plurality of decimation processing sections, the plurality of differentiator groups, the second interface section, the input interface section and the output interface section, based on the resource assignment determination information; and a filter processing controlling section that outputs an operation control signal for carrying out desired filter processing, to the plurality of integrator groups, the plurality of decimation processing sections, the plurality of differentiator groups, the second interface section, the input interface section and the output interface section, where functions are set according to the function change control signal.

7. A digital filter comprising:

arithmetic operation resources comprised of a plurality of arithmetic operator groups that output accumulation operation results based on multiplication accumulation operation processing for one or more taps;

an output interface section that selectively adds accumulation operation results of the arithmetic operator groups of the arithmetic operation resources according to a function change control signal for setting functions;

an input interface section that has a plurality of signal input terminals and supplies desired input signals to the plurality of arithmetic operator groups at the same time or sequentially, according to the function change control signal;

a resource assignment controlling section that outputs resource assignment determination information for determining allocation of arithmetic operation resources assigned to new filter processing, based on a use state of arithmetic operation resources and a filter setting candidate list where arithmetic operation resources required for the new filter processing are set according to a matched filter setting candidate from the filter setting candidate list;

a function setting controlling section that outputs the function change control signal to the input interface section and the output interface section, based on the resource assignment determination information; and a filter processing controlling section that outputs an operation control signal for carrying out desired filter processing, to the arithmetic operation resources, the input interface section and the output interface section, where functions are set according to the function change control signal.

8. The digital filter according to claim 7, wherein:

the output interface section selectively adds the accumulation operation results and outputs the accumulation operation results as feedback outputs; and the input interface section supplies the desired input signals to the plurality of arithmetic operator groups and supplies predetermined outputs of the feedback outputs, to accumulation operation input stages of the plurality of arithmetic operator groups.

9. The digital filter according to claim 7, wherein:

the function setting controlling section outputs the function change control signal to the input interface section and the output interface section, and to the plurality of arithmetic operator groups; and the plurality of arithmetic operator groups change the multiplication accumulation operation processing according to the function change control signal.

10. A digital filter comprising:

arithmetic operation resources comprised of a plurality of integrator groups connecting a plurality of integrators in cascade, a plurality of decimation processing sections, and a plurality of differentiator groups connecting a plurality of differentiators in cascade;

a first interface section that supplies outputs of the plurality of integrator groups to the plurality of decimation processing sections;

a second interface section that supplies outputs from the plurality of decimation processing sections which are switched according to a function change control signal for setting functions, to the plurality of differentiators;

an input interface section that has a plurality of signal input terminals and supplies input signals switched according to the function change control signal, to the plurality of integrator groups;

an output interface section that selects at least one of output signals of the plurality of differentiator groups according to the function change control signal and outputs the selection result;

a resource assignment controlling section that outputs resource assignment determination information for determining arithmetic operation resources assigned for new filter processing based on a use state of the arithmetic operation resources and a filter setting candidate list where arithmetic operation resources required for new filter processing are set;

a function setting controlling section that outputs the function change control signal to the plurality of integrator groups, the plurality of decimation processing sections, the plurality of differentiator groups, the input interface section and the output interface section, based on the resource assignment determination information; and a filter processing controlling section that outputs an operation control signal for carrying out desired filter processing, to the plurality of integrator groups, the plurality of decimation processing sections, the plurality of differentiator groups, the input interface section and the output interface section where functions are set, according to the function change control signal.

11. The digital filter according to claim 10, wherein:

the first interface section supplies outputs of the plurality of integrator groups to the plurality of decimation processing sections and transmits the outputs to an input interface section as first feedback outputs;

the input interface section supplies input signals switched according to the function change control signal and predetermined outputs in the first feedback outputs, to the plurality of integrator groups;

the output interface section transmits outputs of the plurality of differentiators to the second interface section as second feedback outputs;

the function setting controlling section outputs the function change control signal to the plurality of integrator groups, the plurality of decimation processing sections, the plurality of differentiators, the input interface section and the output interface section, and to the second interface section;

the filter processing controlling section outputs the operation control signal to the plurality of integrator groups, the plurality of decimation processing sections, the plurality of differentiators, the input interface section and the output interface section, and to the second interface section; and the second interface section switches outputs from the plurality of decimation processing sections using the second feedback outputs according to the function change control signal and supplies the outputs to the plurality of differentiators.

* * * * *